US008987796B2

(12) United States Patent
Mikasa et al.

(10) Patent No.: US 8,987,796 B2
(45) Date of Patent: Mar. 24, 2015

(54) SEMICONDUCTOR DEVICE HAVING SEMICONDUCTOR PILLAR

(71) Applicant: Elpida Memory, Inc., Tokyo (JP)

(72) Inventors: Noriaki Mikasa, Tokyo (JP); Yoshihiro Takaishi, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/963,502

(22) Filed: Aug. 9, 2013

(65) Prior Publication Data
US 2014/0048860 A1 Feb. 20, 2014

(30) Foreign Application Priority Data

Aug. 17, 2012 (JP) .................................. 2012-181077
Aug. 23, 2012 (JP) .................................. 2012-183786

(51) Int. Cl.
*H01L 27/108* (2006.01)
(52) U.S. Cl.
CPC .................................... *H01L 27/108* (2013.01)
USPC .......................................... 257/296; 257/308
(58) Field of Classification Search
CPC ............ H01L 27/108; H01L 27/10805; H01L 27/10808; H01L 27/10814; H01L 27/10823
USPC ............................ 257/296–313; 438/239–256
See application file for complete search history.

(56) References Cited

U.S. PATENT DOCUMENTS

| 7,842,999 B2 | 11/2010 | Takaishi |
| 2006/0273388 A1 | 12/2006 | Yamazaki |
| 2007/0072375 A1 | 3/2007 | Yamazaki |
| 2008/0258209 A1 | 10/2008 | Oyu |
| 2008/0283816 A1* | 11/2008 | Takaishi ............................ 257/4 |
| 2009/0072291 A1* | 3/2009 | Takaishi ........................ 257/306 |
| 2009/0085098 A1 | 4/2009 | Oyu |
| 2012/0056255 A1* | 3/2012 | Sukekawa ...................... 257/296 |
| 2012/0248520 A1* | 10/2012 | Uchiyama ...................... 257/296 |

FOREIGN PATENT DOCUMENTS

| JP | 2006-339476 | 12/2006 |
| JP | 2007-081095 | 3/2007 |
| JP | 2008-140996 | 6/2008 |
| JP | 2008-311641 | 12/2008 |

(Continued)

OTHER PUBLICATIONS

International Search Report PCT/JP2013/004882 dated Oct. 1, 2013, with English translation.

*Primary Examiner* — Daniel Shook

(74) *Attorney, Agent, or Firm* — Young & Thompson

(57) ABSTRACT

Disclosed herein is a device that includes: first to fourth conductive lines embedded in a semiconductor substrate; a first semiconductor pillar located between the first and second conductive lines; a second semiconductor pillar located between the second and third conductive lines; a third semiconductor pillar located between the third and fourth conductive lines; a first storage element connected to an upper portion of the first semiconductor pillar; a second storage element connected to an upper portion of the third semiconductor pillar; and a bit line embedded in the semiconductor substrate connected to lower portions of the first to third semiconductor pillars. At least one of the first and second conductive lines and at least one of the third and fourth conductive lines being supplied with a potential so as to form channels in the first and third semiconductor pillars.

19 Claims, 84 Drawing Sheets

(56) References Cited

FOREIGN PATENT DOCUMENTS

| | | |
|---|---|---|
| JP | 2009-071247 | 4/2009 |
| JP | 2009-081377 | 4/2009 |
| JP | 2012-074684 | 4/2012 |
| JP | 2012-221965 | 11/2012 |

* cited by examiner

SEMICONDUCTOR DEVICE HAVING SEMICONDUCTOR PILLAR

BACKGROUND OF THE INVENTION

1. Field of the Invention

The present invention relates to a semiconductor device and a manufacturing method thereof, and particularly to a semiconductor device that uses a vertical transistor, and a manufacturing method thereof.

2. Description of Related Art

As for a semiconductor device such as DRAM (Dynamic Random Access Memory), in recent years, as substitutes for conventional planar transistors, research on vertical transistors in which channels are arranged in a vertical direction (or a direction perpendicular to a surface of a semiconductor substrate) has been underway. In the planar transistors, channels are arranged in a lateral direction (horizontal direction). Therefore, the planar transistors have a problem that gate length becomes shorter as the semiconductor devices are miniaturized, and characteristics would deteriorate due to short channel effects. The vertical transistors are intended to solve the problem. That is, since the channels are arranged in the vertical direction, the gate length does not become shorter even as the semiconductor devices are miniaturized. Therefore, compared with the planar transistors, the vertical transistors can obtain excellent characteristics.

In Japanese Patent Application Laid-Opens No. 2008-140996 and No. 2009-081377, a specific example of a semiconductor device having a vertical transistor is disclosed. As disclosed in the Laid-Opens, a vertical transistor includes a semiconductor pillar, which protrudes from a surface of a semiconductor substrate in a vertical direction; a gate insulation film covering a side surface of the semiconductor pillar; a gate electrode covering a surface of the gate insulation film; and an upper diffusion layer provided on an upper surface of the semiconductor pillar; and a lower diffusion layer provided around a bottom surface of the semiconductor pillar.

Also, in recent years, the semiconductor devices such as DRAM have been miniaturized. In case the gate length of transistors used for DRAM is made shorter, short channel effects of the transistors become apparent and a problem that a threshold voltage would drop emerges. And, gathering the impurity concentration of a semiconductor substrate to curb such a decline in the threshold voltage of the transistors causes an increase of junction leakage current. Therefore, miniaturizing of memory cells of the DRAM causes a serious problem that refresh characteristics would deteriorate.

As a structure to avoid such a problem, Japanese Patent Application Laid-Opens No. 2006-339476 and No. 2007-081095 disclose a trench-gate transistor in which a gate electrode is embedded in a trench formed on a surface of a semiconductor substrate. The use of the trench-gate transistor enables to ensure that the gate length of transistors used for DRAM is physically and sufficiently long. Moreover, it enables to realize a DRAM having microscopic memory cells whose minimum feature size is 60 nm or less.

However, as the memory cells of DRAM are further miniaturized, a disturb failure of a trench-gate transistor formed in a memory cell becomes apparent. The explanation of the disturb failure of a transistor in the DRAM (semiconductor device) is given below with reference to FIGS. 99 and 100.

On a surface of a semiconductor substrate 310, a plurality of active regions 330 which are arranged in a regular manner are provided as shown in FIGS. 99 and 100. Each active region 330 is surrounded by an element isolation region 320 which is formed by embedding an insulation film into a trench formed on a surface of the semiconductor substrate 310. In a Y direction (an up-down direction in FIG. 99) that crosses the active regions 330, a plurality of word lines WL1 and WL2 are disposed so as to extend in the Y direction.

As shown in FIG. 99, the word lines WL1 and WL2 are made from a conductive film that is embedded, via a gate insulation film 343, in a trench that is provided on the surface of the semiconductor substrate 310 and across the plurality of active regions 330 and the element isolation region 320. On upper surfaces of the word lines WL1 and WL2, cap insulation films 381 are so formed as to be embedded in trenches. On one active region 330, two word lines WL1 and WL2 cross.

The word lines WL1 and WL2 correspond to transistors Tr1 and Tr2, respectively, and form gate electrodes of the corresponding transistors. The transistors Tr1 and Tr2 are composed of drain diffusion layers 344 and a source diffusion layer 345, in addition to the word lines WL1 and WL2 that function as the gate electrodes. The source diffusion layer 345 is common to the transistors Tr1 and Tr2, and is connected to a bit line 347 through a bit line contact plug 357.

On the other hand, the drain diffusion layers 344 are provided for each of the transistors Tr1 and Tr2. The drain diffusion layer 344 corresponding to the transistor Tr1 is connected to lower electrodes SN1 (a storage node) via one of capacitance contact plugs 346 which are formed in an interlayer insulation film 382. The drain diffusion layer 344 corresponding to the transistor Tr2 is connected to lower electrodes SN2 (a storage node) via another one of capacitance contact plugs 346. Each of the lower electrodes SN1 and SN2 constitutes a capacitance element 390 together with a capacitance insulation film and an upper electrode (not shown). The channel of each of the transistors Tr1 and Tr2 is made in surfaces of the semiconductor substrate 310 corresponding to bottom surfaces and two side surfaces that face each other in the trenches in which the corresponding one of the word lines WL1 and WL2 are embedded.

When the above vertical transistors are also used as cell transistors of the DRAM, a large number of vertical transistors would be densely disposed in a narrow range. The conventional vertical transistors have a structural problem that adjacent gate electrodes become easily short-circuited if the vertical transistors are densely disposed as described above. The problem will be detailed below.

First, a method of manufacturing a vertical transistor that is used as a cell transistor of DRAM will be briefly described with a focus on portions related to the above problem. According to the manufacturing method, first, matrix-pattern semiconductor pillars are formed on a surface of a semiconductor substrate. At this time, a distance between the semiconductor pillars adjacent to each other in a direction of a bit line is made longer than a distance between the semiconductor pillars adjacent to each other in a direction of a word line.

Then, by thermal oxidation, a gate insulation film is formed on a surface of each of the semiconductor pillars. Then, a film of a gate electrode material is formed on the entire surface. The film-forming amount at this time is so adjusted that a film thickness of a gate electrode material formed on a side surface of each of the semiconductor pillars (or a horizontal-direction film thickness) is greater than or equal to one-half of the distance between the semiconductor pillars adjacent to each other in the word-line direction, and is less than one-half of the distance between the semiconductor pillars adjacent to each other in the bit-line direction. Accordingly, two portions of the gate electrode material which are formed on the side surfaces of two of the semiconductor pillars adjacent each other in the word-line direction, respectively, are united, whereas two portions of the gate electrode material which are formed on the side surfaces of two of the semiconductor pillars adjacent each other in the bit-line direction, respectively, are not united. The latter two portions of the gate electrode material are joined by a thin gate electrode material that is formed on a horizontal surface.

In that state, anisotropic dry etching is performed on the gate electrode material. As a result of the etching, only portions of the gate electrode material that are formed on the horizontal surface are removed, and portions of the gate electrode material that are formed on the side surfaces of the semiconductor pillars remain unetched. Therefore, one portion of the gate electrode material formed on the side surface of one of the semiconductor pillars and another one portion of the gate electrode material formed on the side surface of another one of the semiconductor pillars which is adjacent to the one of the semiconductor pillars in the bit-line direction are separated by the etching. Meanwhile, one portion of the gate electrode material formed on the side surface of one of the semiconductor pillars and another one portion of the gate electrode material formed on the side surface of another one of the semiconductor pillars which is adjacent to the one of the semiconductor pillars in the word-line direction are not separated by the etching because they are united. In this manner, a plurality of gate electrodes (word lines) that extend in the word-line direction and are arranged at regular intervals in the bit-line direction are formed. Focusing on one of the semiconductor pillars, gate electrodes are formed on both side surfaces of the bit-line direction. Therefore, the configuration of such gate electrodes are generally referred to as a double gate structure.

In that manner, the gate electrodes of the vertical transistors that are used as cell transistors of DRAM have a double gate structure. And anisotropic dry etching is used in order to separate the portions of the gate electrode material that are formed on side surfaces of two of the semiconductor pillars adjacent to each other in the bit-line direction. If the distance between the semiconductor pillars adjacent to each other in the bit-line direction is sufficiently large, the portions of the gate electrode material are separated without any problem by such a method. However, as the semiconductor devices are further miniaturized, the distance between surfaces of the portions of the gate electrode material that are formed on side surfaces of two of the semiconductor pillars adjacent to each other in the bit-line direction become very short. As a result, even a few errors can cause the portions of the gate electrode material which are formed on the side surfaces of the semiconductor pillars adjacent to each other in the bit-line direction to become united. In this case, the separation cannot be achieved by anisotropic dry etching, and the gate electrodes are short-circuited.

Also, as for the semiconductor device having the configuration as shown in FIGS. 99 and 100, the following problem arises. In a semiconductor device of this type, as shown in FIG. 99, a source diffusion layer 345 needs to be connected to a bit line 347 via a bit line contact plug 357 which is located in a central portion of an active region 330. To that end, the bit line 347 needs to cross the active region 330. In other words, the bit line 347 needs to intersect the active region 330. According to this configuration, the bit line 347 has an overlap in a planar manner with a formation region of a capacitance contact plug 346 to which a capacitance element 390 and a drain diffusion layer 344 are connected.

As a result, since the formation region of the capacitance contact plug 346 becomes smaller, a contact area of each of the lower electrodes SN1 and SN2 and the corresponding one of the capacitance contact plugs 346 decreases. Thus, the contact resistance of each of the lower electrodes SN1 and SN2 and the corresponding one of the capacitance contact plugs 346 increases. This increase of the contact resistance hampers high-speed operation of the semiconductor device (DRAM). The problem becomes more serious as the semiconductor device is further miniaturized.

Further, as described above, the downsizing of the distance between the word lines WL1 and WL2 due to the miniaturization of a semiconductor device such as DRAM causes that electric charges begin to stray because the adjacent word lines WL1 and WL2 are too close to each other, thereby causing a disturb failure.

For example, if the word line WL1 is ON and a channel of the transistor Tr1 is formed, and if a Low (L)-level potential is applied to the bit line 347, the lower electrode SN1 enters an L state. Then, after the word line WL1 is turned OFF, information of L (data "0") is accumulated in the lower electrode SN1. On the basis of such an operation state, a situation is formed where the L information is accumulated in the lower electrode SN1, and information of His accumulated in the lower electrode SN2. In this situation, a word line WL1 corresponding to the L-side lower electrode SN1 is repeatedly turned ON and OFF (which is equivalent to a cell operation of another active region which uses the same word line WL1).

As a result, electrons e– that are induced in the channel of the transistor Tr1 begin to stray and reach an adjacent drain diffusion layer 344, destroying the H information accumulated in the lower electrode SN2 and turning the H information into the L state. That is, a failure in which data is turned into data "0" occurs. The event probability of the failure depends on the number of times the word lines WL1 is turned ON and OFF. Just as an example, one in a plurality of cells is destroyed while 10,000 times of the operation are repeated, ten in a plurality of cells are destroyed while 100,000 times of the operation are repeated.

Originally, the adjacent cells need to retain information independently. However, if the disturb failure that an accumulation state of one of the cells is destroyed due to an operation state of another one of the cells which is adjacent to the one of the cells occurs, the problem arises that a normal operation of a semiconductor device is hampered, and the reliability thereof is undermined.

SUMMARY

In one embodiment, there is provided a semiconductor device that includes: a semiconductor substrate; first, second, third, and fourth conductive lines embedded in the semiconductor substrate, arranged in a first direction in this order, and extending in a second direction that is perpendicular to the first direction; a first semiconductor pillar located between the first and second conductive lines; a second semiconductor pillar located between the second and third conductive lines; a third semiconductor pillar located between the third and fourth conductive lines; a first information storage element electrically connected to an upper portion of the first semiconductor pillar; a second information storage element electrically connected to an upper portion of the third semiconductor pillar; and a bit line embedded in the semiconductor substrate, extending in the first direction, and connected to lower portions of the first, second and third semiconductor pillars, at least one of the first and second conductive lines and at least one of the third and fourth conductive lines being supplied with a potential so as to form channels in the first and third semiconductor pillars.

In another embodiment, there is provided a semiconductor device that includes: a semiconductor substrate having a main surface; a first semiconductor pillar being perpendicular to the main surface of the semiconductor substrate and having first and second side surfaces that are opposite to each other; a second semiconductor pillar being perpendicular to the main surface of the semiconductor substrate and having third and fourth side surfaces that are opposite to each other, the third side surface facing the second side surface in a first direction; a first dummy pillar being perpendicular to the main surface of the semiconductor substrate and having fifth and sixth side surfaces that are opposite to each other, the fifth side surface facing the second side surface in the first direction and the sixth side surface facing the third side surface in the first direction; a first gate electrode covering the first side surface with an intervention of a first gate insulation film; a second gate electrode covering the second and fifth side surfaces with an intervention of a second gate insulation film; a third gate electrode covering the third and sixth side surfaces with an intervention of a third gate insulation film; a fourth gate electrode covering the fourth side surface with an intervention of a fourth gate insulation film; a first lower diffusion layer that is electrically connected to at least lower portions of the first and second semiconductor pillars; and first and second upper diffusion layers that are respectively provided in upper portions of the first and second semiconductor pillars.

In still another embodiment, there is provided a semiconductor device that includes: a semiconductor substrate; an element isolation region that is formed in the semiconductor substrate; an active region that is formed in the semiconductor substrate so as to be surrounded by the element isolation region, the active region extending in a first direction; a word line that extends in a second direction crossing to the first direction, the word line crossing the element isolation region and the active region and embedded in the semiconductor substrate; a local bit line that is provided in the active region; and a global bit line that is electrically connected to the local bit line, the global bit line being located above the element isolation region.

In still another embodiment, there is provided a manufacturing method of a semiconductor device, comprising: forming a plurality of pillars including: a first semiconductor pillar being perpendicular to a main surface of a semiconductor substrate and having a first and a second side surface that are located on opposite sides each other; a second semiconductor pillar being perpendicular to the main surface of the semiconductor substrate and having a third side surface facing the second side surface in a first direction and a fourth side surface located on an opposite side from the third side surface; and a first dummy pillar being perpendicular to the main surface of the semiconductor substrate and having a fifth side surface facing the second side surface in the first direction and a sixth side surface located on an opposite side from the fifth side surface so as to face the third side surface in the first direction; forming a gate insulation film at least on the first to sixth side surfaces; and forming a film of a gate electrode material to form a plurality of gate electrodes including: a first gate electrode covering the first side surface via the gate insulation film; a second gate electrode covering the second and fifth side surfaces via the gate insulation film; a third gate electrode covering the third and sixth side surfaces via the gate insulation film; and a fourth gate electrode covering the fourth side surface via the gate insulation film, the film of the gate electrode material being formed thick enough that a portion formed on the second side surface becomes integral with a portion formed on the fifth side surface, and that a portion formed on the third side surface becomes integral with a portion formed on the sixth side surface.

In still another embodiment, there is provided a manufacturing method of a semiconductor device, comprising: forming a first element isolation trench extending in a first direction on one surface's side of a semiconductor substrate; filling the first element isolation trench with an insulation film to form a first element isolation region in a first direction; implanting ions from one surface's side of the semiconductor substrate to form a local bit line; forming a second element isolation trench extending in a second direction on one surface's side of the semiconductor substrate; filling the second element isolation trench with an insulation film to form a second element isolation region in a second direction; forming a first interlayer insulation film on one surface's side of the semiconductor substrate; forming a trench in the first interlayer insulation film, and forming a word line in such a way as to fill the trench; forming an insulation film in such a way as to cover an upper surface of the word line and fill the trench; and forming a global bit line above the first element isolation region.

According to the present invention, the second and third gate electrodes are separated by the first dummy pillar. Therefore, there is no need to use anisotropic dry etching to separate the second and third gate electrodes. Accordingly, a failure in the separation by anisotropic dry etching does never occur. Thus, it is possible to prevent the second and third gate electrodes from being short-circuited.

Moreover, according to the present invention, the global bit line is disposed above the element isolation region and does not cross the active region below the lower electrode. Therefore, the formation region of the capacitance contact plug joined to the lower electrode can be sufficiently secured. As a result, it is possible to increase a contact area of the capacitance contact plug and the lower electrode, and decrease a contact resistance therebetween.

DETAILED DESCRIPTION OF THE EMBODIMENTS

Preferred embodiments of the present invention will be explained below in detail with reference to the accompanying drawings.

Referring now to FIGS. 1 to 8, the semiconductor device A1 has a structure in which an active region 3 is defined by element isolation regions 8 on a surface 1a of a semiconductor substrate (silicon substrate) 1. As the semiconductor substrate 1, it is preferred that a semiconductor substrate made of p-type silicon single crystal be used. However, the semiconductor substrate 1 can also be composed of one of a semiconductor substrate made of n-type silicon single crystal, a semiconductor substrate made of a compound semiconductor, a SOI substrate, and a TFT substrate.

Figure 1:
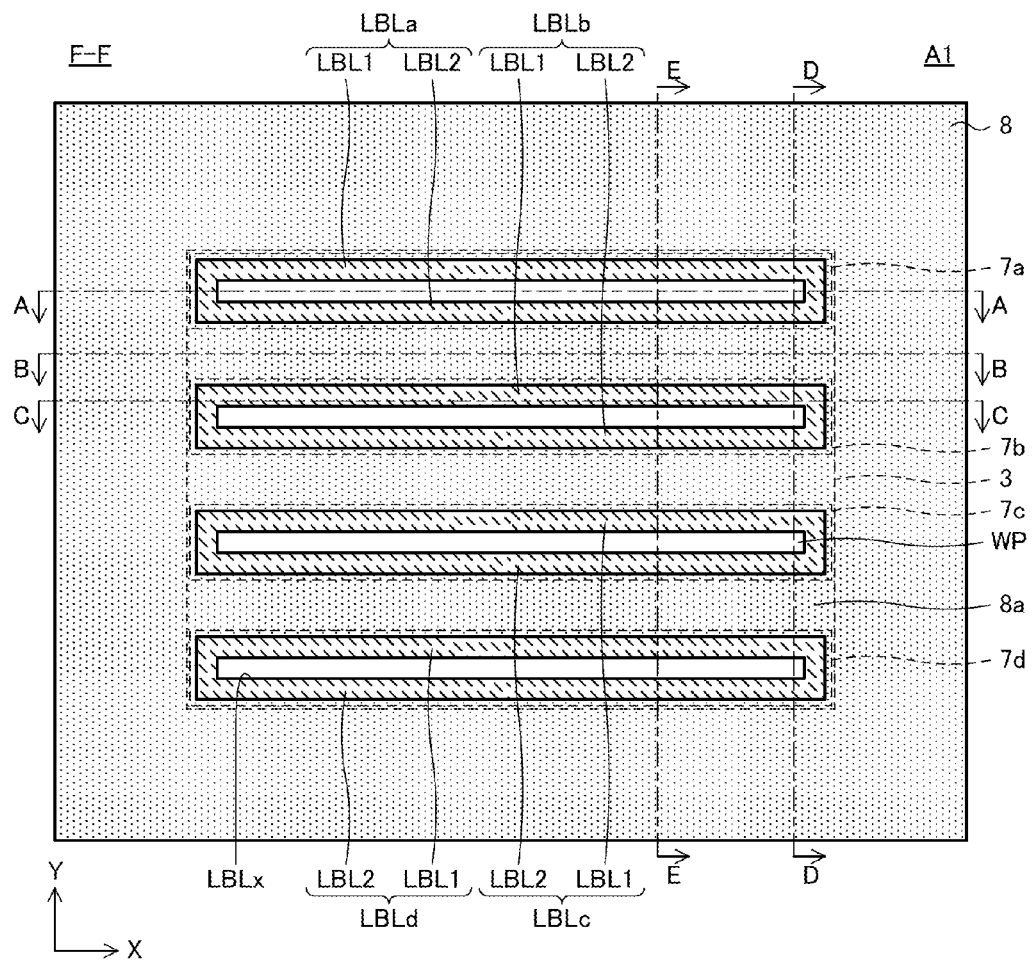
FIG. 1 is a plane view of a semiconductor device A1 according to a first embodiment of the present invention, corresponding to a line F-F shown in FIGS. 4 to 8.

As shown in FIG. 1, an active region 3 is divided into four strip-shaped active regions 7a to 7d each of which extends in an X direction (bit-line direction; first direction) by strip-shaped element isolation regions 8a each of which extends in the X direction. Though the four active regions 7a to 7d are provided in the active region 3 in this case, at least one or more active regions may be provided in the active region 3. In the following description, when there is no need to distinguish the active regions 7a to 7d, the active regions 7a to 7d may be collectively referred to as active regions 7.

Figure 2:
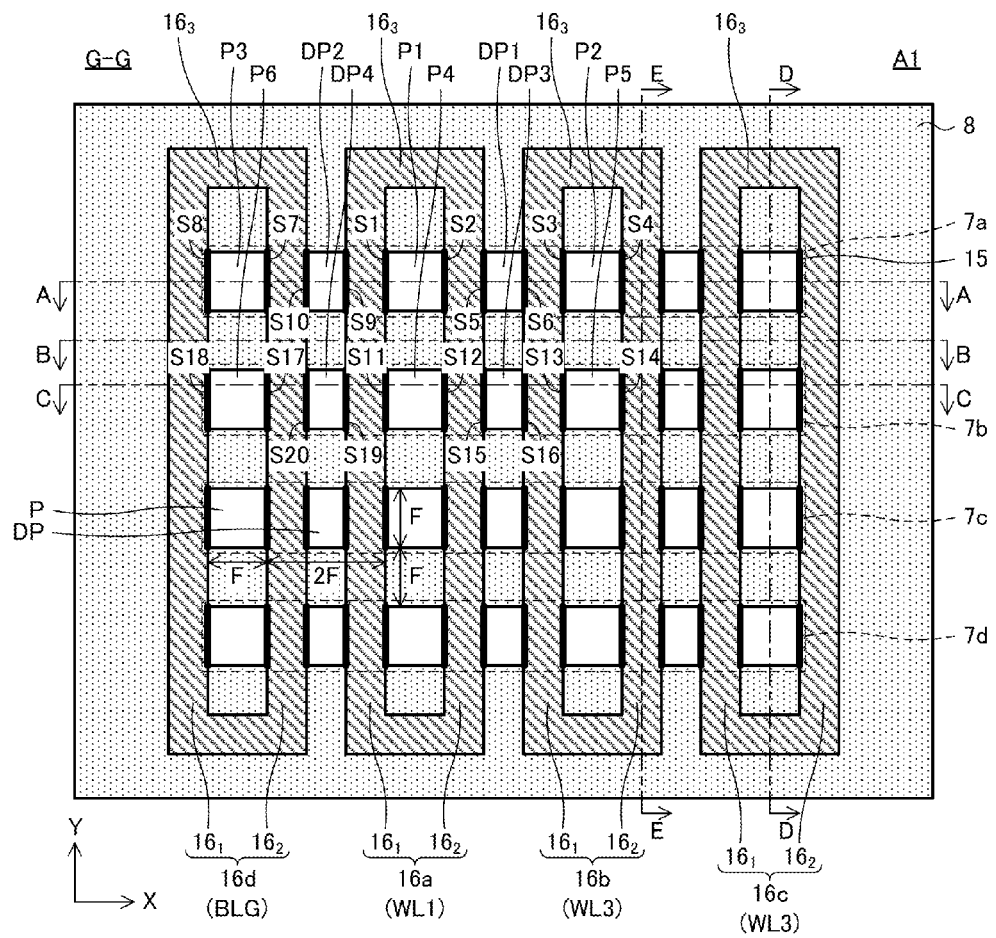
FIG. 2 is a plane view of the semiconductor device A1 corresponding to a line G-G shown in FIGS. 4 to 8.

It is preferred that the width in a Y direction (a direction perpendicular to the X-direction within the surface 1a, which is identical to a word-line direction; second direction) of the active regions 7 be a minimum feature size F defined by lithography technique as shown in FIG. 2. It is also preferred that the clearance between the active regions 7 (Y-direction distance) be F. However, the clearance may be smaller than F.

Figure 4:
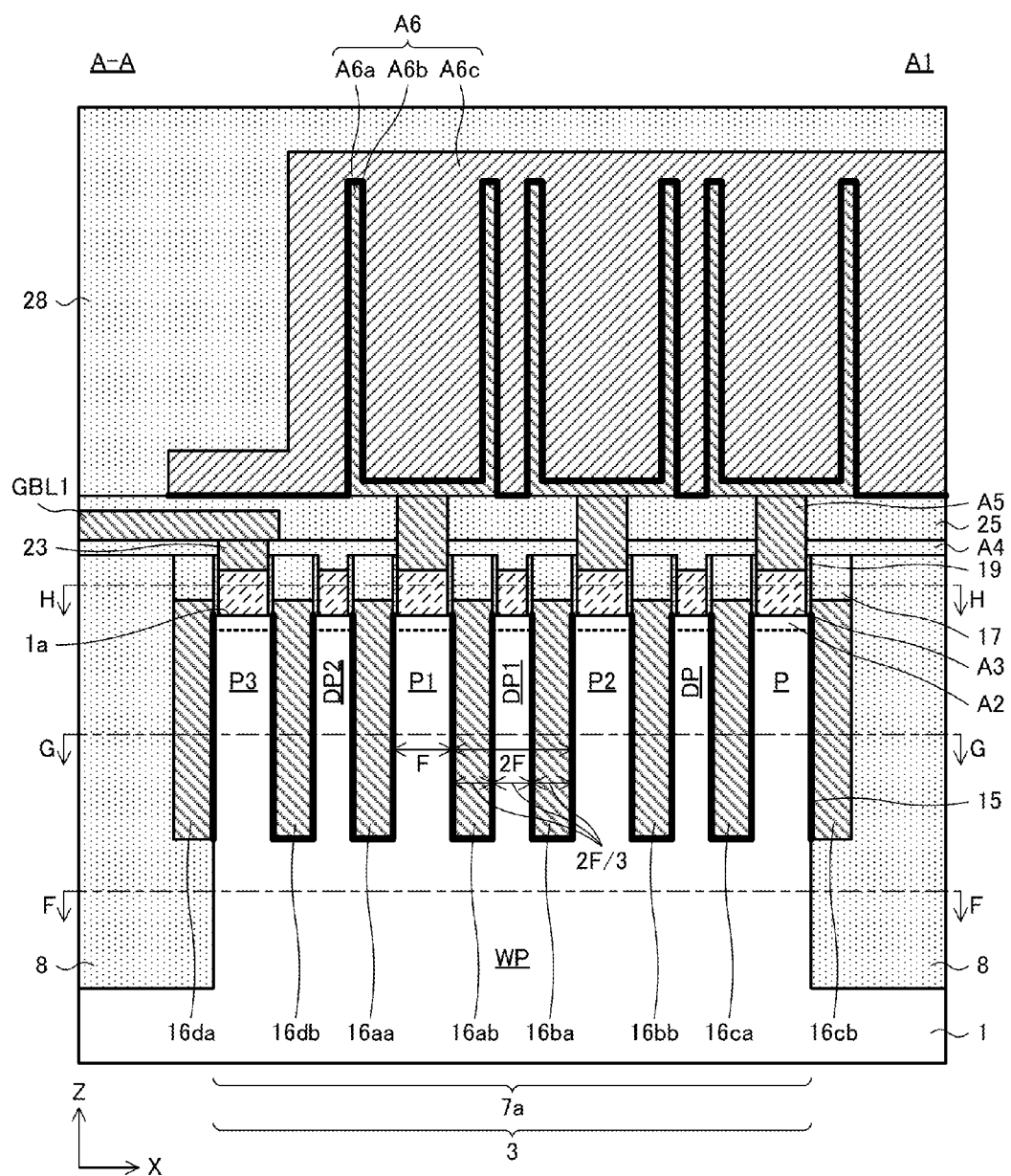
FIG. 4 is a cross-sectional view of the semiconductor device A1 corresponding to a line A-A shown in FIGS. 1 to 3.
Figure 5:
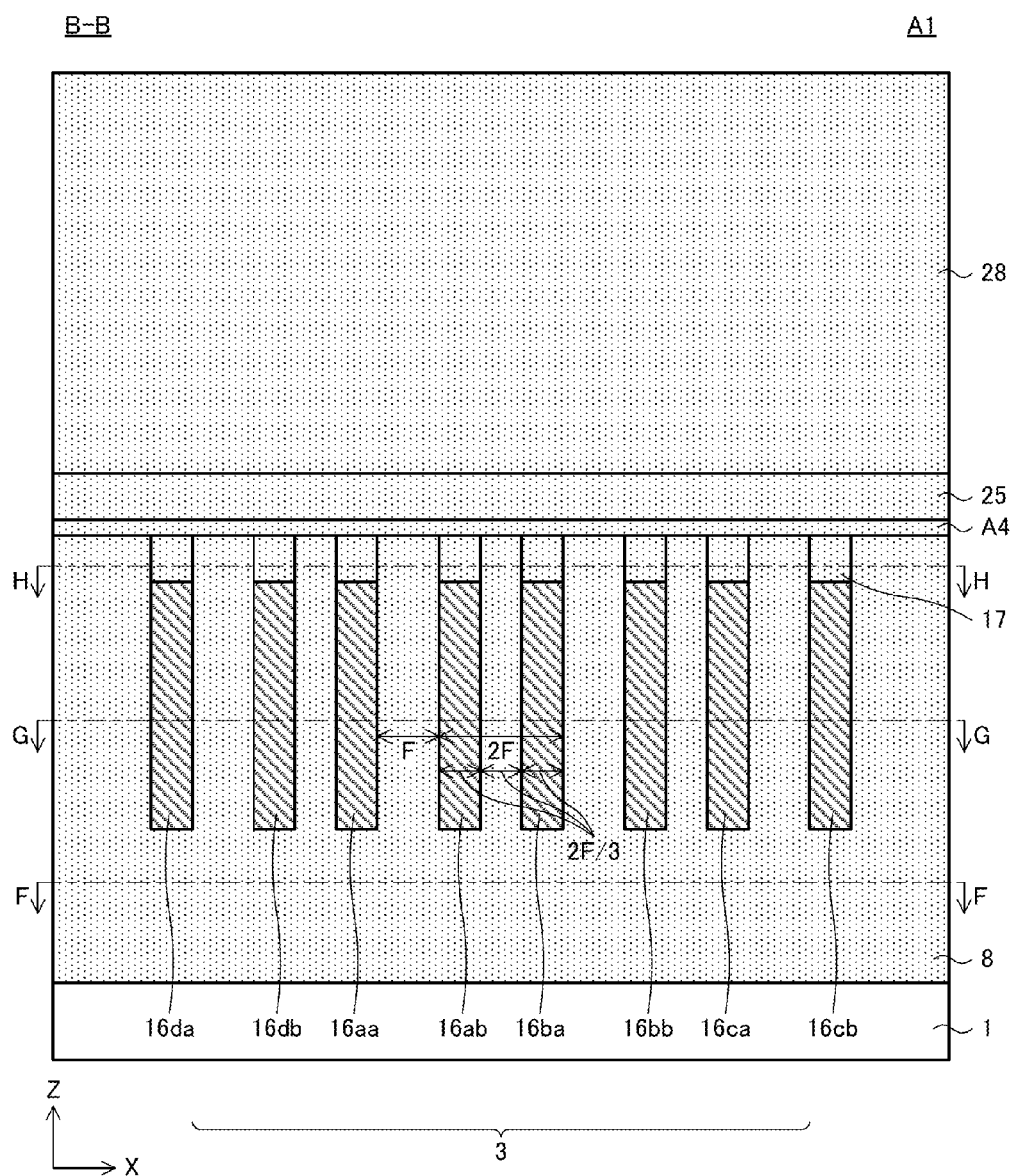
FIG. 5 is a cross-sectional view of the semiconductor device A1 corresponding to a line B-B shown in FIGS. 1 to 3.

As shown in FIG. 4 and other diagrams, some wall-like semiconductor pillars WP each standing perpendicularly to a main surface of the semiconductor substrate 1 are provided in an active region 7. On an upper surface of each of the wall-like semiconductor pillars WP, four semiconductor pillars P and three dummy pillars DP are erected. As detailed below, each of the semiconductor pillars P and dummy pillars DP constitutes a transistor. Each of the transistors corresponding to the semiconductor pillars P other than those located at one end (left-side end portion of FIG. 4) of the active region 7 constitutes a cell transistor of DRAM. On and off of such the transistors is controlled by the corresponding one of the word lines WL (described later). Each of the transistors corresponding to the semiconductor pillars P located at the one end (left-side end portion of FIG. 4) of the active region 7 constitutes a bit-line switching transistor that controls connection between each of the cell transistors in the same active region 7 and a global bit line GBL described later. On and off of the bit-line switching transistor is controlled by a bit line drive wire BLG described later. The transistors corresponding to the dummy pillars DP are dummy transistors which are not assigned any particular role.

Each of the wall-like semiconductor pillars WP is a wall-like semiconductor pillar whose longitudinal direction is the X direction, and occupies a lower portion of the corresponding one of the active regions 7. The four semiconductor pillars P and the three dummy pillars DP are alternately erected at regular intervals in the X direction on the upper surfaces of the wall-like semiconductor pillars WP. The Y-direction width of each of the semiconductor pillars P and the dummy pillars DP is equal to the Y-direction width (=F) of each of the active regions 7. The X-direction width of each of the semiconductor pillars P is F, and the X-direction distance between the semiconductor pillars P is 2F. Accordingly, the semiconductor device A1 has one semiconductor pillar P within each plane of $6F^2$. The X-direction width of each of the dummy pillars DP is 2F/3. Accordingly, the X-direction distance between any one of the dummy pillars DP and any one of the semiconductor pillars P adjacent to each other is 2F/3. The length of 2F/3 can be achieved by an etching process that uses a sidewall insulation film. This point will be detailed later when a manufacturing method is described.

Though the number of semiconductor pillars P formed in one active region 7 is four in this case, the number may be two or more. Moreover, the distance between two of the semiconductor pillars P adjacent each other in the X-direction may be F, and the distance between two of the semiconductor pillars P adjacent each other in the Y-direction may be 0.5F. In this case, the layout density of the semiconductor pillars P is such that one semiconductor pillar P is provided within each plane of $3F^2$.

Figure 7:
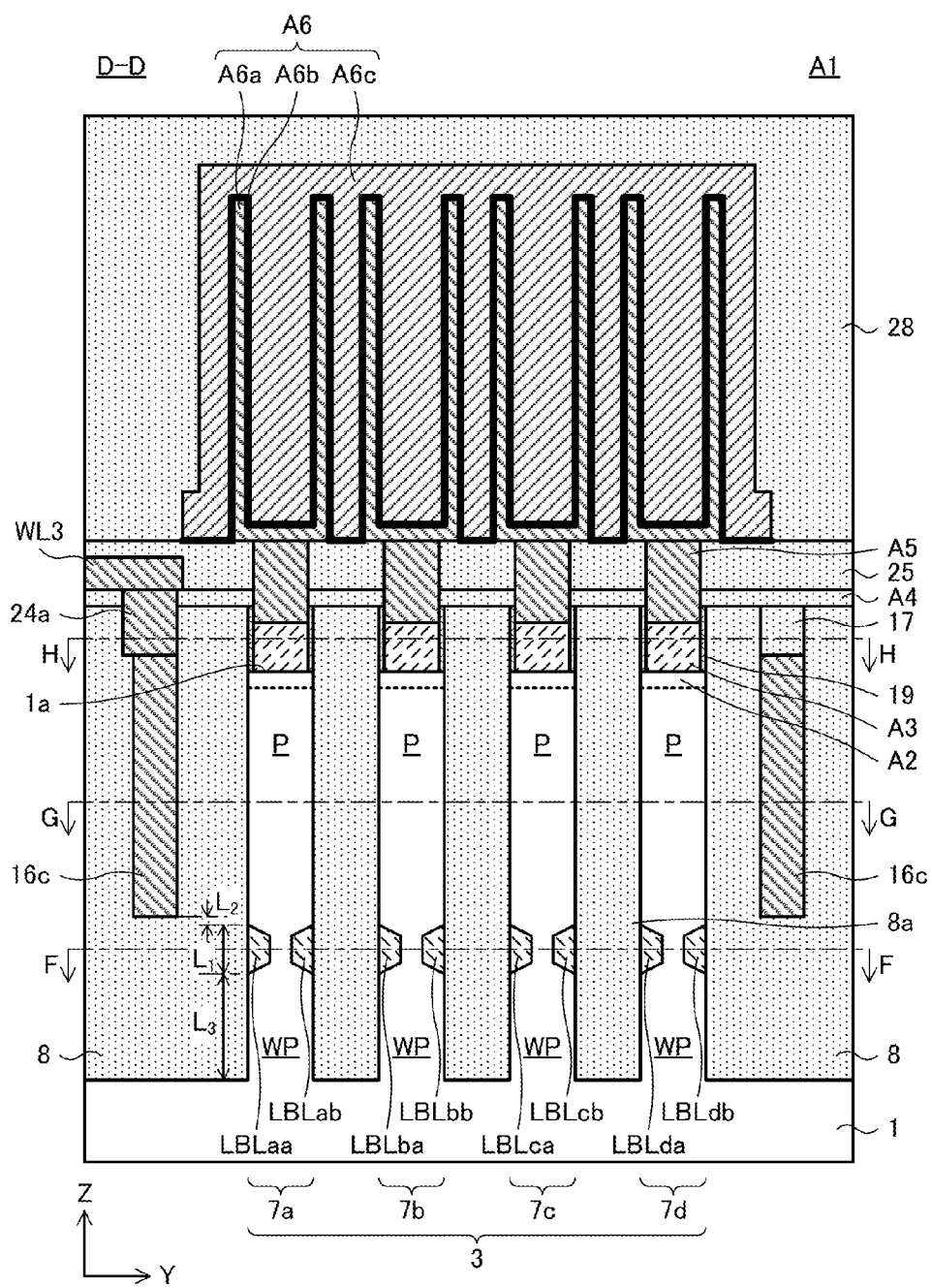
FIG. 7 is a cross-sectional view of the semiconductor device A1 corresponding to a line D-D shown in FIGS. 1 to 3.

In the wall-like semiconductor pillars WP corresponding to the active regions 7a to 7d, lower diffusion layers (local bit lines) LBLa to LBLd are formed, respectively, as shown in FIGS. 1 and 7 and other diagrams. In the following description, when there is no need to distinguish the lower diffusion layers LBLa to LBLd, the lower diffusion layers LBLa to LBLd may be collectively referred to as lower diffusion layers LBL. Each of the lower diffusion layers LBL is provided in common to a plurality of transistors formed in the corresponding one of the active regions 7. The lower diffusion layers LBL serves as either the sources or drains of the corresponding transistors.

More specifically, each of the lower diffusion layers LBL includes a first sub diffusion layer LBL1 and a second sub diffusion layer LBL2 as shown in FIGS. 1 and 7 and other diagrams. The first sub diffusion layer LBL1 is embedded in one of two side surfaces of a wall-like semiconductor pillar WP that are parallel to the X direction. The second sub diffusion layer LBL2 is embedded in the other one of the two side surfaces. Both the first and second sub diffusion layers LBL1 and LBL2 are n-type impurity diffusion layers which are formed by injecting n-type impurities into the p-type semiconductor substrate 1.

As shown in FIG. 1, the first and second sub diffusion layers LBL1 and LBL2 are in contact with each other at both X-direction ends, but not in contact with each other in other portions. That is, a gap LBLx is provided between the first and second sub diffusion layers LBL1 and LBL2. Through the gap LBLx, two portions of the silicon that are located above and below the corresponding one of the lower diffusion layers LBL are directly in contact with each other. The reason why such a configuration is employed is to prevent a floating body effect from occurring. That is, if the gap LBLx is not provided and the above-referenced two portions of the silicon is completely separated, the upper-side one of the two portions constitutes an enclosed region of the p-type substrate. The formation of such the enclosed region causes a floating body effect. Here, such the formation of the enclosed region can be prevented by bringing one of the two portions into direct contact with another one of the two portions. Therefore, the occurrence of the floating body effect is prevented by providing the gap LBLx. However, the above configuration to prevent the occurrence of the floating body effect is not essential for the present invention, and even if the gap LBLx is not provided, main advantageous effects of the present invention can be achieved.

Figure 8:
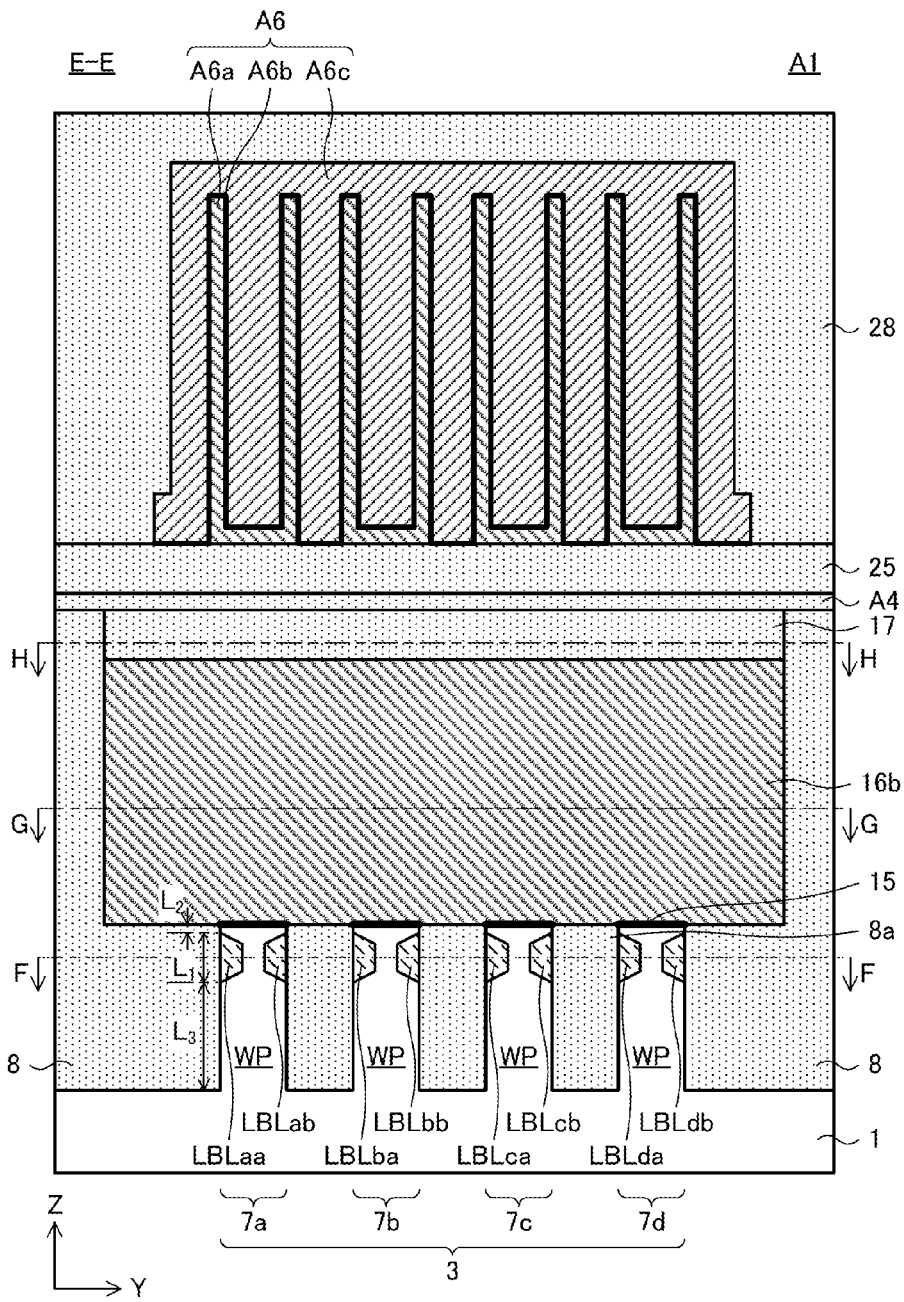
FIG. 8 is a cross-sectional view of the semiconductor device A1 corresponding to a line E-E shown in FIGS. 1 to 3.

The width and position in a vertical direction of each of the lower diffusion layers LBL is preferably adjusted at a production stage in the following manner. That is, the width $L_1$ shown in FIGS. 7 and 8 (or the width in the vertical direction of each of the lower diffusion layers LBL) is preferably greater than or equal to 10 nm and less than or equal to 50 nm. The width $L_2$ shown in FIGS. 7 and 8 (or the distance in the vertical direction between an upper end of each of the lower diffusion layers LBL and a lower surface of each of the gate electrodes 16) is preferably greater than or equal to 2 nm and less than or equal to 20 nm. Incidentally, if the width $L_2$ is 2 nm, the lower diffusion layers LBL are in contact with gate insulation films 15 (FIG. 8). A situation where the width $L_2$ is greater than 20 nm is not preferable because the situation has an adverse effect on transistor characteristics as a channel offset becomes larger. Furthermore, the width L3 shown in FIGS. 7 and 8 (or the distance in the vertical direction between a lower end of each of the lower diffusion layers LBL and lower surfaces of the element isolation regions 8 and 8a) is preferably greater than or equal to 50 nm. A situation where the width L3 is less than 50 nm is not preferable because the situation can cause a leakage current between lower diffusion layers LBL of the adjacent active regions 7.

Figure 6:
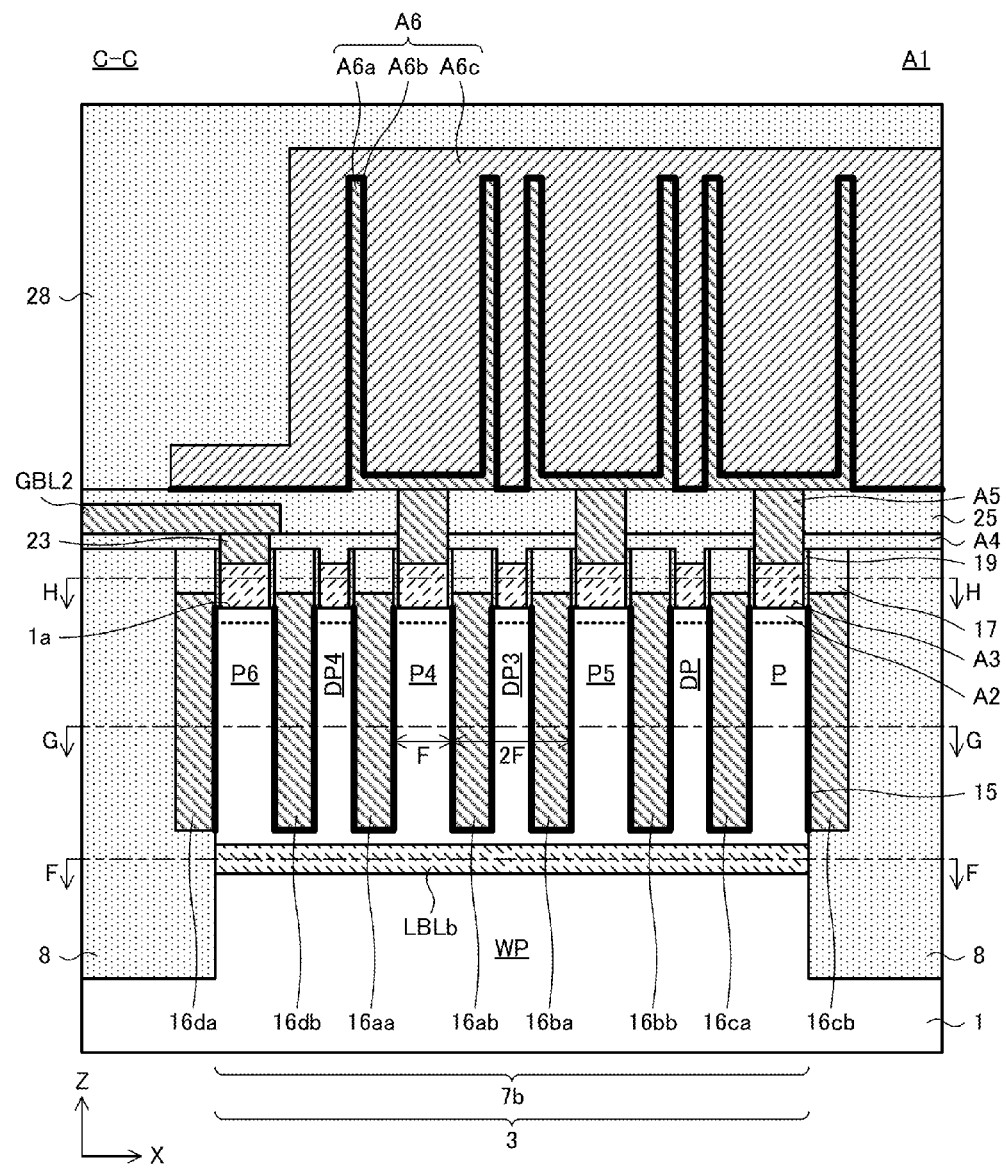
FIG. 6 is a cross-sectional view of the semiconductor device A1 corresponding to a line C-C shown in FIGS. 1 to 3.

As shown in FIGS. 4, 6, and 7 and other diagrams, on the upper ends of each of the semiconductor pillars P and each of the dummy pillars DP, an upper diffusion layer A2, which is a n-type impurity diffusion layer, is formed. Each of the upper diffusion layers A2 serves as the other one of the source and drain of the transistor formed in a corresponding pillar. On an upper surface of each of the upper diffusion layers A2, a n-type epitaxially grown silicon (Epi-Si) layer A3 is formed. A side surface of each of the Epi-Si layers A3 is covered with a sidewall insulation film 19.

As shown in FIG. 2, four gate electrodes 16a to 16d, each of which extends in the Y direction, are allocated to each of the active regions 3. From the left side of FIG. 2, the gate electrodes 16d, 16a, 16b, and 16c are arranged in that order so as to cross the active regions 3 in the Y direction. In the following description, when there is no need to distinguish the gate electrodes 16a to 16d, the gate electrodes 16a to 16d may be collectively referred to as gate electrodes 16.

Each of the gate electrodes 16 is so formed as to include a sub gate electrode $16_1$ and a sub gate electrode $16_2$, each of which extends in the Y direction. The sub gate electrodes $16_1$ and $16_2$ are connected each other by a connection conductor $16_3$ at one end in the Y direction which is located outside the active regions 3. Similarly, the sub gate electrodes $16_1$ and $16_2$ are also connected each other at the other end in the Y direction which is also located outside the active regions 3.

As shown in FIG. 2, the sub gate electrodes $16_1$ and sub gate electrodes $16_2$ are disposed in a region between the semiconductor pillars P and the dummy pillars DP (or inside a gate trench 60A shown in FIG. 34, which is described later) one by one. On side surfaces in the X direction of each of the semiconductor pillars P and dummy pillars DP, a gate insulation film 15 is formed. Each of the sub gate electrodes $16_1$ and $16_2$ covers the side surfaces of the pillars that are located on both sides of itself through the gate insulation film 15. Accordingly, each of the gate electrodes 16 serves as a gate electrode common to four of the semiconductor pillars P arranged side by side in the Y direction.

On an upper surface of each of the sub gate electrodes $16_1$ and $16_2$, a cap insulation film 17 is formed. The cap insulation film 17 serves to insulate the corresponding one of the sub gate electrodes $16_1$ and $16_2$ from various wires on an upper layer. Each of the sub gate electrodes $16_1$ and $16_2$ is adjacent to one or more of the above mentioned Epi-Si layers A3. Each of the sub gate electrodes $16_1$ and $16_2$ is insulated from the adjacent Epi-Si layers A3 by sidewall insulation films 19 which are provided on side surfaces of the Epi-Si layers A3.

The width in the X direction of each of the sub gate electrodes $16_1$ and $16_2$ of each of the gate electrodes 16 has the same value (=2F/3). Accordingly, as can be seen from FIG. 2, a semiconductor pillar P on one X-direction side of one of the dummy pillars DP and the corresponding sub gate electrodes $16_1$ and $16_2$, and a semiconductor pillar P on the other X-direction side of the one of the dummy pillars DP and the corresponding sub gate electrodes $16_1$ and $16_2$ are so shaped as to be symmetry with respect to an X-direction central line of the one of the dummy pillars DP. Similarly, a dummy pillar DP on one X-direction side of one of the semiconductor pillars P and the sub gate electrodes $16_1$ and $16_2$ located on both sides of the dummy pillar P, and a dummy pillar DP on the other X-direction side of the one of the semiconductor pillars P and the sub gate electrodes $16_1$ and $16_2$ located on both sides of the dummy pillar DP are so shaped as to be symmetry with respect to an X-direction central line of the one of the semiconductor pillars P.

Figure 3:
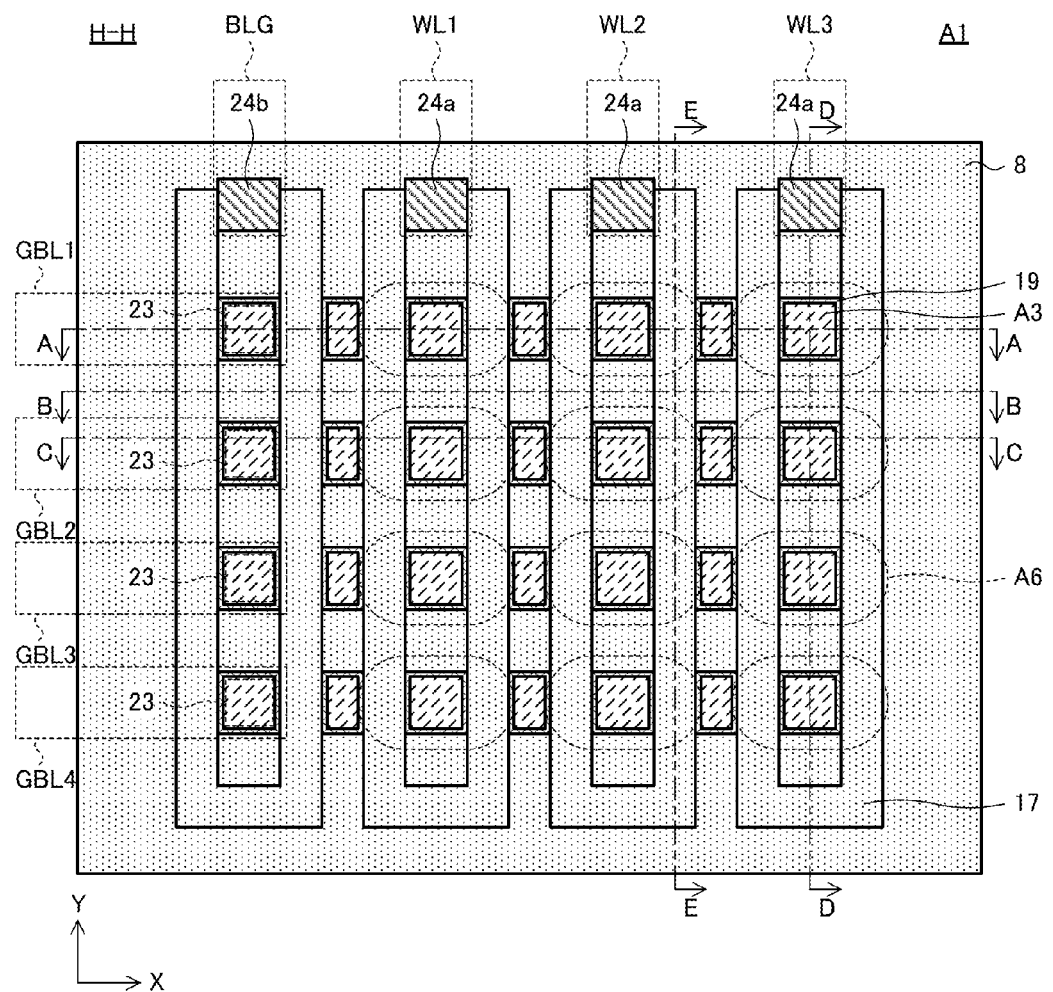
FIG. 3 is a plane view of the semiconductor device A1 corresponding to a line H-H shown in FIGS. 4 to 8.

Upper surfaces of the element isolation regions 8 and 8a, the cap insulation films 17, and the Epi-Si layers A3 are covered with a first interlayer insulation film A4. On an upper surface of the first interlayer insulation film A4, as shown in FIGS. 3, 4, and 7 and other diagrams, word lines WL1 to WL3, a bit line drive wire BLG, and global bit lines GBL1 to GBL4 are formed. Each of the word lines WL1 to WL3 and bit line drive wire BLG extends in the Y direction. Each of the global bit lines GBL1 to GBL4 extends in the X direction. In the following description, when there is no need to distinguish the word lines WL1 to WL3, the word lines WL1 to WL3 may be collectively referred to as word lines WL. Moreover, when there is no need to distinguish the global bit lines GBL1 to GBL4, the global bit lines GBL1 to GBL4 may be collectively referred to as global bit lines GBL.

The word lines WL1 to WL3 are disposed above the connection conductors $16_3$ of the gate electrodes 16a to 16c, respectively. Each of the word lines WL is connected to the corresponding connection conductor $16_3$ via a word line contact conductor 24a that passes through the first interlayer insulation film A4. A lower end of each of the word line contact conductors 24a is in contact with the corresponding connection conductor $16_3$, and an upper end of each of the word line contact conductors 24a is in contact with the corresponding word line WL. As a result, the gate electrodes 16a to 16c function as part of the word lines WL1 to WL3, respectively.

Similarly, the bit line drive wire BLG is disposed above the connection conductors $16_3$ of the gate electrode 16d. The bit line drive wire BLG is connected to the corresponding connection conductor $16_3$ via a bit line drive wire contact conductor 24b that passes through the first interlayer insulation film A4. A lower end of the bit line drive wire contact conductor 24b is in contact with the corresponding connection conductor $16_3$, and an upper end of the bit line drive wire contact conductor 24b is in contact with the bit line drive wire BLG. As a result, the gate electrode 16d functions as part of the bit line drive wire BLG.

The global bit lines GBL1 to GBL4 are provided for the active regions 7a to 7d, respectively. Each of the global bit lines GBL1 to GBL4 is disposed above the semiconductor pillar P (or the semiconductor pillar P corresponding to the gate electrode 16d) located at the leftmost side among four of the semiconductor pillars P formed in the corresponding active region 7. Each of the global bit lines GBL is connected to an upper diffusion layer A2 that is provided at an upper end of the corresponding semiconductor pillar P via a bit line contact conductor 23 that passes through the first interlayer insulation film A4 and via the corresponding Epi-Si layer A3. Therefore, each of the global bit lines GBL is connected to the lower diffusion layer LBL of the corresponding active region 7 when the bit line drive wire BLG is activated (i.e. when the bit line switching transistor is turned ON).

On an upper surface of the first interlayer insulation film A4, a second interlayer insulation film 25 is formed. The film thickness of the second interlayer insulation film 25 is set to be thick enough, or more, that the word lines WL, the bit line drive wire BLG, and the global bit line GBLs are completely covered. On an upper surface of the second interlayer insulation film 25, a plurality of cell capacitors A6 are formed. The cell capacitors A6 are provided for each cell transistor.

As shown in FIG. 4 and other diagrams, each of the cell capacitors A6 includes a crown-structure lower electrode A6a; a capacitance insulation film A6b which covers surfaces of the lower electrodes A6a except lower surfaces thereof; and an upper electrode A6c which is placed on the capacitance insulation film A6b in such a way as to cover the entire lower electrode A6a. The upper electrode A6c is so provided as to be common to the cell capacitors A6. An upper surface the upper electrode A6c is covered with a third interlayer insulation film 28. A lower surface of each of the lower electrodes A6a is connected to an upper surface of one of the Epi-Si layers A3 provided on an upper surface of the corresponding semiconductor pillar P through a capacitance contact conductor A5 that passes through the first and second interlayer insulation films A4 and 25.

The following describes the configuration of the semiconductor device A1 in more detail, taking first to sixth semiconductor pillars P1 to P6 each of which is the semiconductor pillar P, and first to fourth dummy pillars DP1 to DP4 each of which is the dummy pillar DP as examples.

As shown in FIG. 2, the first semiconductor pillar P1 is so formed as to have first and second side surfaces S1 and S2 which are located on the opposite sides each other. Moreover, the second semiconductor pillar P2 is so formed as to have a third side surface S3 opposing the second side surface S2 in the X direction, and a fourth side surface S4 which is located on the opposite side of the third side surface S3. The first dummy pillar DP1 is so formed as to have a fifth side surface S5 opposing the second side surface S2 in the X direction, and a sixth side surface S6 opposing the third side surface S3 in the X direction. The third semiconductor pillar P3 is so formed as to have a seventh side surface S7 opposing the first side surface S1 in the X direction, and an eighth side surface S8 which is located on the opposite side of the seventh side surface S7. The second dummy pillar DP2 is so formed as to have a ninth side surface S9 opposing the first side surface S1 in the X direction, and a tenth side surface S10 opposing the seventh side surface S7 in the X direction.

The fourth to sixth semiconductor pillars P4 to P6 are formed at the same positions as the first to third semiconductor pillars P1 to P3, respectively, when viewed in the Y direction. The third and fourth dummy pillars DP3 and DP4 are formed at the same positions as the first and second dummy pillars DP1 and DP2, respectively, when viewed in the Y direction. The fourth semiconductor pillar P4 is so formed as to have eleventh and twelfth side surfaces S11 and S12 which are located on the opposite sides each other. The fifth semiconductor pillar P5 is so formed as to have a thirteenth side surface S13 opposing the twelfth side surface S12 in the X direction, and a fourteenth side surface S14 which is located on the opposite side of the thirteenth side surface 513. The third dummy pillar DP3 is so formed as to have a fifteenth side surface S15 opposing the twelfth side surface S12 in the X direction, and a sixteenth side surface S16 opposing the thirteenth side surface S13 in the X direction. The sixth semiconductor pillar P6 is so formed as to have a seventeenth side surface S17 opposing the eleventh side surface S11 in the X direction, and an eighteenth side surface S18 which is located on the opposite side of the seventeenth side surface S17. The fourth dummy pillar DP4 is so formed as to have a nineteenth side surface S19 opposing the eleventh side surface S11 in the X direction, and a twentieth side surface S20 opposing the seventeenth side surface S17 in the X direction.

On an upper end of each of the first to sixth semiconductor pillars P1 to P6, an upper diffusion layer A2 (first to sixth upper diffusion layers) is provided as shown in FIGS. 4 and 6. Each of the upper diffusion layers A2 of the first, second, fourth and fifth semiconductor pillars P1, P2, P4, and P5 is connected to the lower electrode A6a of a corresponding one of the cell capacitors A6 through a corresponding one of the Epi-Si layers A3 and a corresponding one of the capacitance contact conductors A5. Each of the upper diffusion layers A2 of the third and sixth semiconductor pillars P3 and P6 is connected to a corresponding one of the global bit lines GBL through a corresponding one of the Epi-Si layers A3 and a corresponding one of the bit line contact conductors 23. Though an upper diffusion layer A2 is also provided on an upper end of each of the first to fourth dummy pillars DP, the upper diffusion layer A2 is neither connected to the cell capacitors A6 nor the global bit lines GBL.

Lower portions of the first to third semiconductor pillars P1 to P3 are electrically connected to a lower diffusion layer LBLa (first lower diffusion layer). Lower portions of the fourth to sixth semiconductor pillars P4 to P6 are electrically connected to a lower diffusion layer LBLb (second lower diffusion layer).

The sub gate electrode $16_1$ (first gate electrode) of the gate electrode 16a covers the side surfaces S1, S9, S11, and S19 through the gate insulation film 15. As a result, this sub gate electrode $16_1$ serves as a gate electrode common to transistors that are formed on the semiconductor pillars P1 and P4. The sub gate electrode $16_2$ (second gate electrode) of the gate electrode 16a covers the side surfaces S2, S5, S12, and S15 through the gate insulation film 15. As a result, this sub gate electrode $16_2$ also serves as a gate electrode common to transistors that are formed on the semiconductor pillars P1 and P4. That is, the gate electrode 16a has the above-described double gate structure.

The sub gate electrodes $16_1$ and $16_2$ of the gate electrode 16a are connected each other by the connection conductor $16_3$ (first connection conductor) which is provided at one end in the Y direction. The connection conductor $16_3$ is connected to the word line WL1 (first word line) provided in an upper-layer through the word line contact conductor 24a (first word line contact conductor). According to the above configuration, it is possible to control a process of turning ON and OFF cell transistors that are formed on the semiconductor pillars P1 and P4 by controlling the potential of the word line WL1.

The sub gate electrode $16_1$ (third gate electrode) of the gate electrode 16b covers the side surfaces S3, S6, S13, and S16 through the gate insulation film 15. As a result, this sub gate electrode $16_1$ serves as a gate electrode common to transistors that are formed on the semiconductor pillars P2 and P5. The sub gate electrode $16_2$ (fourth gate electrode) of the gate electrode 16b covers the side surfaces S4 and S14 through the gate insulation film 15. As a result, the sub gate electrode $16_2$ also serves as a gate electrode common to transistors that are formed on the semiconductor pillars P2 and P5. That is, the gate electrode 16b also has the above-described double gate structure.

The sub gate electrodes $16_1$ and $16_2$ of the gate electrode 16b are also connected each other by the connection conductor $16_3$ (second connection conductor) which is provided at one end in the Y direction. The connection conductor $16_3$ is connected to the word line WL2 (second word line) provided in an upper-layer through the word line contact conductor 24a (second word line contact conductor). According to the above configuration, it is possible to control a process of turning ON and OFF cell transistors that are formed on the semiconductor pillars P2 and P5 by controlling the potential of the word line WL2.

A sub gate electrode $16_1$ (fifth gate electrode) of a gate electrode 16d covers, through a gate insulation film 15, the side surfaces S8 and S18. As a result, the sub gate electrode $16_1$ serves as a gate electrode common to transistors that are formed on the semiconductor pillars P3 and P6. A sub gate electrode $16_2$ (sixth gate electrode) of the gate electrode 16d covers, through a gate insulation film 15, the side surfaces S7, S10, S17, and S20. As a result, the sub gate electrode $16_2$ also serves as a gate electrode common to transistors that are formed on the semiconductor pillars P3 and P6. That is, the gate electrode 16d also has the above-described double gate structure. According to the above configuration, by controlling the potential of the gate electrode 16d, it is possible to control a process of turning ON and OFF transistors that are formed on the semiconductor pillars P3 and P6.

The sub gate electrodes $16_1$ and $16_2$ of the gate electrode 16d are also connected each other by the connection conductor $16_3$ (third connection conductor) which is provided at one end in the Y direction. The connection conductor $16_3$ is connected to the bit line drive wire BLG provided in an upper-layer through the bit line drive wire contact conductor 24b. According to the above configuration, it is possible to control a process of turning ON and OFF cell transistors that are formed on the semiconductor pillars P3 and P6 by controlling the potential of the bit line drive wire BLG.

The above has described the configuration of the semiconductor device A1 by using a specific example.

The following describes an operation of the semiconductor device A1 having the above configuration, taking a case in which a reading/writing operation is performed on a cell capacitor A6 in an active region 3 as an example.

When an act command and a row address are supplied from a controller outside the semiconductor device A1, a corresponding one of the word lines WL is activated accordingly. As a result, a cell transistor connected to a word line WL specified by the supplied row address is turned ON. Then, when a write command or a read command, and a column address are supplied from the external controller, a corresponding one of the global bit lines GBL is connected to a read/write bus (not shown), and the bit line drive wire BLG becomes activated. As a result, read/write access to a cell capacitor specified by the supplied row address and column address from the external controller is made possible.

As described above, according to the semiconductor device A1 of the present embodiment, the adjacent gate electrodes 16 (e.g. the gate electrodes 16a and 16b) are separated by the dummy pillar DP. Therefore, when the above components are formed, it is not necessary to use separation by anisotropic dry etching. Accordingly, a failure in the separation of adjacent gate electrodes by anisotropic dry etching does never occur. Thus, it is possible to prevent the adjacent gate electrodes 16 from being short-circuited.

The following describes a method of manufacturing the semiconductor device A1 according to the present embodiment, with reference to FIGS. 9 to 50.

The present manufacturing method is divided into 16 steps (Steps 1 to 16). The number indicative of a corresponding step is described at the upper right corner of each diagram. At the upper left corner of each diagram, the symbol "A-A" or the like is described to make clear which type of cross-sectional view each diagram is, from a cross-sectional view taken along line A-A to a cross-sectional view taken along line H-H as shown in FIGS. 1 to 8. A diagram with "Top Plan" is a top view of the semiconductor device A1 at that point in time.

Figure 9:
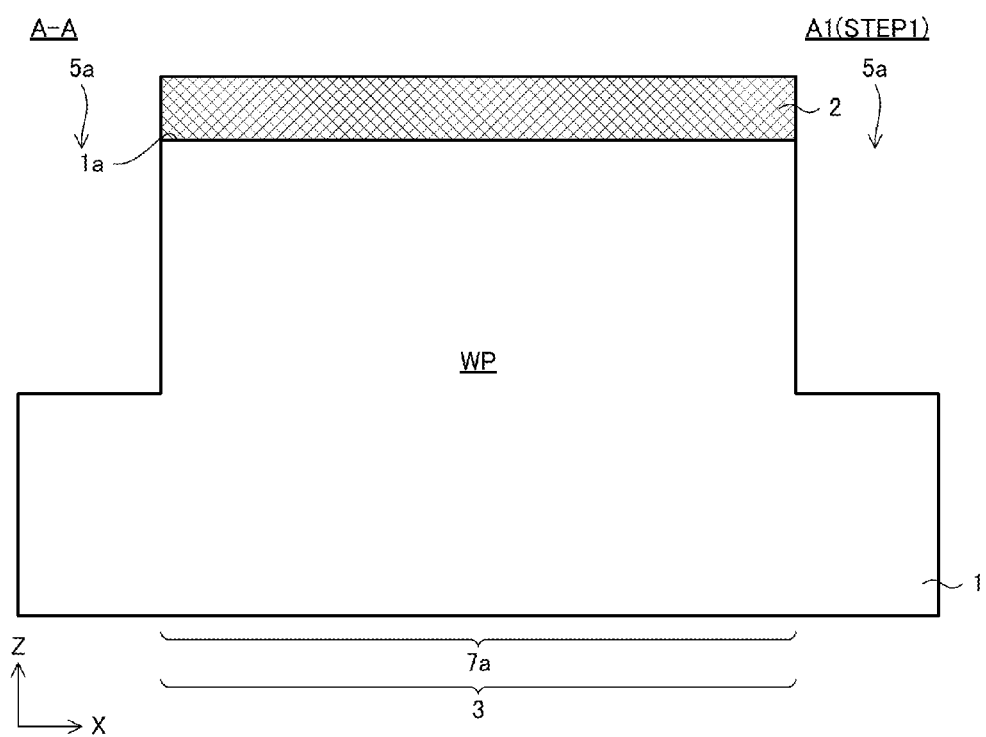
FIGS. 9 and 10 are diagrams each showing the semiconductor device A1 at step 1 of a manufacturing process according to the first embodiment.
Figure 10:
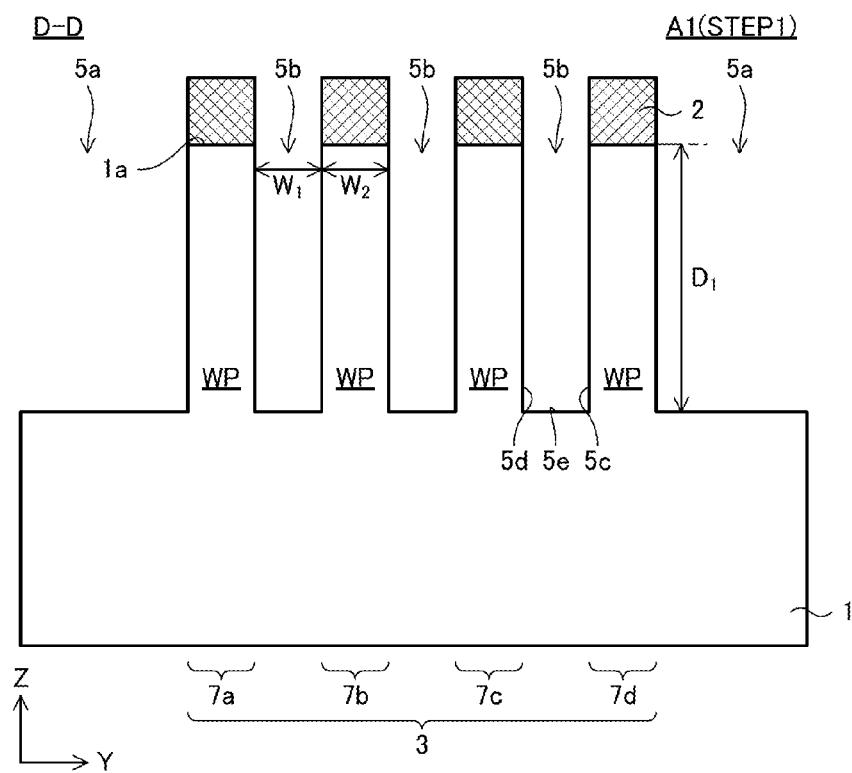

First, as shown in FIGS. 9 and 10 (Step 1), a mask film 2 (first mask film) is so formed as to cover regions corresponding to the above-described strip-shaped active regions 7a to 7d on a surface 1a of a semiconductor substrate 1 made of p-type single crystal silicon. For the formation of the mask film 2, lithography and an anisotropic dry etching method are preferably used. It is preferred that the material for the mask film 2 be a silicon nitride film, and that both the width $W_1$ in the Y direction and the distance $W_2$ of the mask film 2 shown in FIG. 10 be equal to minimum feature size F. The distance $W_2$ may be smaller than the minimum feature size F. The specific value of the minimum feature size F is 30 nm, for example.

After the mask film 2 is formed, the semiconductor substrate 1 is etched by means of an anisotropic dry etching method that uses the mask film 2 as a mask to form a trench (second trench) defining the active regions 3 and 7. The trench includes a trench 5a surrounding the active region 3; and a trench 5b which occupies regions of the active region 3 except the active region 7. As shown in FIG. 10, a trench 5b includes side surfaces 5c and 5d which face each other in the Y direction and a bottom surface 5e. The amount of the etching at this step is preferably so controlled that the depth $D_1$ (or depth from the surface 1a of the semiconductor substrate 1) of the trenches 5a and 5b is 160 nm.

Figure 11:
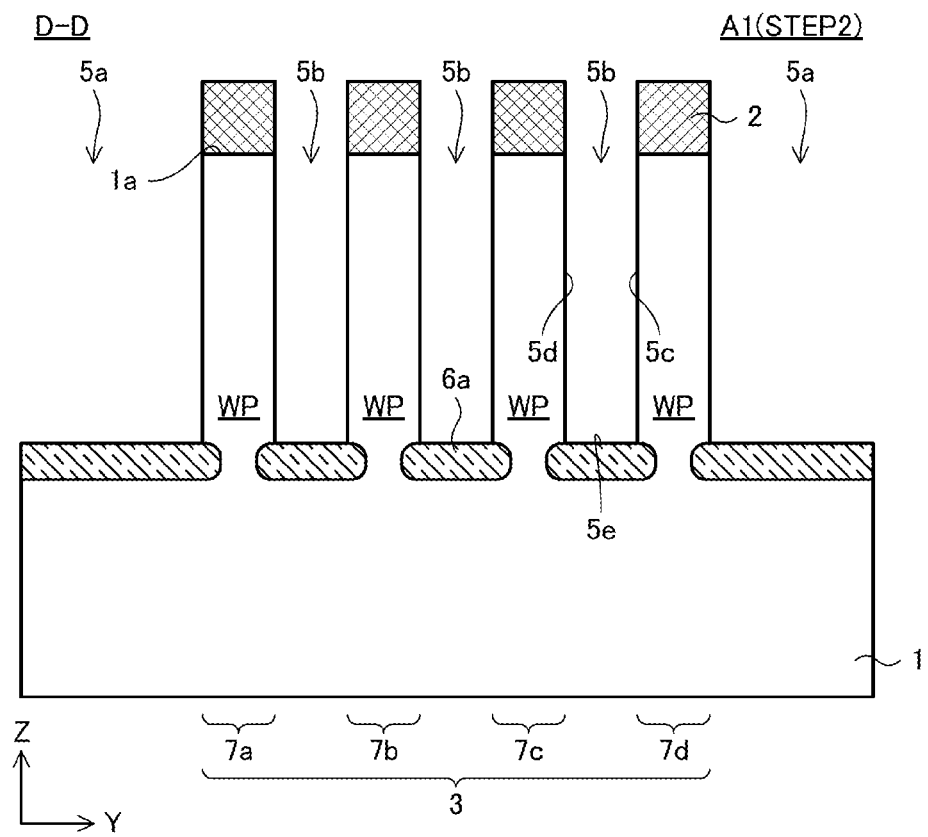
FIG. 11 is a diagram showing the semiconductor device A1 at step 2 of a manufacturing process according to the first embodiment.

Then, arsenic ions are implanted across the entire surface by means of an ion implantation method to form an ion-implanted layer 6a in a bottom surface of the trench 5a and in the bottom surface 5e of the trench 5b as shown in FIG. 11 (Step 2). The dose amount of the implantation is preferably $10^{15}$ atoms/cm$^2$. Regarding the ion implantation of this step, a method in which a sidewall insulation film with a thickness of 5 nm covering side surfaces of the trenches 5a and 5b is formed prior to the start of the ion implantation, the ion implantation is carried out in the state, and the sidewall insulation film is removed after implementation of the implantation may be employed. According to the method, it is possible to prevent unexpected ions from being implanted into the strip-shaped active region 7.

Figure 12:
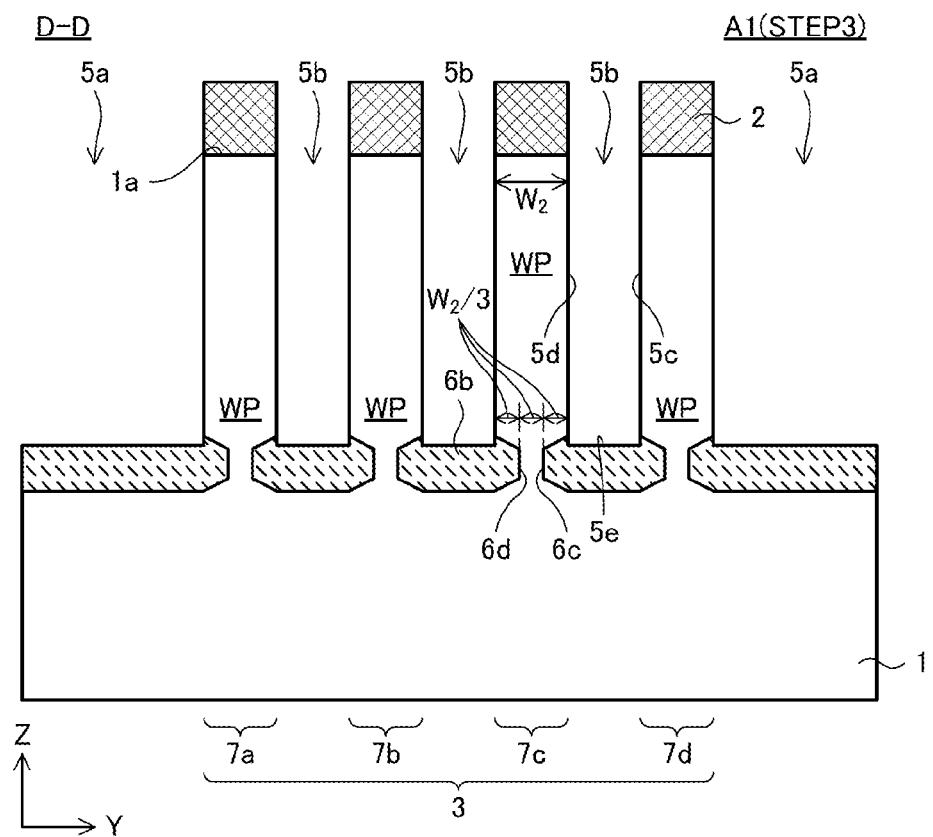
FIG. 12 is a diagram showing the semiconductor device A1 at step 3 of a manufacturing process according to the first embodiment.

Then, thermal treatment is carried out at 1,000 degrees Celsius, thereby activating ions implanted into the ion-implanted layer 6a. As a result, as shown in FIG. 12 (Step 3), a n-type impurity diffusion layer 6b is so formed as to extend from the bottom surface of the trench 5a and the bottom surface 5e of the trench 5b to the inside of the wall-like semiconductor pillar WP. At this step, the implanted ions (impurities) are diffused in such a way that the distance between one end 6c in Y direction of the impurity diffusion layer 6b and the other end 6d in Y direction of the adjacent impurity diffusion layer 6b is $W_2/3$ (10 nm). From a different perspective, the implanted ions (impurities) are diffused in such a way that the ions dig into each of the active regions 7 by $W_2/3$ (10 nm) from the side surfaces 5c and 5d of the trench 5b.

Figure 13:
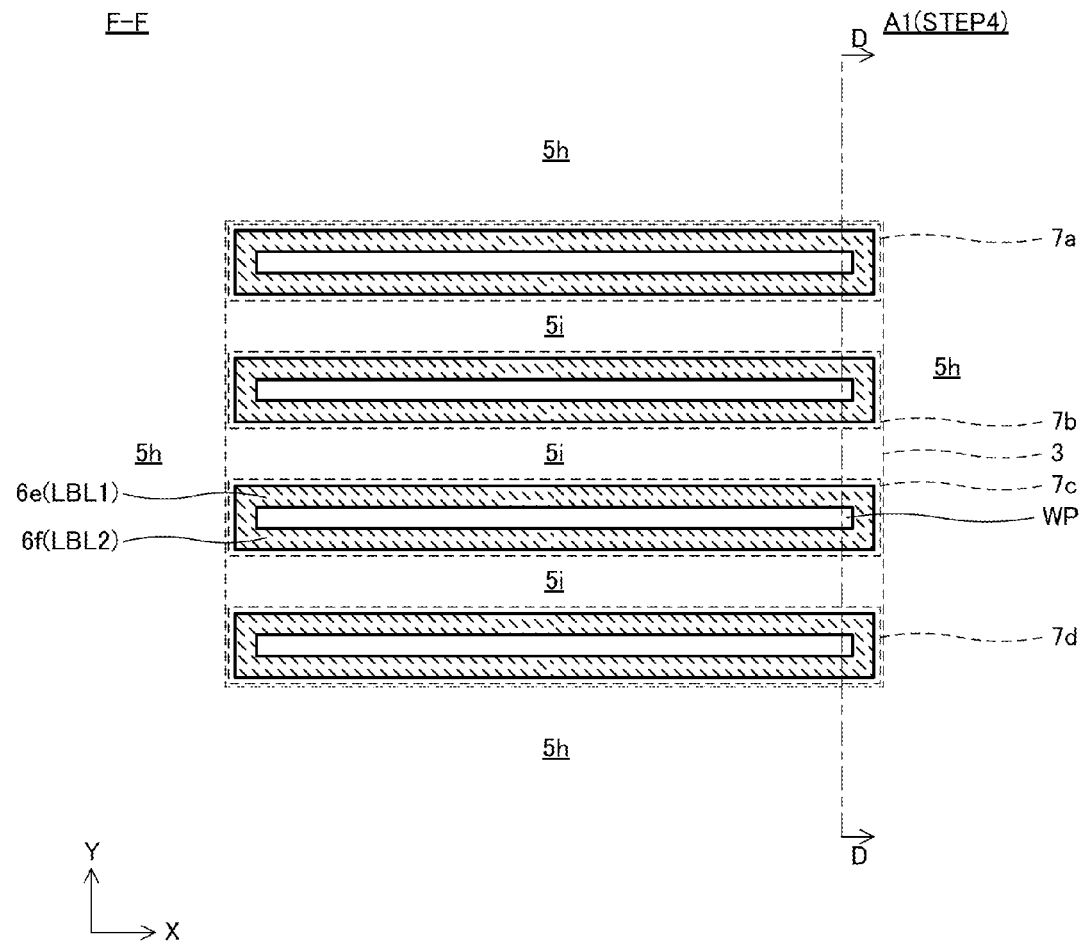
FIGS. 13 and 14 are diagrams each showing the semiconductor device A1 at step 4 of a manufacturing process according to the first embodiment.
Figure 14:
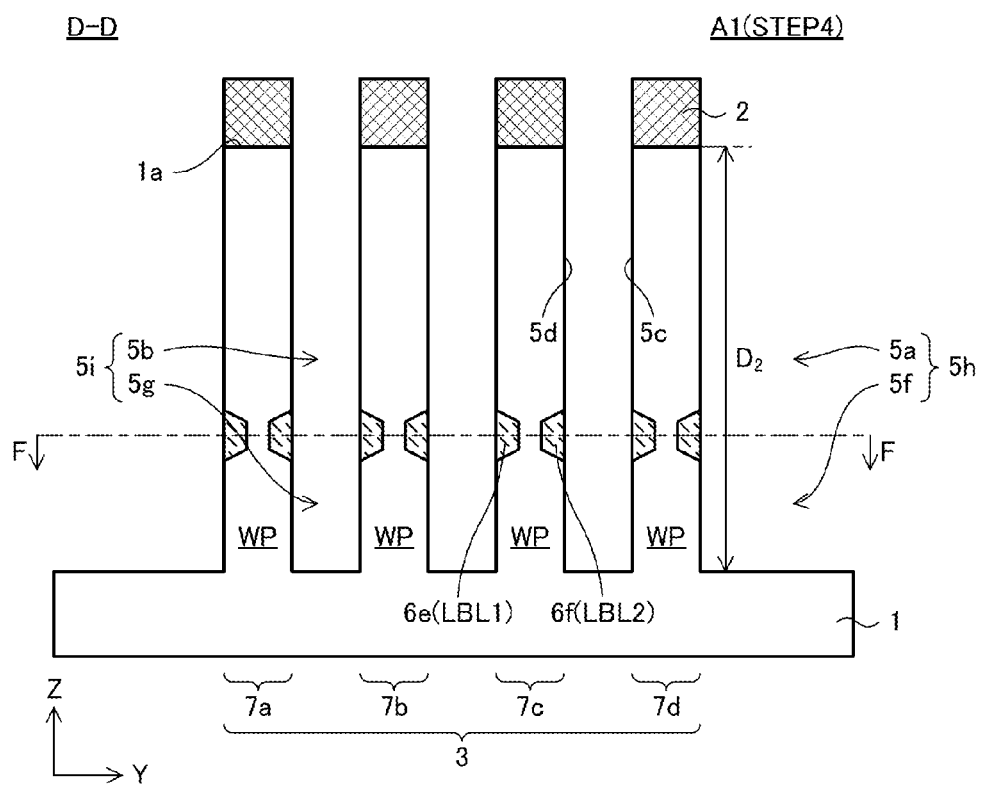

Then, the semiconductor substrate 1 is further etched by means of anisotropic dry etching that uses the mask film 2 as a mask to form a trenches 5f which extends downward and seamlessly from the trench 5a, and trench 5g which extends downward and seamlessly from the trench 5b, as shown in FIGS. 13 and 14 (Step 4). Hereinafter, a trench made up of the trenches 5a and 5f is referred to as a trench 5h. Also, a trench made up of trenches 5b and 5g is referred to as a trench 5i. In this case, the amount of the etching is preferably so controlled that the depth $D_2$ (or depth from the surface 1a of the semiconductor substrate 1) of the trenches 5h and 5i (first trenches) is 250 nm.

The anisotropic dry etching removes one portion of the impurity diffusion layer 6b shown in FIG. 12 that is formed outside the active region 7. The other portion of the impurity diffusion layer 6b that remains inside the active region 7 constitutes impurity diffusion layers 6e and 6f which will become the above-described sub diffusion layers LBL1 and LBL2, respectively. As shown in FIG. 13, the impurity diffusion layers 6e and 6f thus formed are connected each other at both ends in a longitudinal direction of the active region 7.

Figure 15:
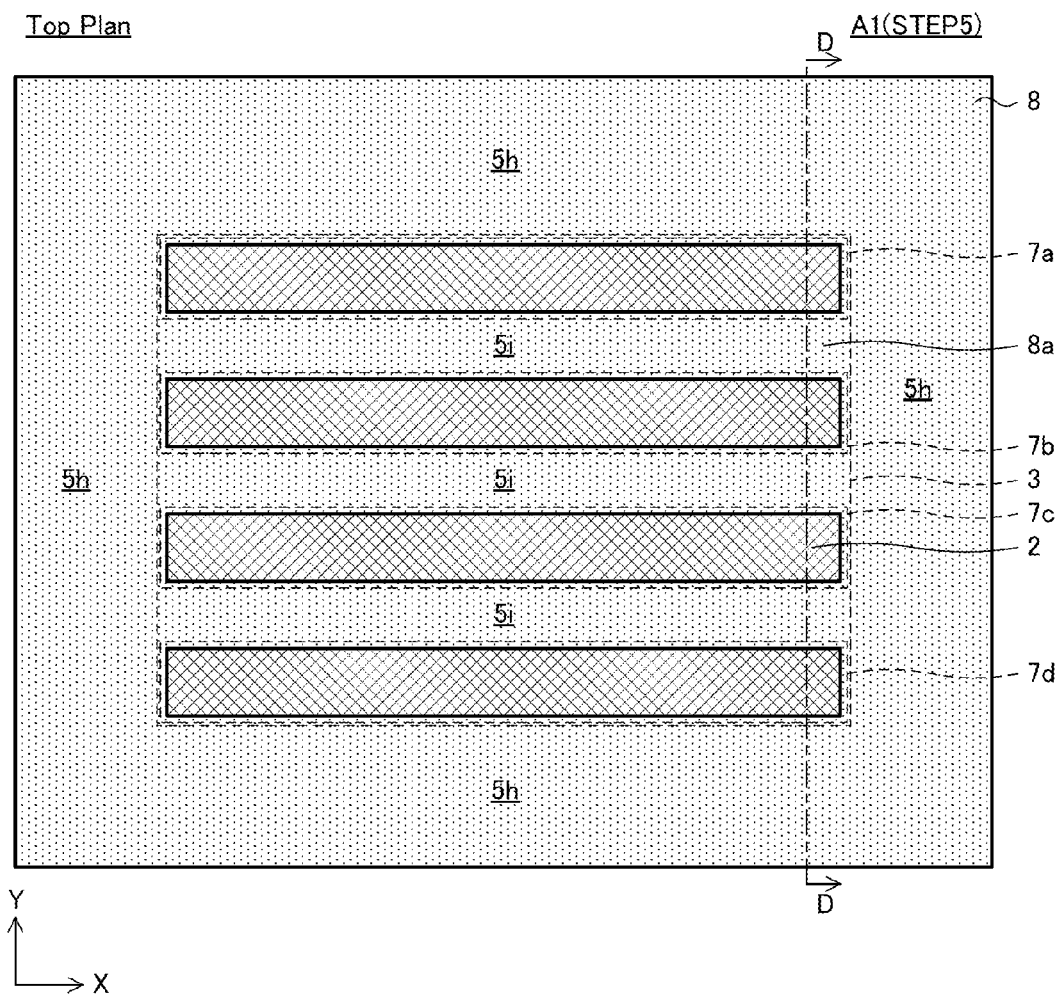
FIGS. 15 and 16 are diagrams each showing the semiconductor device A1 at step 6 of a manufacturing process according to the first embodiment.
Figure 16:
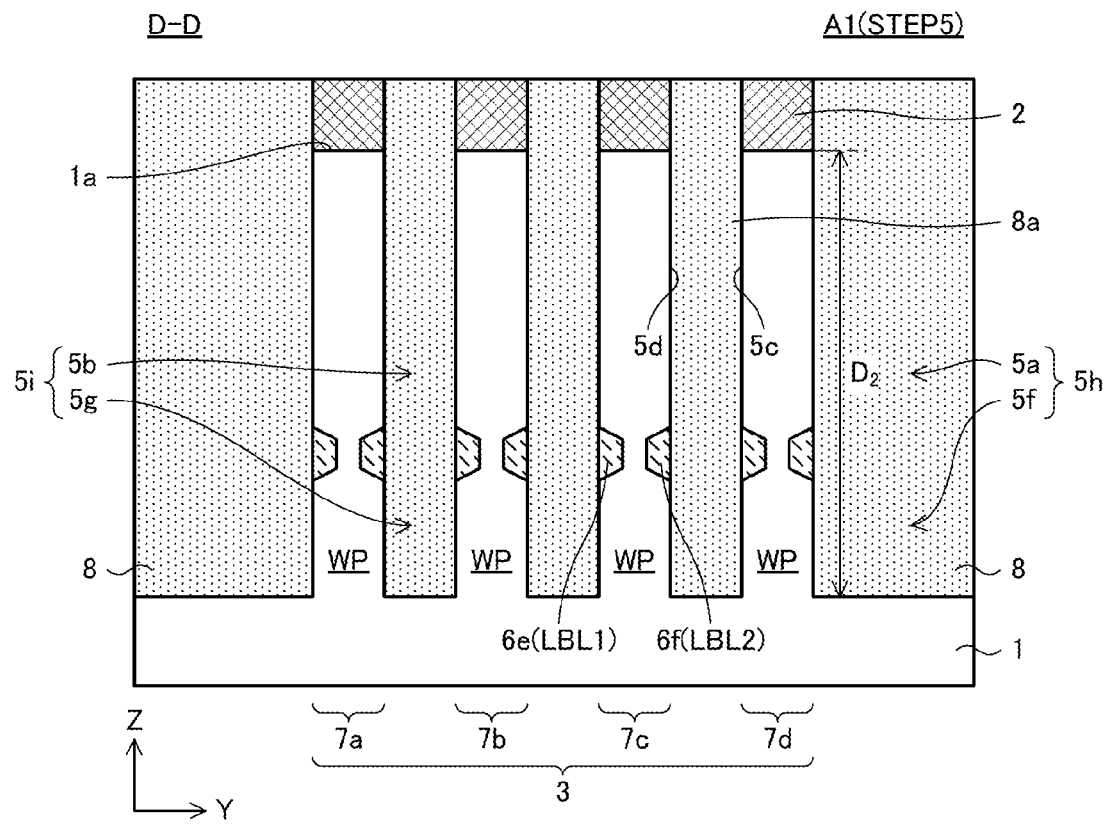
Figure 17:
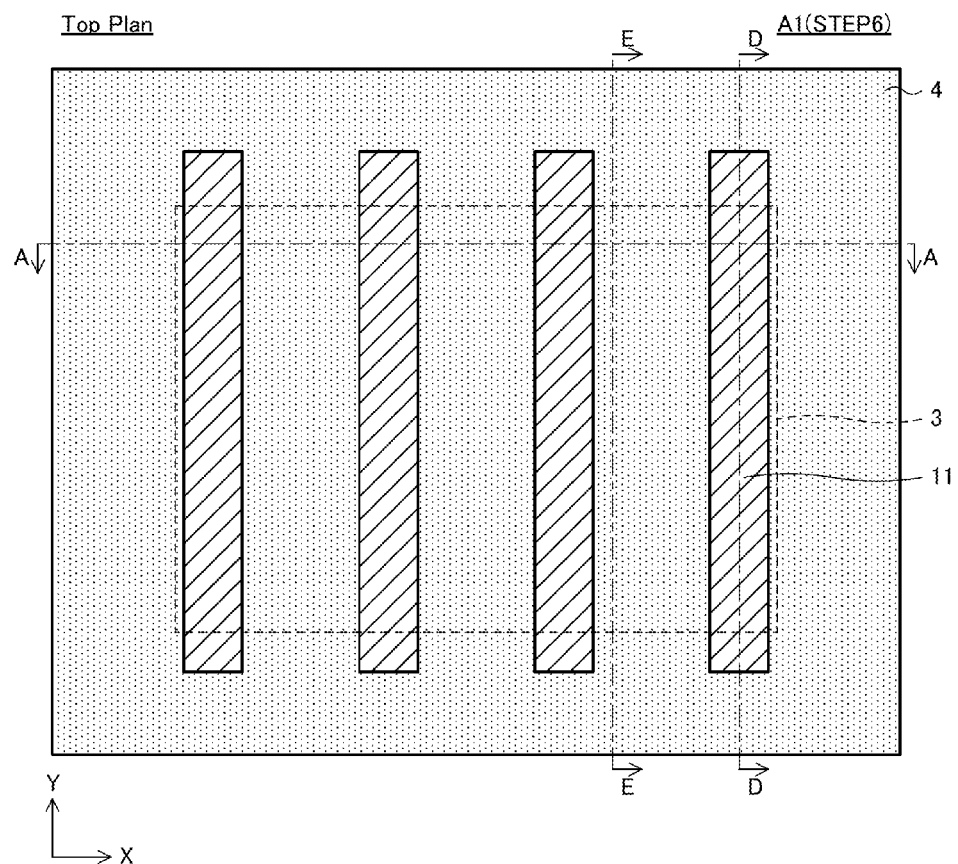
FIGS. 17 to 20 are diagrams each showing the semiconductor device A1 at step 6 of a manufacturing process according to the first embodiment.

Then, a silicon oxide film (first insulation film) is embedded inside trenches 5h and 5i by forming a silicon oxide film across the entire surface and flattening an upper surface of the silicon oxide film. Accordingly, as shown in FIGS. 15 and 16 (Step 5), an element isolation region 8 which fills the trench 5h, and an element isolation region 8a which fills the trench 5i, are formed. Incidentally, at this step, the flattening is carried out with the use of a CMP (Chemical Mechanical Polishing) method in such a way that each of upper surfaces of the element isolation regions 8 and 8a is equal in height to an upper surface of the mask film 2, and that all the upper surfaces are located 50 nm high from the surface 1a of the semiconductor substrate 1.

Then, as shown in FIGS. 17 to 20 (Step 6), a laminated film (second insulation film) which is made by sequentially stacking a first hard mask film 9 made from an amorphous carbon film with a thickness of 100 nm, and a second hard mask film 4 made from a silicon oxide film with a thickness of 5 nm or the like is formed across the entire surface. Incidentally, an amorphous silicon film may also be used for the first hard mask film 9. After that, a core pattern 11 (third insulation film) extending in the Y direction in such a way as to cross the active region 3 and made from an organic film with a thickness of 50 nm is formed by means of lithography and a dry etching method. The core pattern 11 includes a plurality of portions each of which extends in the Y direction. Each of the portions is formed in a region that overlaps with a semiconductor pillar P shown in FIG. 2. The width $W_3$ in the X direction of the core pattern 11 is minimum feature size F (30 nm) and the interval $W_4$ of the core pattern 11 is 2F (60 nm). Both ends in the Y direction of the core pattern 11 are disposed on an element isolation region 8. Portions of the core pattern 11 that are located at both ends in the X direction are so disposed that the planar positions of exterior side surfaces thereof are aligned with both ends in the X direction of the active region 3.

Figure 21:
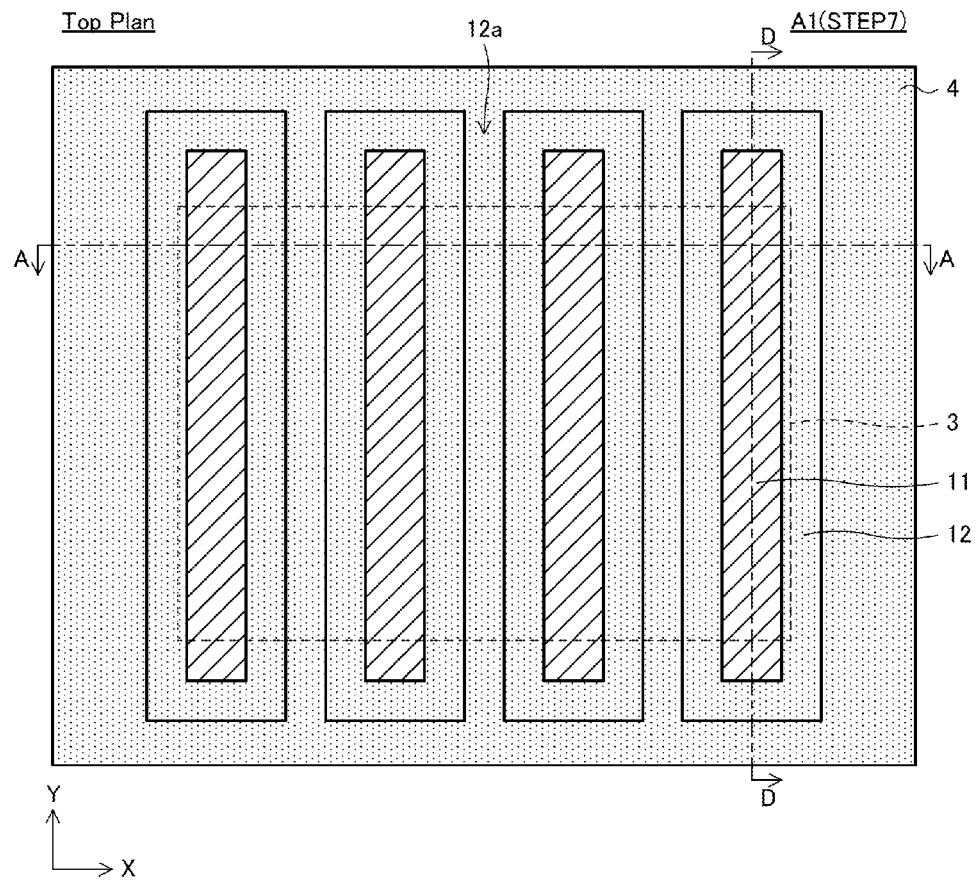
FIGS. 21 to 23 are diagrams each showing the semiconductor device A1 at step 7 of a manufacturing process according to the first embodiment.
Figure 22:
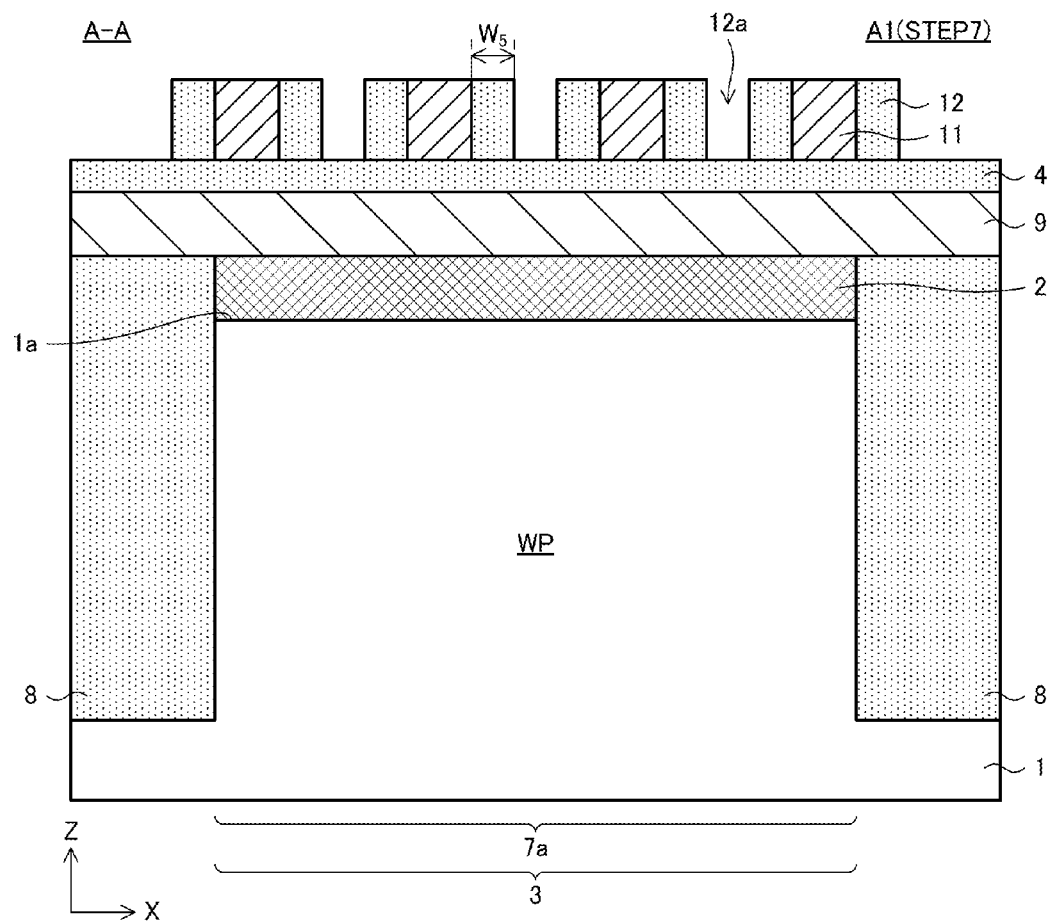
Figure 23:
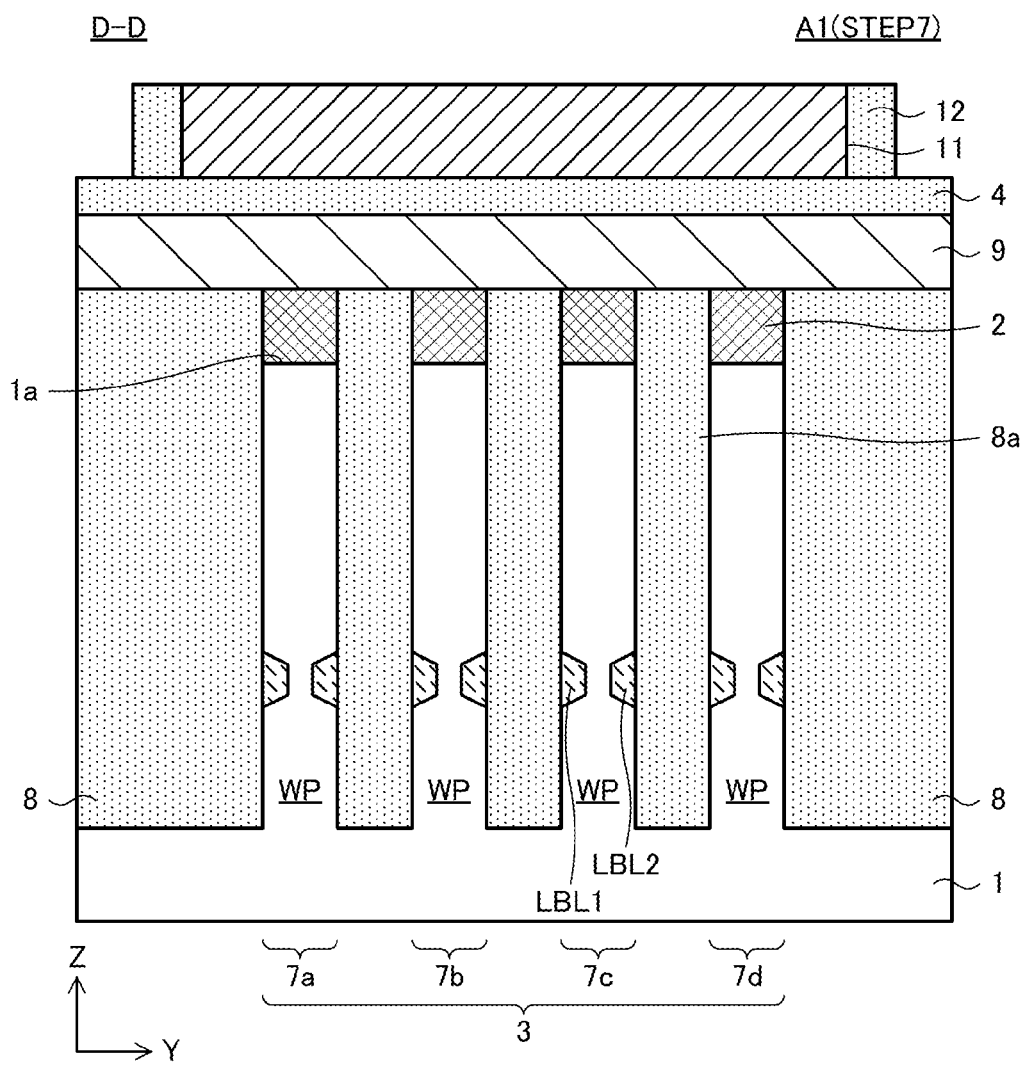

Then, as shown in FIGS. 21 to 23 (Step 7), a sacrificial layer pattern 12 is formed on a side surface of the core pattern 11 by means of forming a silicon oxide film with a thickness of 2F/3 (=20 nm) across the entire surface and then performing anisotropic dry etching with fluorine containing plasma to carry out an etch back of the silicon oxide film. The sacrificial layer pattern 12 becomes a sidewall film (first sidewall film) which is formed on a side surface of the core pattern 11. It is preferred that a low-temperature grown silicon oxide film (referred to as "LTSiO film", hereinafter) is used as a material of the sacrificial layer pattern 12, and the formation of the LTSiO film is carried out at 100 degrees Celsius or less, a temperature that does not cause damage to the core pattern 11 that serves as an underlying organic film. As shown in FIG. 21, the sacrificial layer pattern 12 is so formed as to surround the core pattern 11, and the film thickness $W_5$ in the horizontal direction thereof is 2F/3. Between the sacrificial layer patterns 12 that are formed for the adjacent core patterns 11, a concave section 12a is formed to expose the second hard mask film 4 at a bottom surface.

Figure 24:
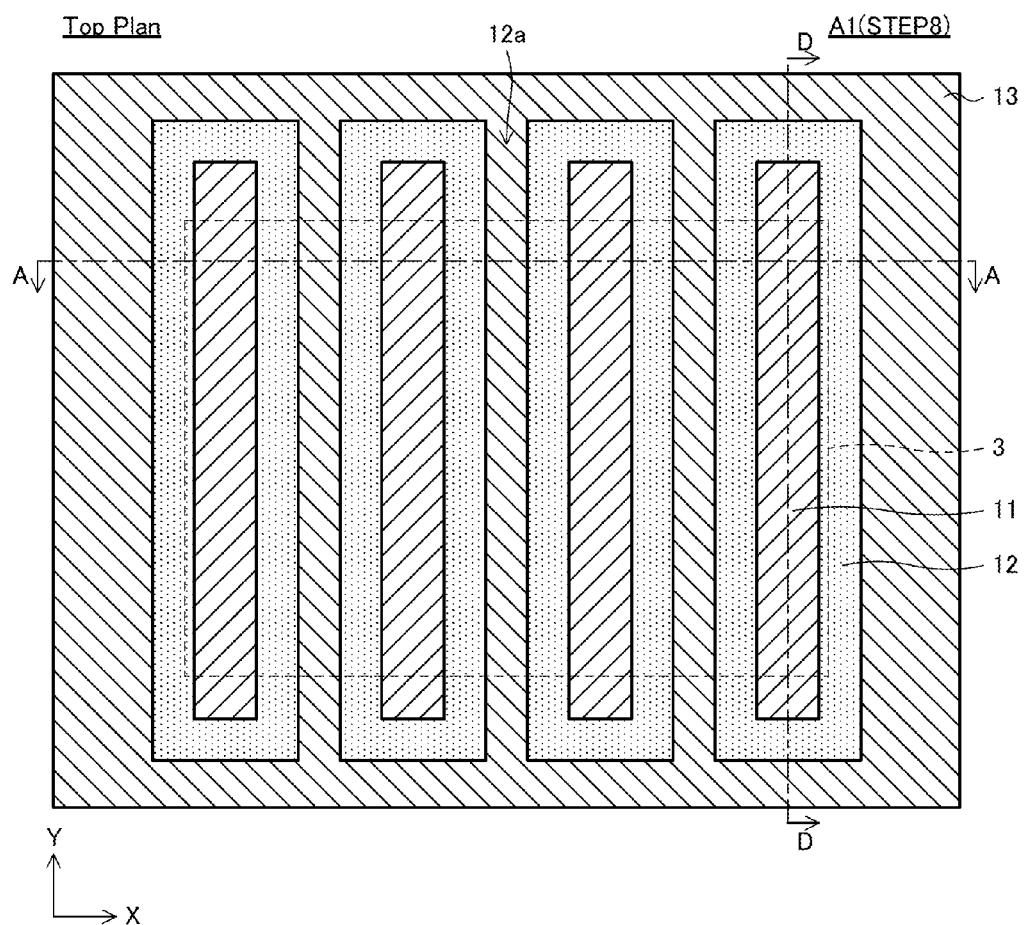
FIGS. 24 to 26 are diagrams each showing the semiconductor device A1 at step 8 of a manufacturing process according to the first embodiment.
Figure 25:
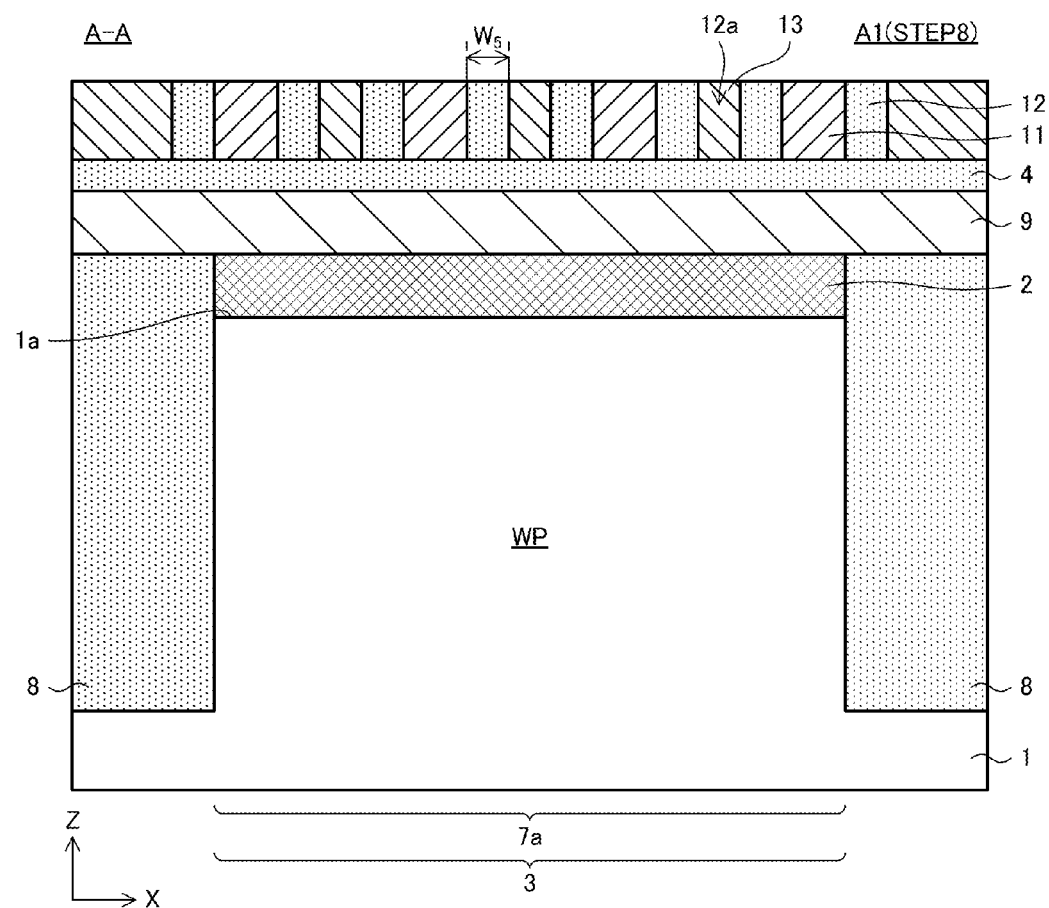
Figure 26:
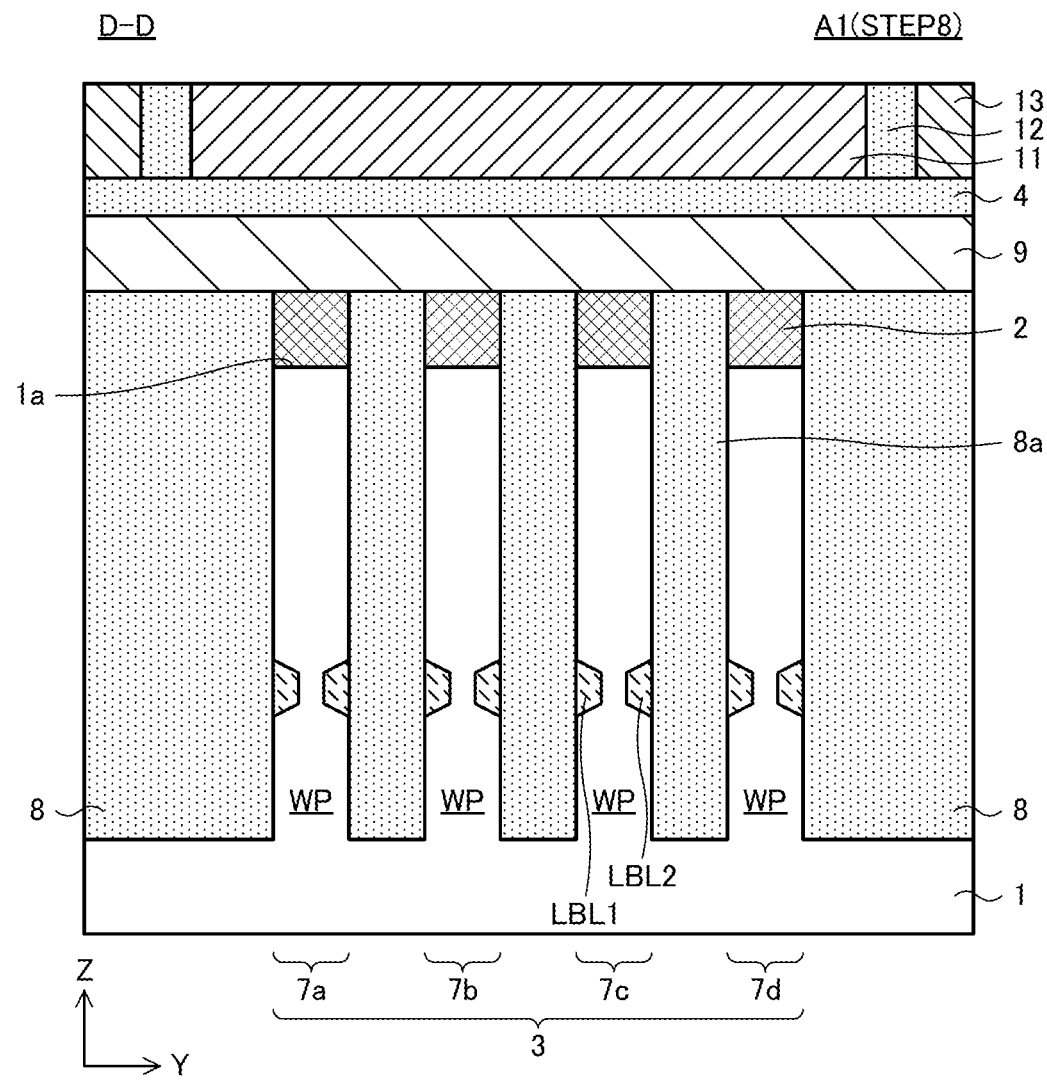

After a sacrificial layer pattern 12 is formed, an organic film having a thickness enough to fill a concave section 12a is formed by a spin coating method across the entire surface and a surface of the organic film is flattened. As a result, as shown in FIGS. 24 to 26 (Step 8), an organic film 13 (fourth insulation film) is so formed as to fill a concave section 12a.

Figure 27:
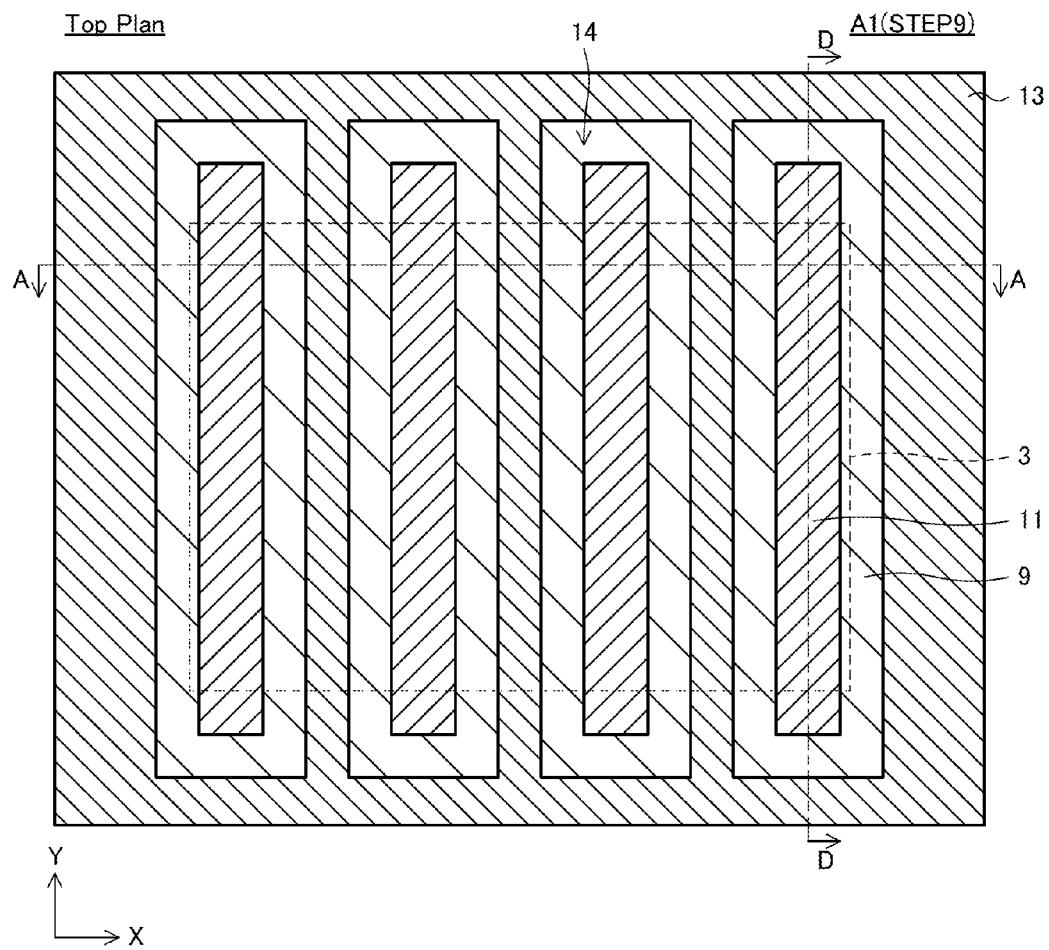
FIGS. 27 to 29 are diagrams each showing the semiconductor device A1 at step 9 of a manufacturing process according to the first embodiment.
Figure 28:
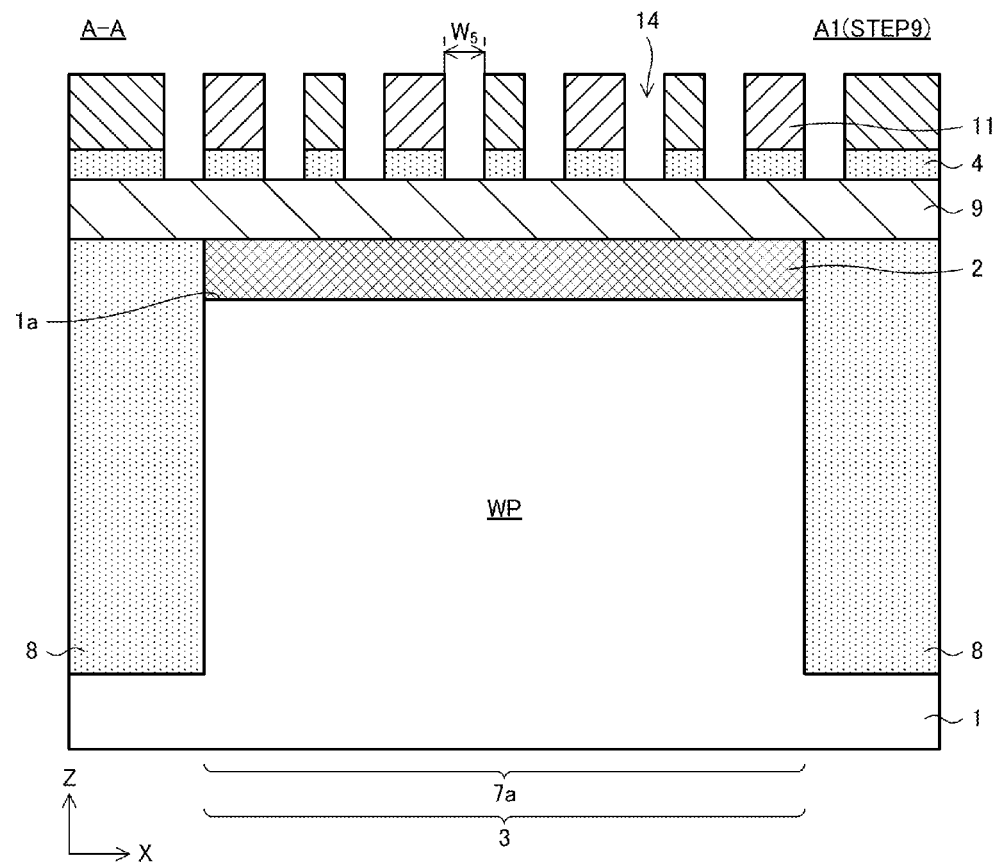
Figure 29:
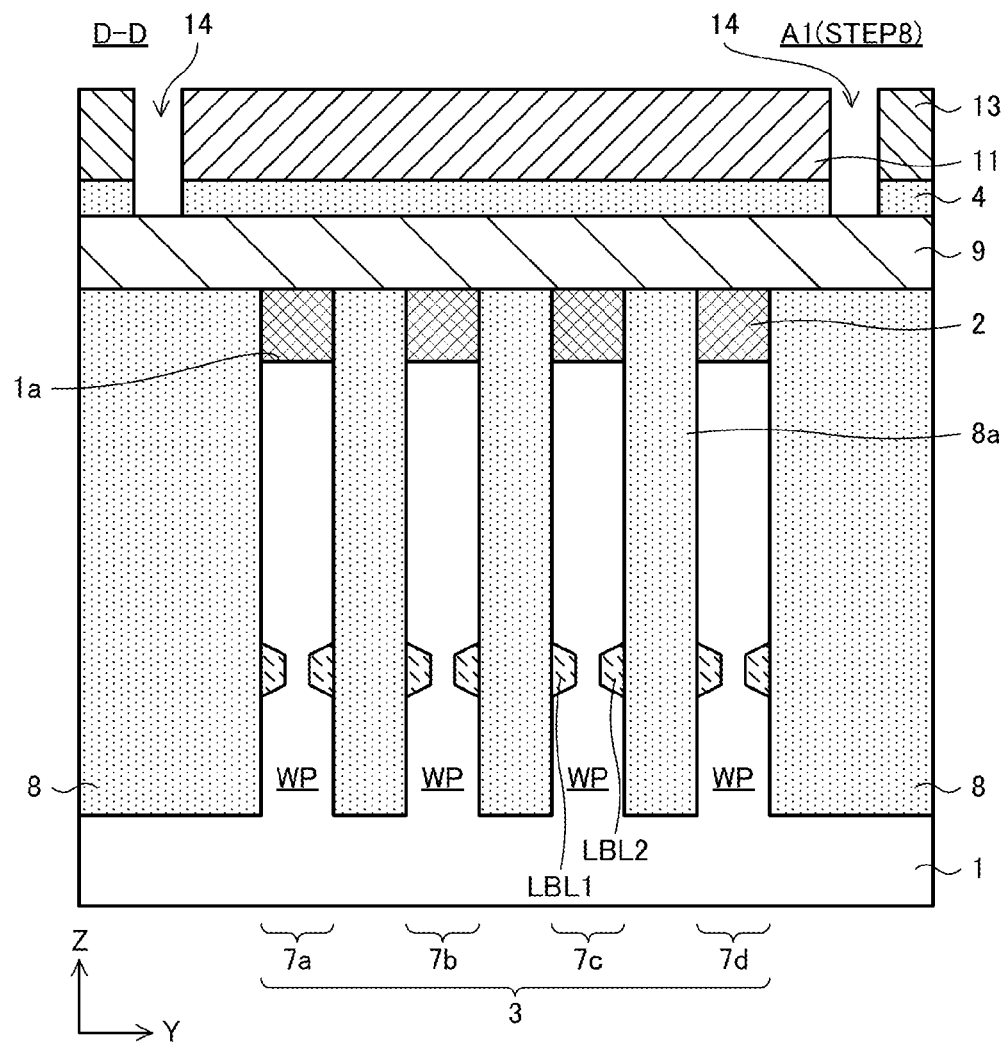

Then, a silicon oxide film exposed from an upper surface is selectively removed by means of anisotropic dry etching using fluorine-containing plasma. As a result, as shown in FIGS. 27 to 29 (Step 9), a sacrificial layer pattern 12 and a second hard mask film 4 located immediately below the sacrificial layer pattern 12 are removed and an opening 14 is formed around a core pattern 11. From a bottom surface of the opening 14, an upper surface of the first hard mask film 9 made from an amorphous carbon film is exposed.

Figure 30:
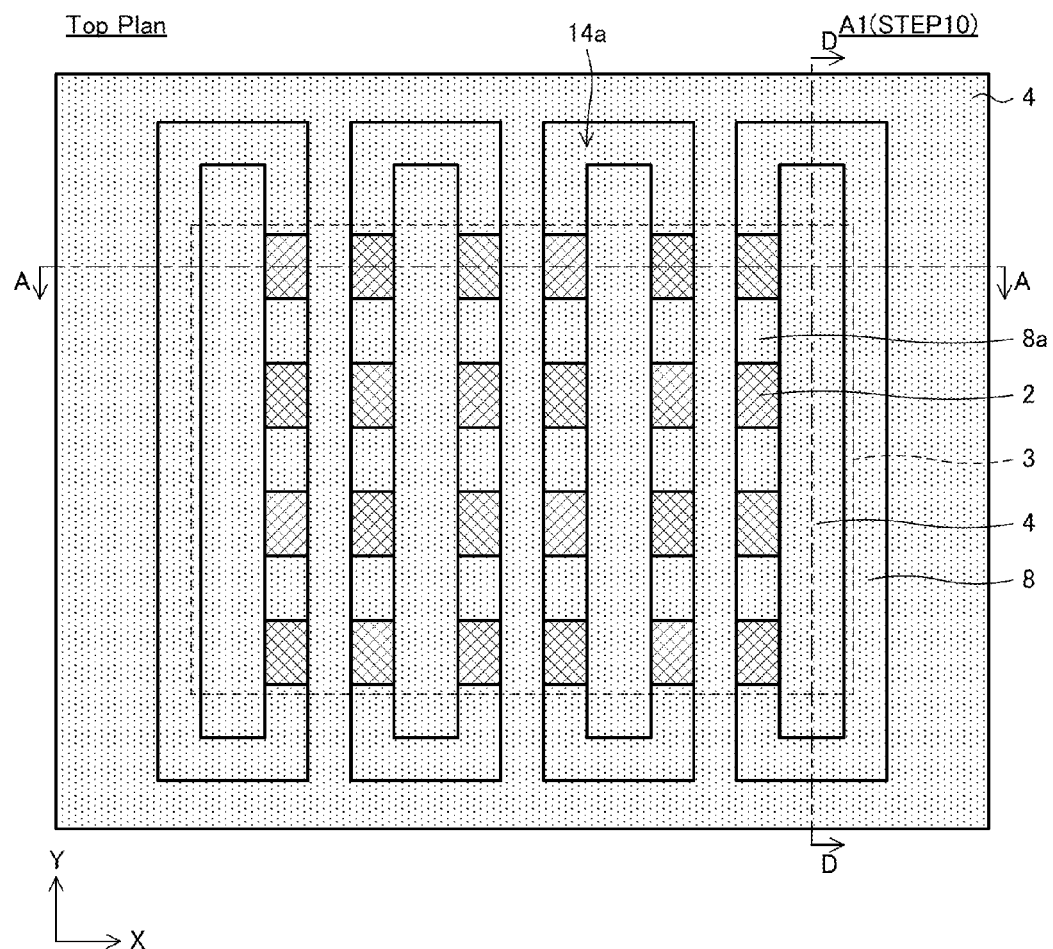
FIGS. 30 to 32 are diagrams each showing the semiconductor device A1 at step 10 of a manufacturing process according to the first embodiment.
Figure 31:
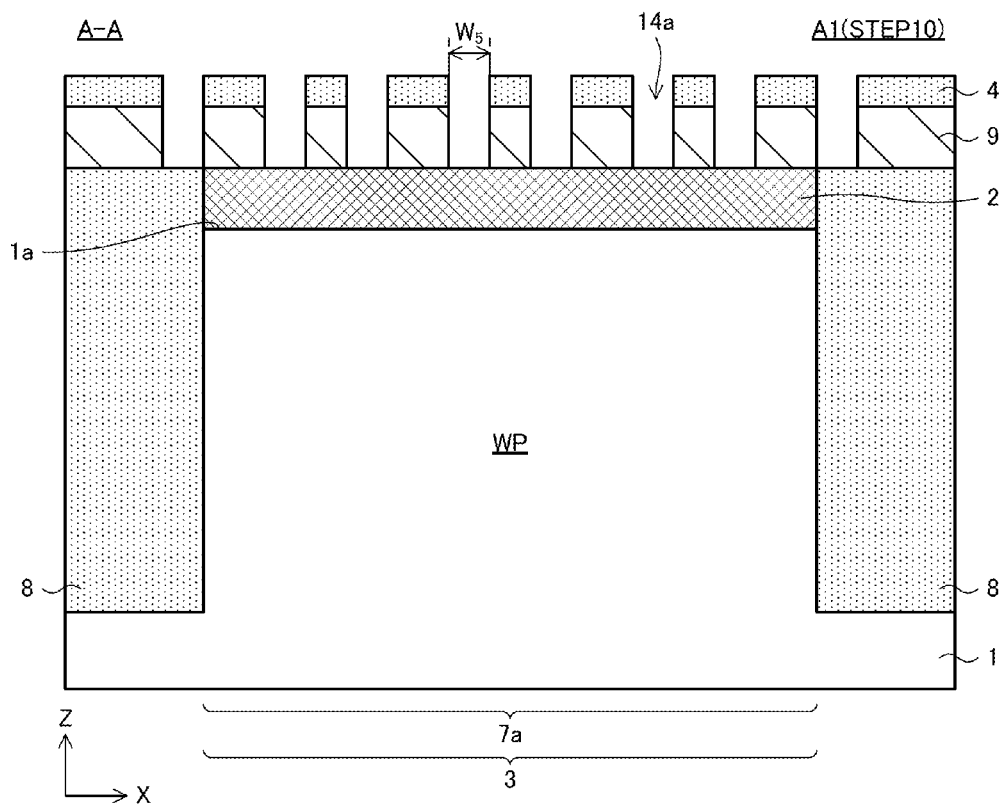
Figure 32:
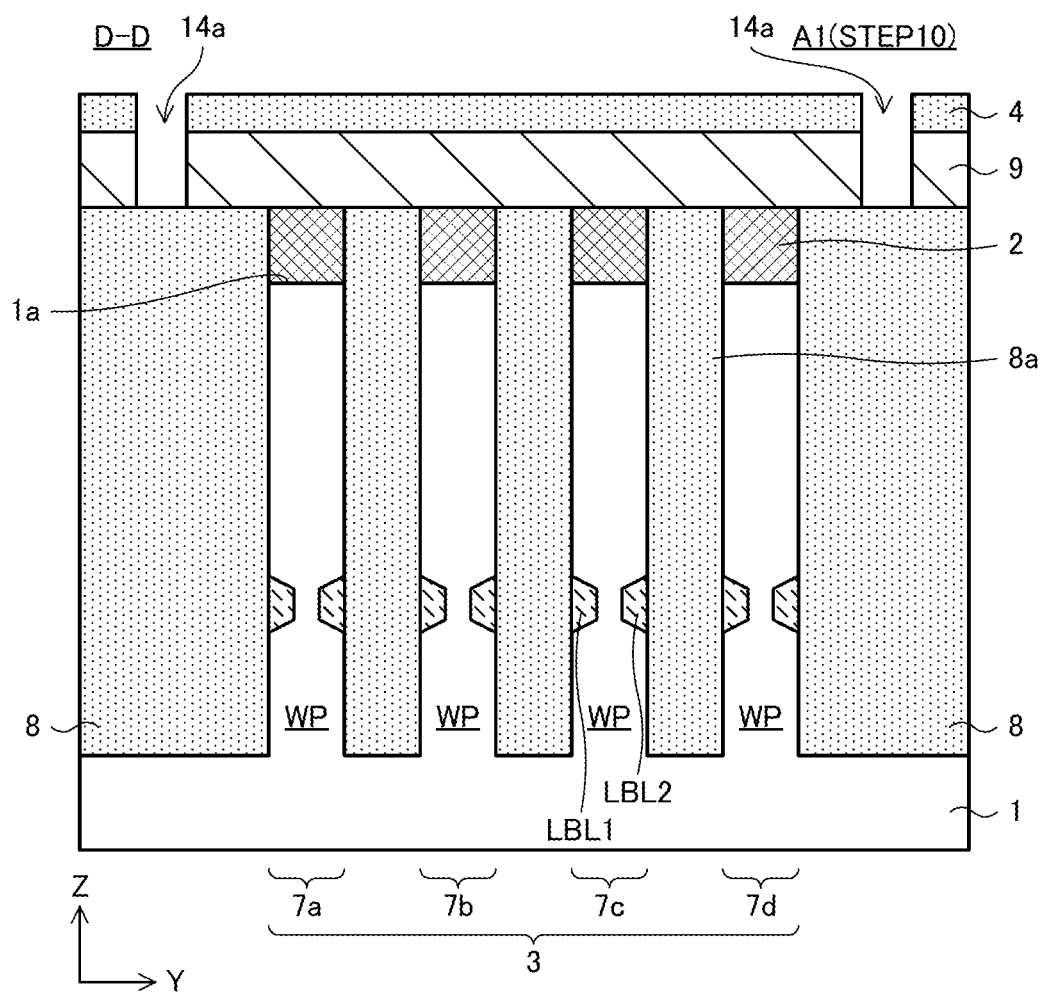
Figure 33:
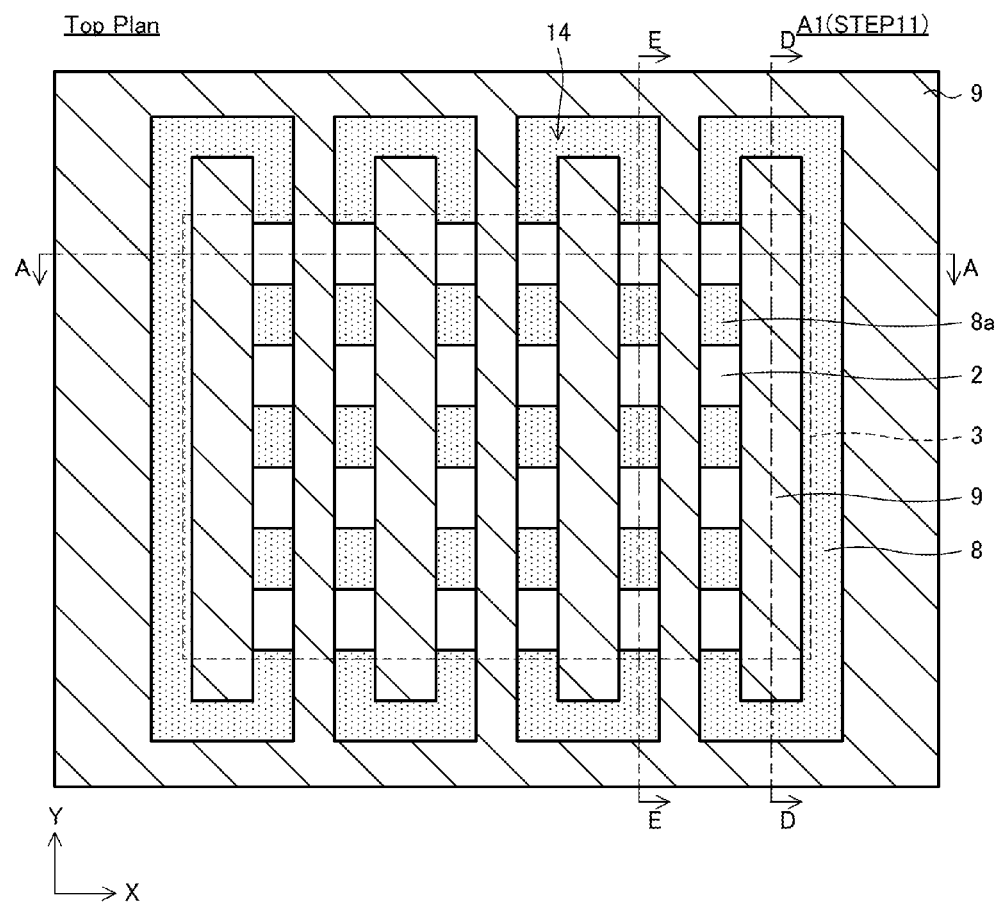
FIGS. 33 to 36 are diagrams each showing the semiconductor device A1 at step 11 of a manufacturing process according to the first embodiment.

Then, the first hard mask film 9 that is exposed from a bottom surface of the opening 14 is selectively removed by means of anisotropic dry etching with oxygen containing plasma. As a result, a pattern of the opening 14 (or a pattern formed by a core pattern 11 and an organic film 13) is transferred to the first hard mask film 9 and a new opening 14a is formed as shown in FIGS. 30 to 32 (Step 10). Incidentally, as shown in the diagrams, the etching also removes the core pattern 11 and organic film 13 which are organic films. On the other hand, the second hard mask film 4 which is a silicon oxide film remains unremoved. From a bottom surface of the opening 14a, as shown in FIG. 30, each of upper surfaces of the mask film 2 and element isolation regions 8 and 8a is exposed.

Then, gate trenches 60A in which the above-described gate electrodes 16a to 16d are embedded are formed as shown in FIGS. 33 to 36 (Step 11) by means of two-stage anisotropic dry etching. More specifically, first, anisotropic dry etching with fluorine-containing plasma is performed to selectively remove the mask film 2 which is a silicon nitride film and the element isolation regions 8 and 8a which are silicon oxide films. As a result, portions of the mask film 2 and element isolation regions 8 and 8a that are exposed from bottom surfaces of the openings 14a are removed. The amount of the etching is preferably so controlled that the depth $D_3$ (or depth from the surface 1a of the semiconductor substrate 1) of a trench formed by etching of the element isolation regions 8 and 8a is 150 nm. However, since the semiconductor substrate 1 is not removed by the etching, etching of a portion where the mask film 2 is formed stops at an upper surface 1a of the semiconductor substrate 1.

Figure 34:
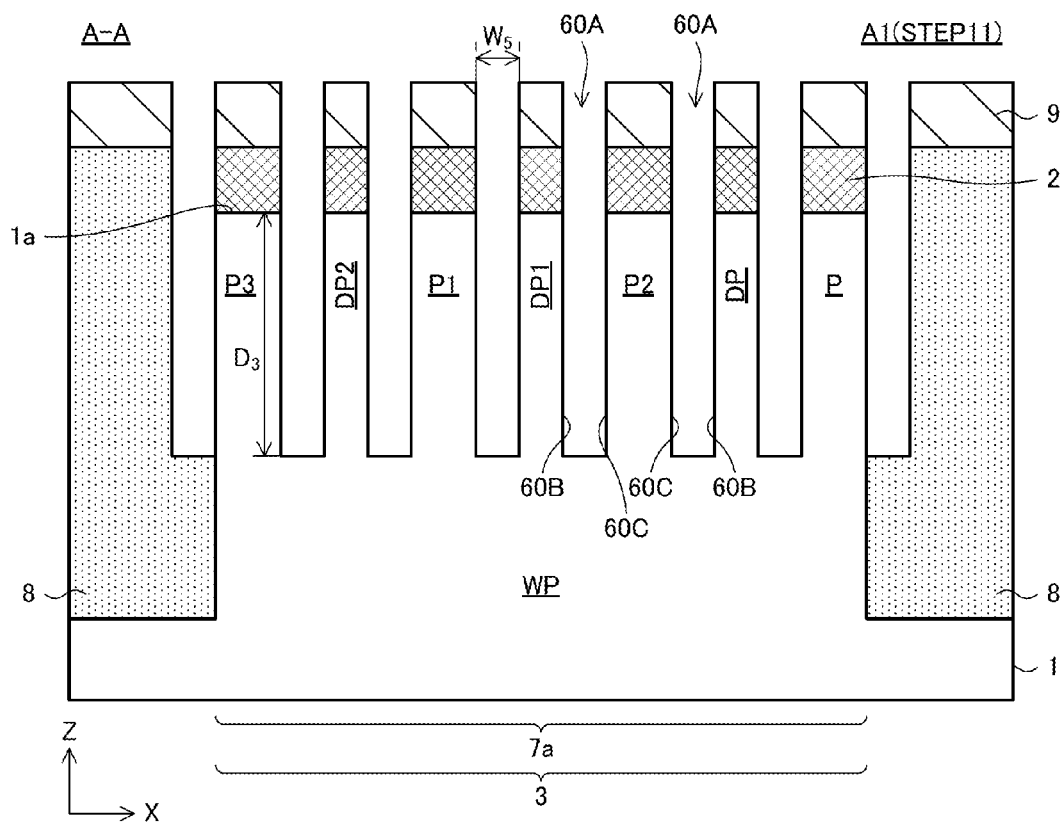
Figure 35:
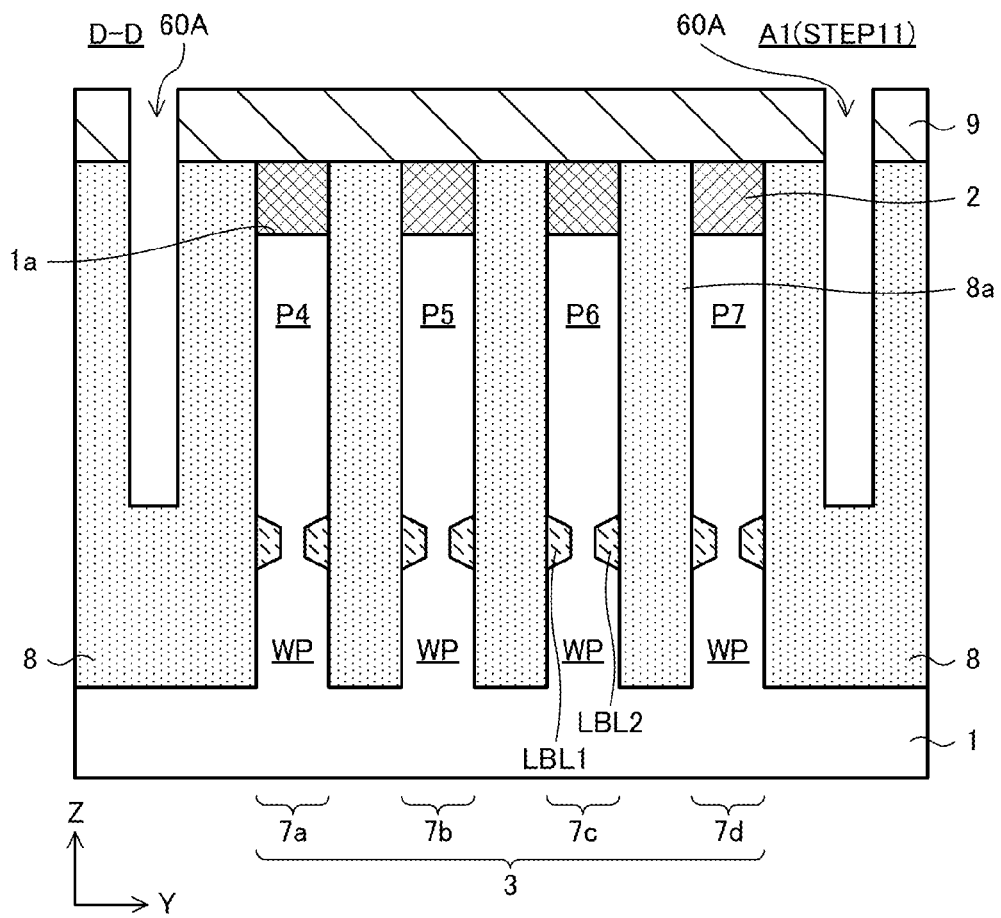
Figure 36:
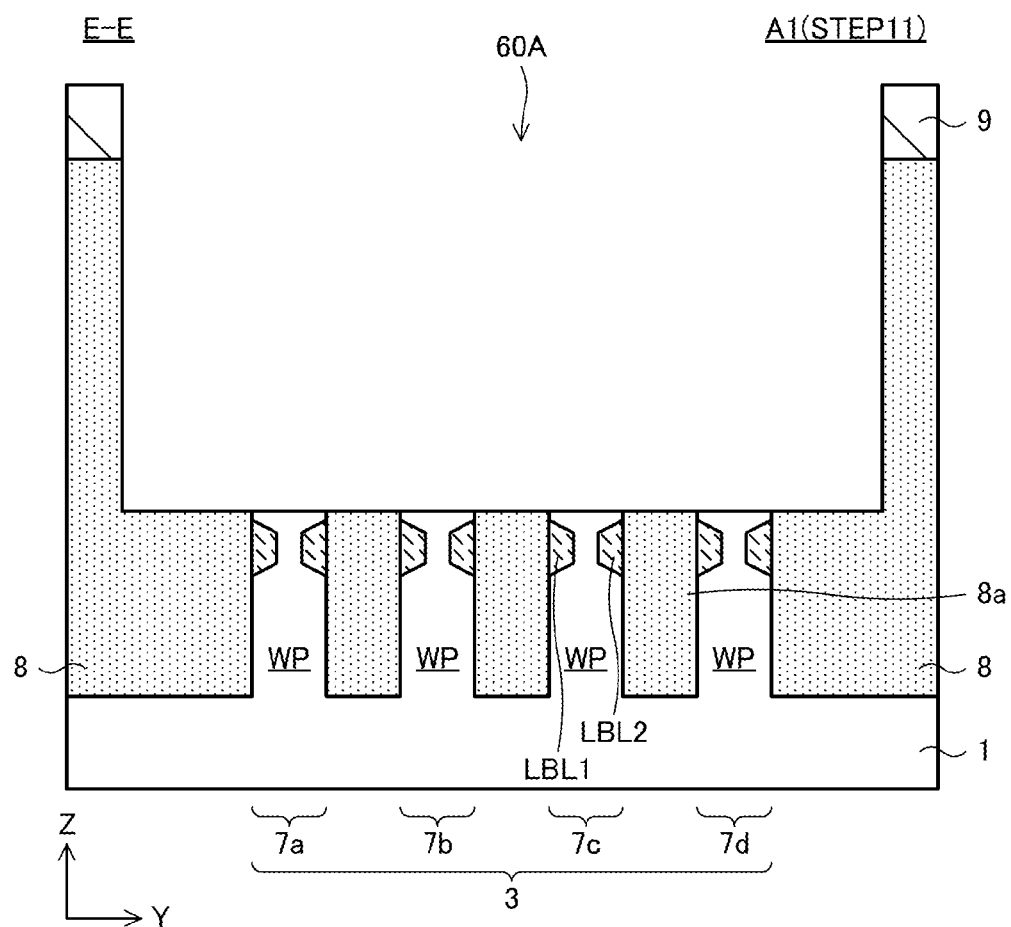

Then, anisotropic dry etching with gas plasma containing hydrogen bromide (HBr) and chlorine ($CL_2$) is performed to carry out etching of an exposed surface of the semiconductor substrate 1. The amount of the etching is preferably so controlled that a bottom surface of the etched semiconductor substrate 1 is flush with bottom surfaces of the element isolation regions 8 and 8a. As a result, the gate trenches 60A with a depth of 150 nm, in which the gate electrodes 16a to 16d are embedded, are completed. As shown in FIG. 34, the completed gate trenches 60A have an outer periphery surface 60B and an inner periphery surface 60C. Along with the completion of the gate trenches 60A, each of the above-described semiconductor pillars P and dummy pillars DP is formed below the first hard mask film 9.

Incidentally, the formation of the gate trenches 60A may be performed by removing the first hard mask film 9 made from an amorphous carbon film after performing the first-stage anisotropic dry etching, and then performing an anisotropic dry etching of the semiconductor substrate 1 by using the mask film 2 as a mask.

Figure 37:
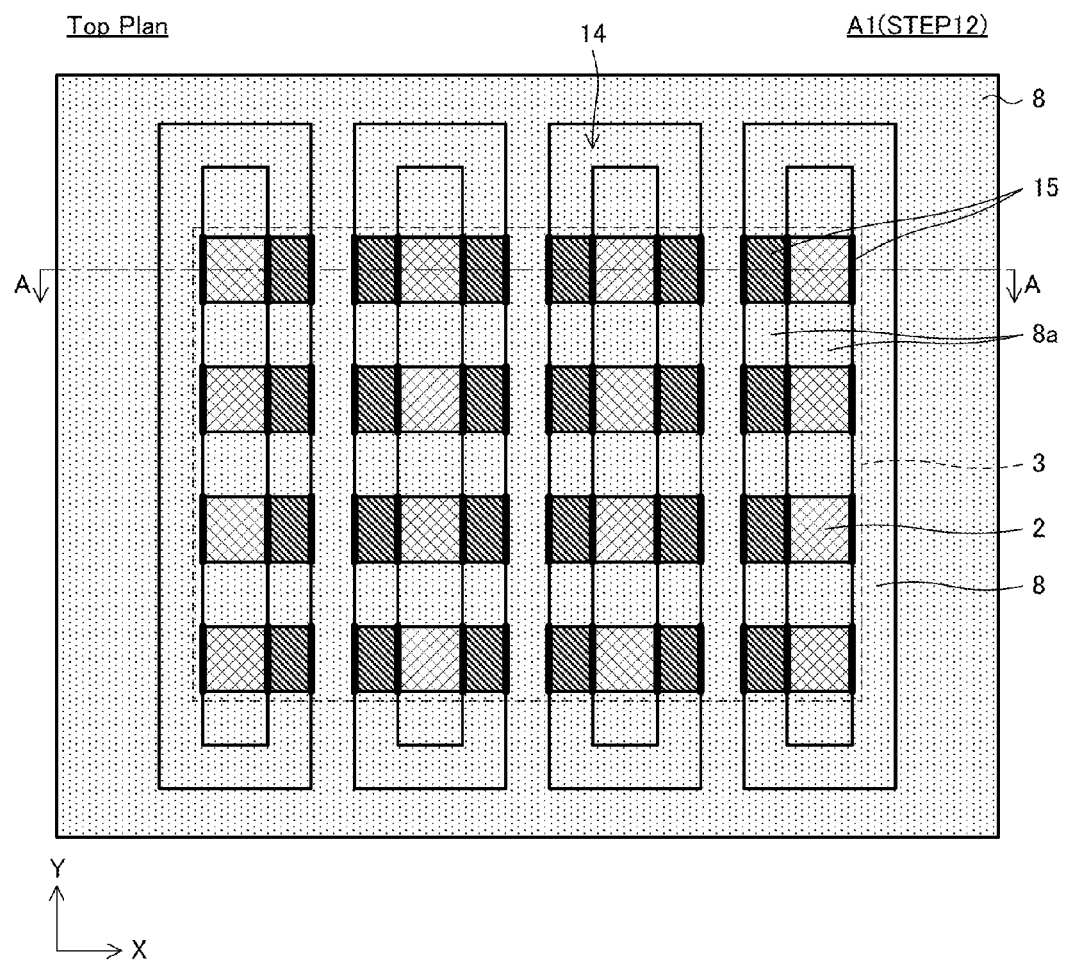
FIGS. 37 and 38 are diagrams each showing the semiconductor device A1 at step 12 of a manufacturing process according to the first embodiment.
Figure 38:
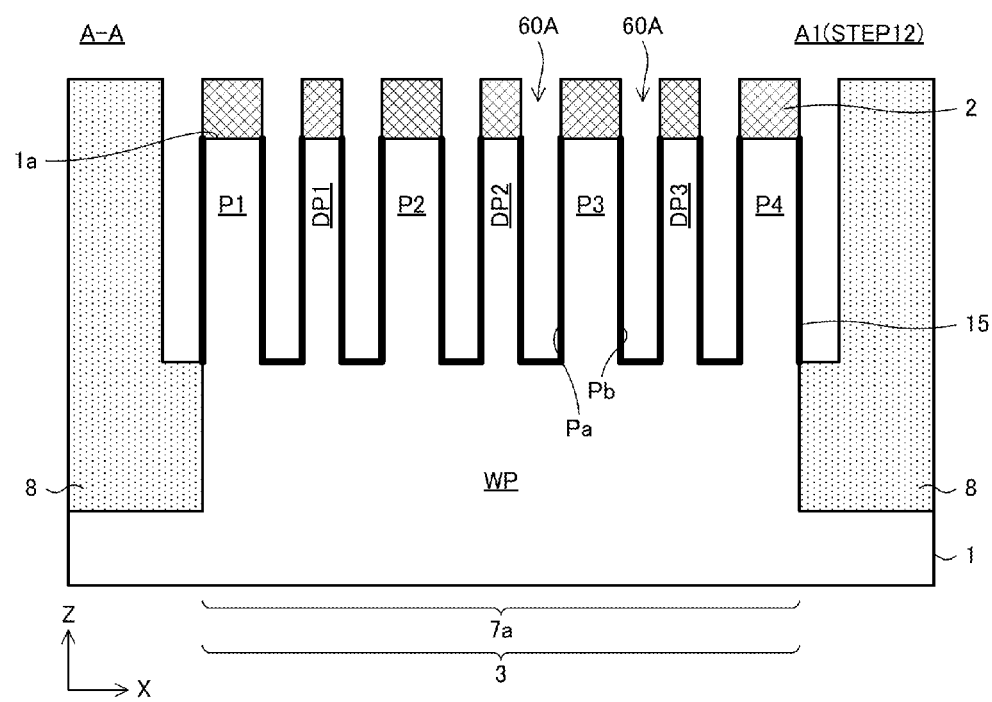
Figure 39:
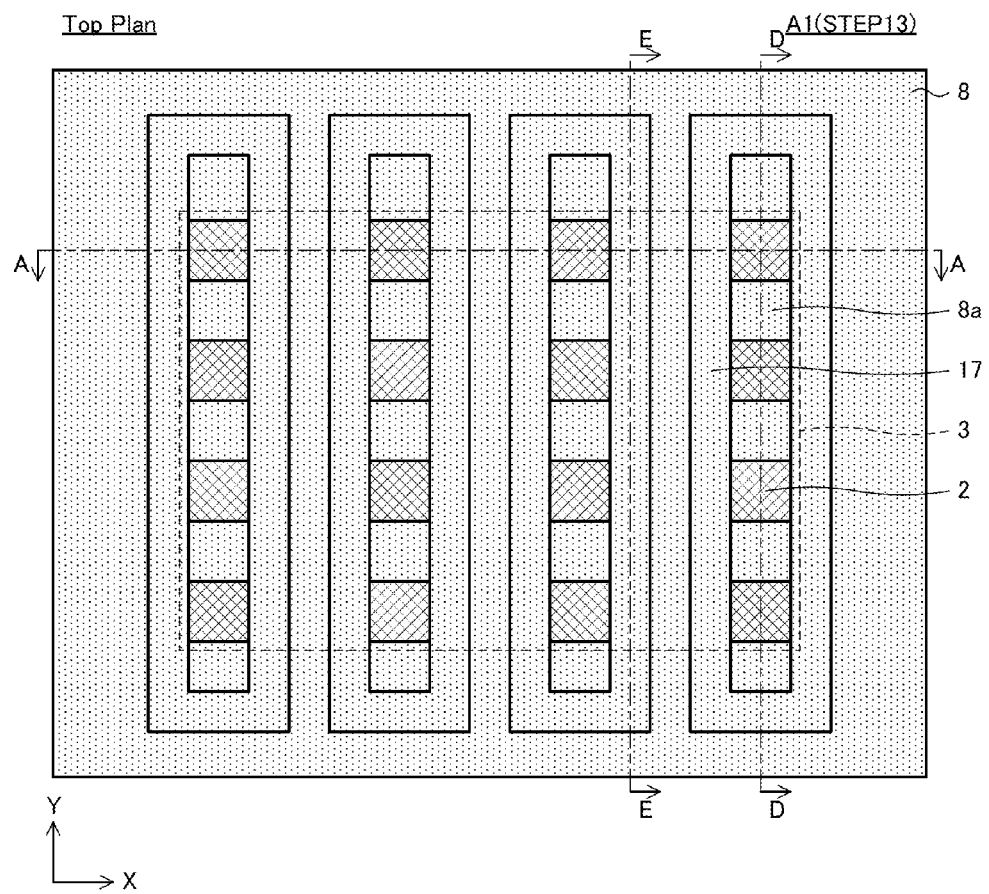
FIGS. 39 to 42 are diagrams each showing the semiconductor device A1 at step 13 of a manufacturing process according to the first embodiment.
Figure 40:
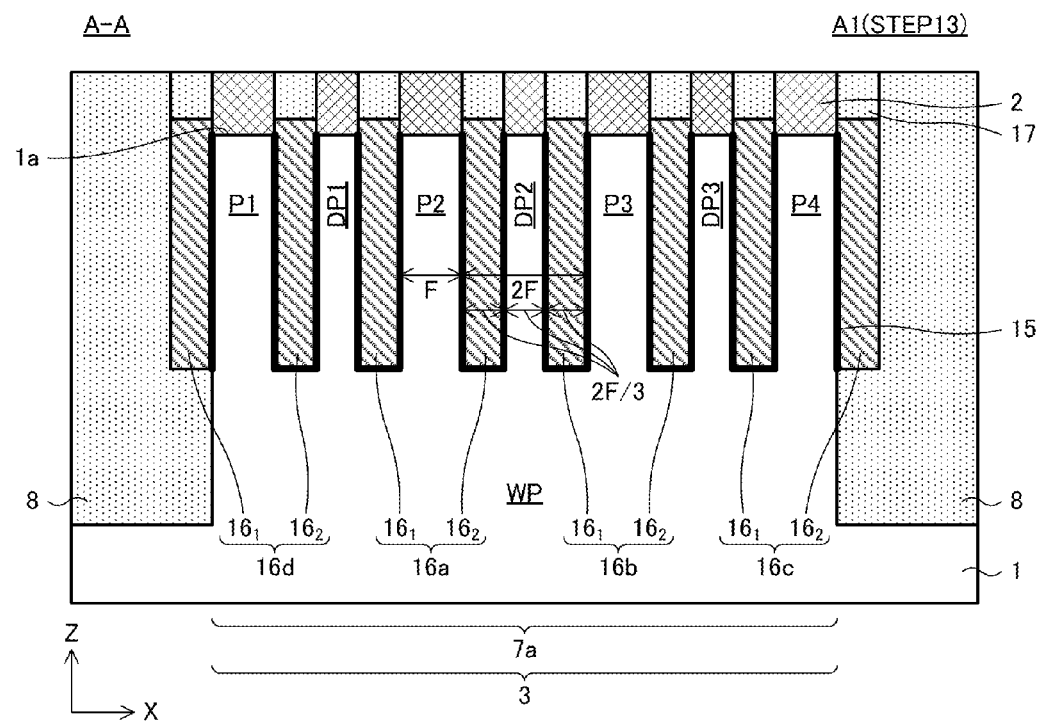
Figure 41:
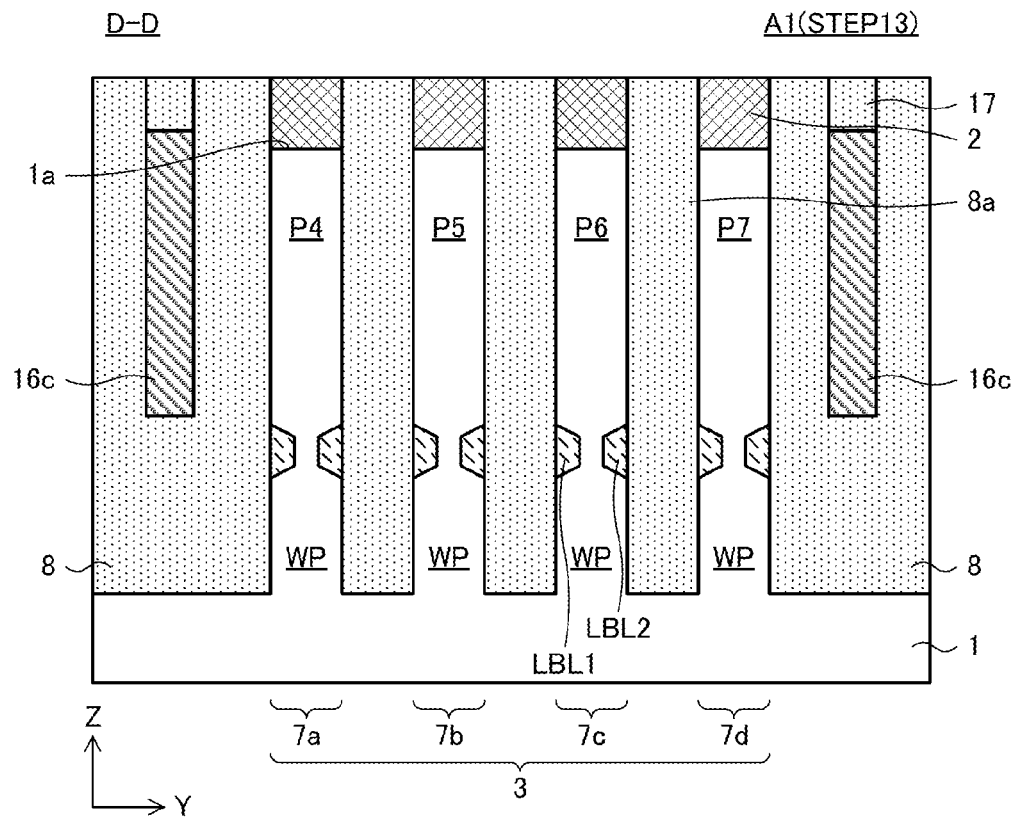
Figure 42:
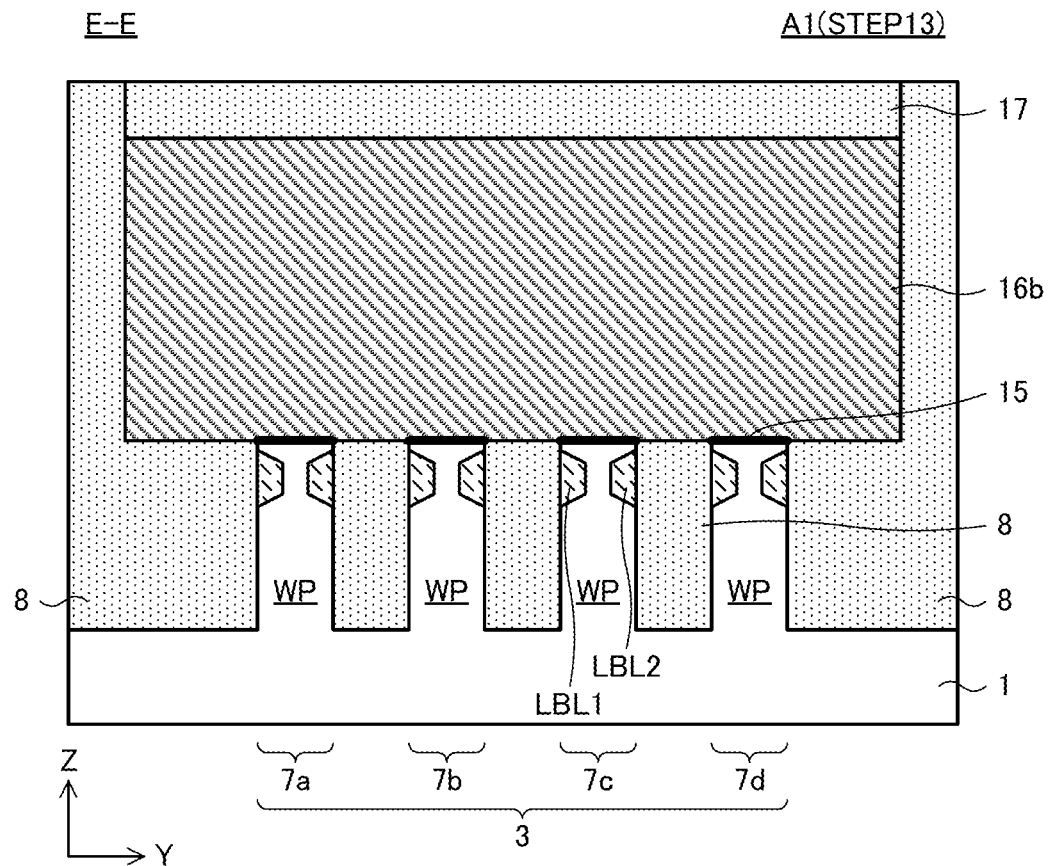

After the gate trenches 60A are completed, dry etching with oxygen plasma is performed to remove the first hard mask film 9. Then, a gate insulation film 15 made from a silicon oxide film with a thickness of 4 nm is formed on an exposed surface of the semiconductor substrate 1 by means of a thermal oxidation method, as shown in FIGS. 37 and 38 (Step 12). The gate insulation film 15 is not formed on exposed surfaces of the element isolation regions 8 and 8a.

Then, the gate electrodes 16a to 16d are formed by forming a film of a gate electrode material in the gate trenches 60A as shown in FIGS. 39 to 42 (Step 13). It is preferred that the gate electrode material is a conductor which can be formed by a method enabling conformal formation, such as CVD (Chemical Vapor Deposition) or ALD (Atomic Layer Deposition) method, in order to avoid some voids being produced inside the gate trenches 60A. More specifically, a n-type polycrystalline silicon film, a titanium nitride (TiN) single layer film, or a laminated film of titanium nitride and tungsten (W) are preferably available as the gate electrode material.

The following provides a detailed description of how to form the gate electrodes 16a to 16d, taking a case in which a titanium nitride single layer film is used as the gate electrode material as an example. First, a titanium nitride film is formed across the entire surface with a thickness of 30 nm by using titanium tetrachloride ($TiCl_4$) and ammonia ($NH_3$) as source gases and under the condition that a film-forming temperature is 550 to 650 degrees Celsius. Because the width in the X direction of the gate trenches 60A is 20 nm, the gate trenches 60A are completely filled with the titanium nitride film by forming the titanium nitride film with a thickness of 30 nm. Then, etch back with chlorine ($Cl_2$) containing plasma is performed to remove a titanium nitride film that is formed on upper surfaces of the element isolation regions 8 and 8a and mask film 2. The etching partially removes a titanium nitride film that is formed in the gate trenches 60A. Therefore, a concave section is formed at an upper end of each of the gate trenches 60A. At this time, the amount of the etching of the titanium nitride film is so controlled that an upper surface of the gate electrode 16 is higher than the surface 1a of the semiconductor substrate. After the etching of the titanium nitride film is complete, a silicon oxide film is formed across the entire surface so as to be thick enough to fill the concave sections formed in the gate trenches 60A. After that, etch back of the silicon oxide film is performed by using fluorine-containing plasma. As a result, as shown in FIGS. 39 to 42 (Step 13), the cap insulation film 17 is formed on upper surfaces of the gate electrodes 16a to 16d and upper surfaces of the cap insulation film 17, element isolation regions 8 and 8a, and mask film 2 are flush with each other.

Figure 43:
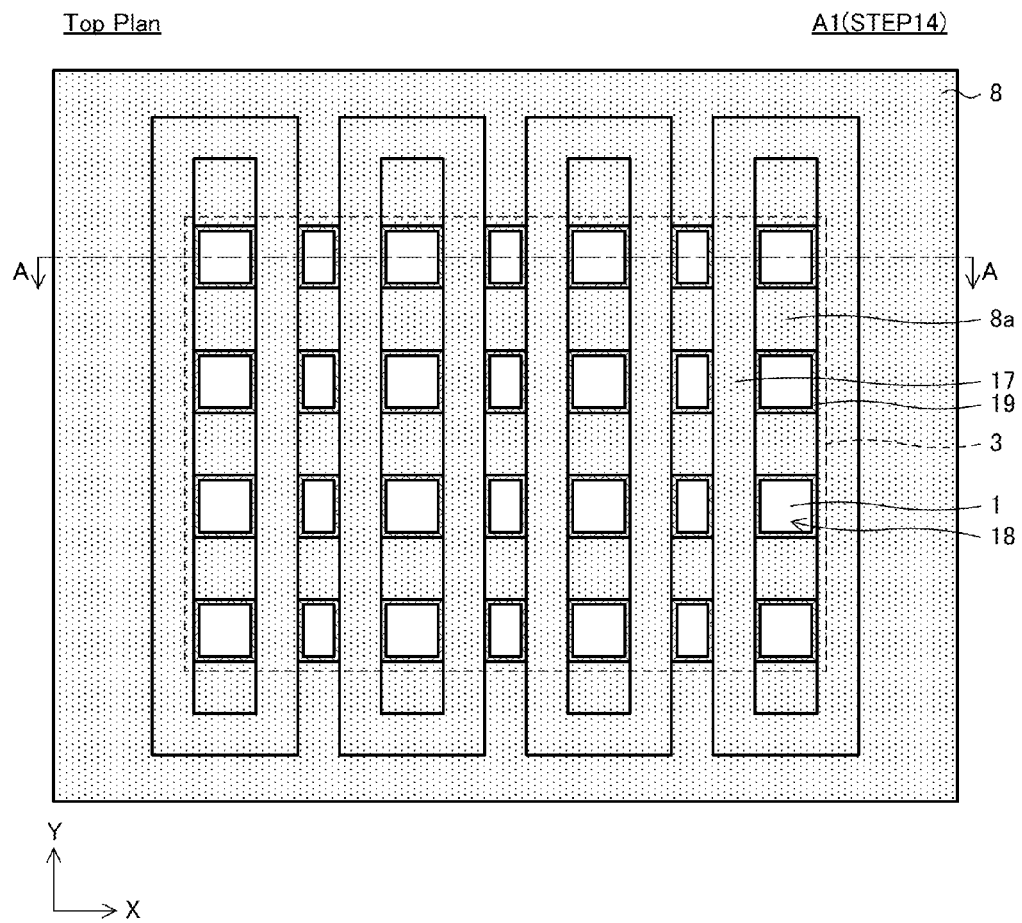
FIGS. 43 and 44 are diagrams each showing the semiconductor device A1 at step 14 of a manufacturing process according to the first embodiment.
Figure 44:
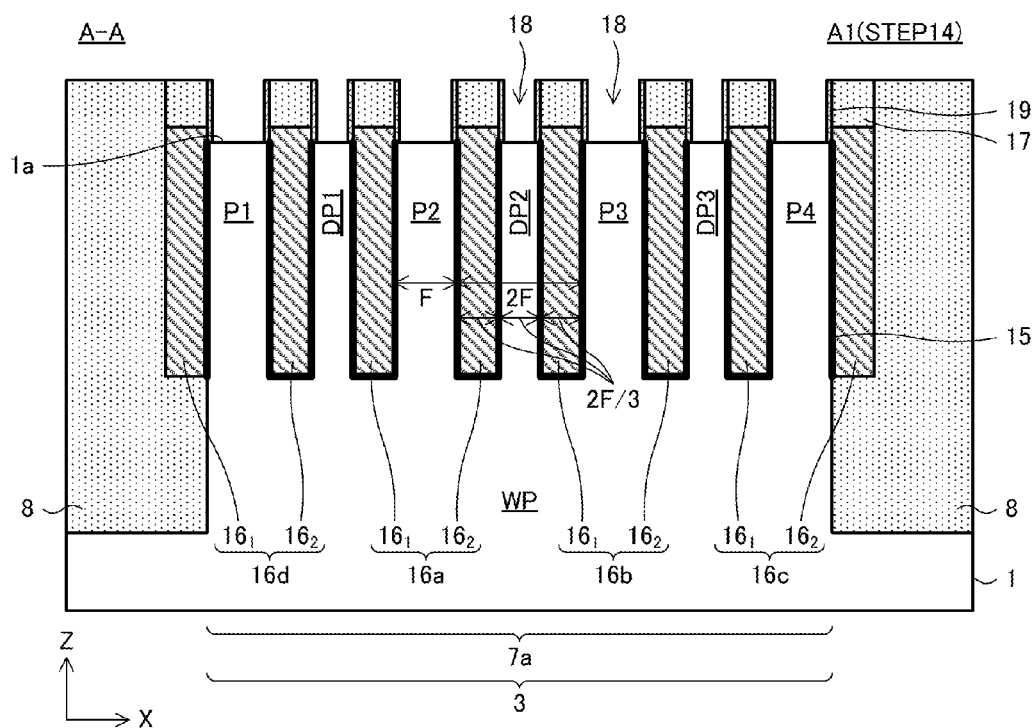

Then, using a hot phosphoric acid solution whose temperature is about 160 degrees Celsius, a mask film 2 that is exposed from an upper surface is selectively removed. As a result, as shown in FIGS. 43 and 44 (Step 14), a rectangular contact hole 18 is formed at a position that overlaps with each of the semiconductor pillars P and each of the dummy pillars DP in planar view. From a bottom surface of the contact hole 18, the surface 1a of the semiconductor substrate 1 is exposed. After that, a silicon nitride film with a thickness of 5 nm is formed across the entire surface using the CVD method. Furthermore, an anisotropic dry etching method is used to perform etch back of the silicon nitride film. Accordingly, the silicon nitride film is removed from a bottom surface of each of the contact holes 18 and a sidewall insulation film 19 (second sidewall insulation film) is so formed as to cover an inner-side surface of each of the contact holes 18.

Figure 45:
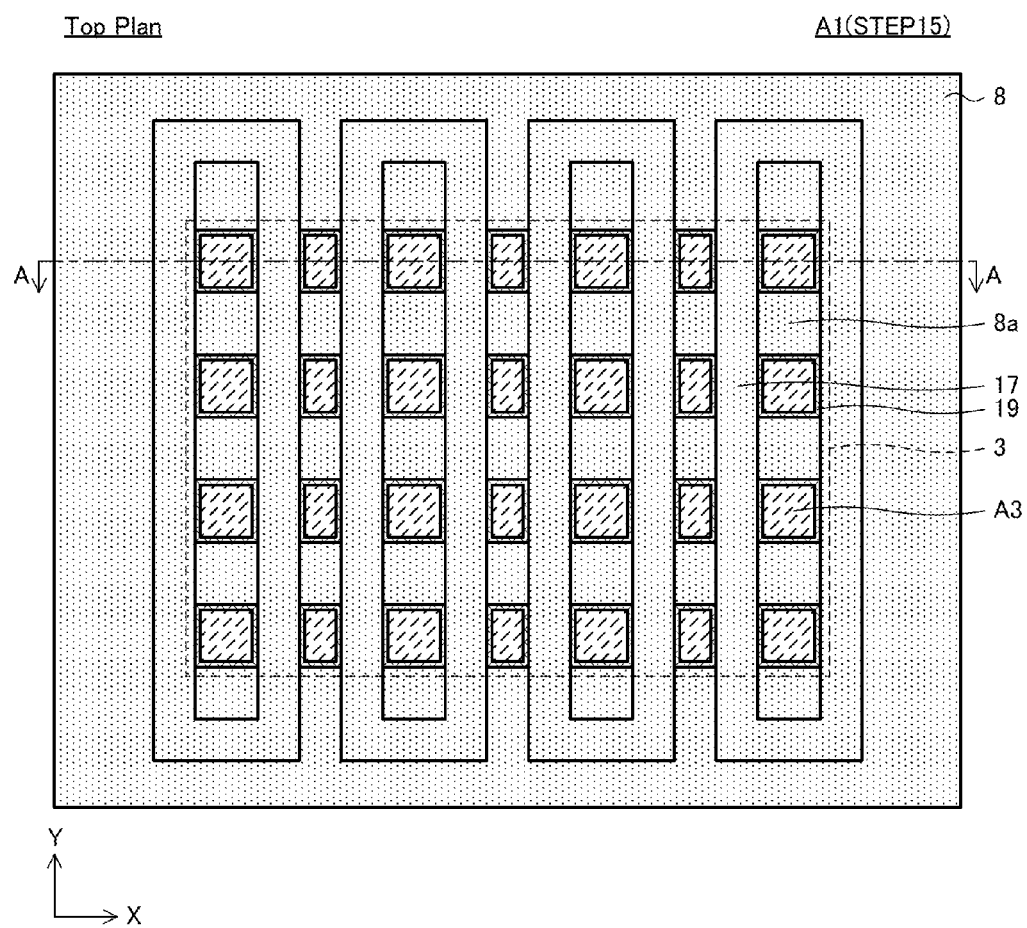
FIGS. 45 and 46 are diagrams each showing the semiconductor device A1 at step 15 of a manufacturing process according to the first embodiment.
Figure 46:
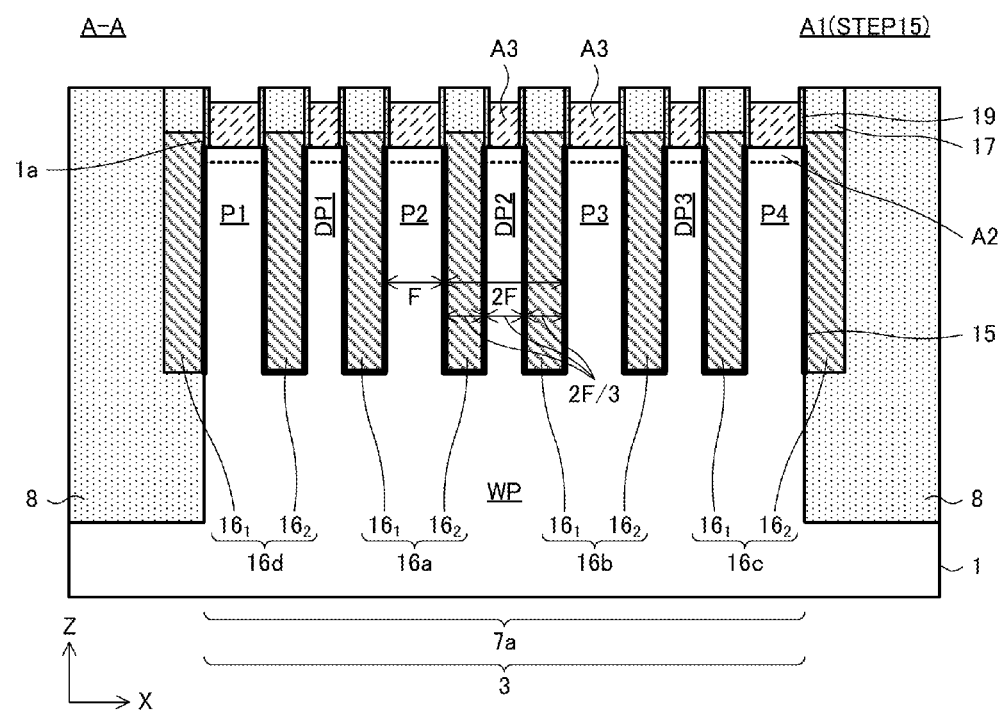

Then, a n-type impurity injection layer is formed on upper surfaces of each of the semiconductor pillars P and each of the dummy pillars DP be means of an ion implantation method. The impurity concentration of the n-type impurity injection layer is $10^{19}$ atoms/$cm^3$. Then, the upper diffusion layer A2 is formed as shown in FIGS. 45 and 46 (Step 15) by activating the implanted impurities by means of thermal treatment at 1,000 degrees Celsius for 10 seconds. After that, an Epi-Si layer A3 made from single crystal silicon containing n-type impurities is formed by means of a selective epitaxial growth whose crystal seed is a single crystal silicon substrate that is exposed at upper surfaces of each of the semiconductor pillars P and each of the dummy pillars DP. It is preferred that the selective epitaxial growth be carried out using dichlorosilane ($SiH_2Cl_2$) gas and hydrogen chloride (HCL) gas that are supplied in a hydrogen ($H_2$) atmosphere as source gases, and under the condition that a temperature is 800 degrees Celsius and an atmosphere pressure is 10 Torr. The n-type impurities may be introduced at the time of epitaxial growth, or may be introduced by the ion implantation method after the growth. In the former case, for example, if the introduced n-type impurity is phosphorus (P), phosphine ($PH_3$) may be added to the source gases. The n-type impurity concentration of the single crystal silicon is $10^{20}$ to $10^{21}$ atoms/$cm^3$.

Figure 47:
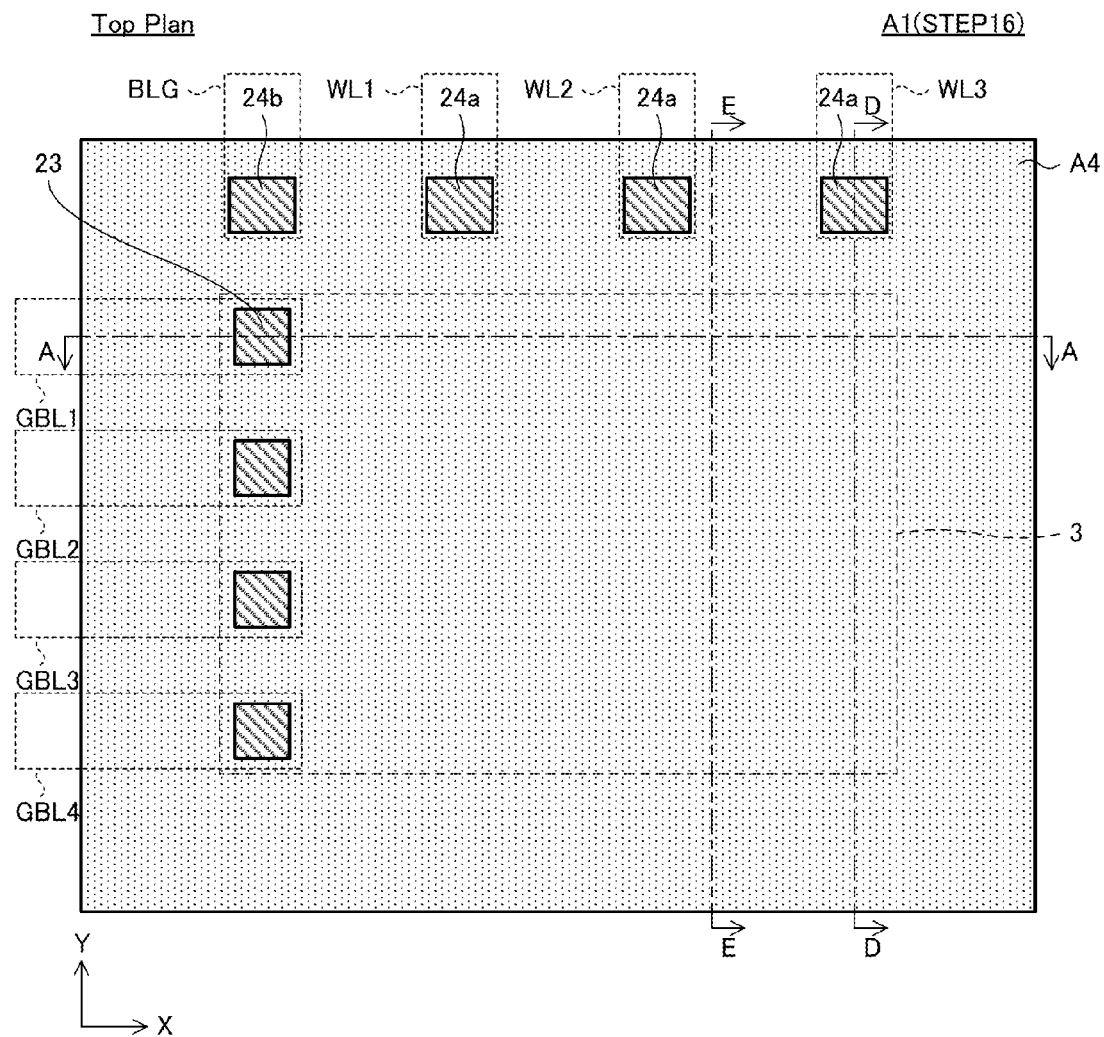
FIGS. 47 to 50 are diagrams each showing the semiconductor device A1 at step 16 of a manufacturing process according to the first embodiment.
Figure 48:
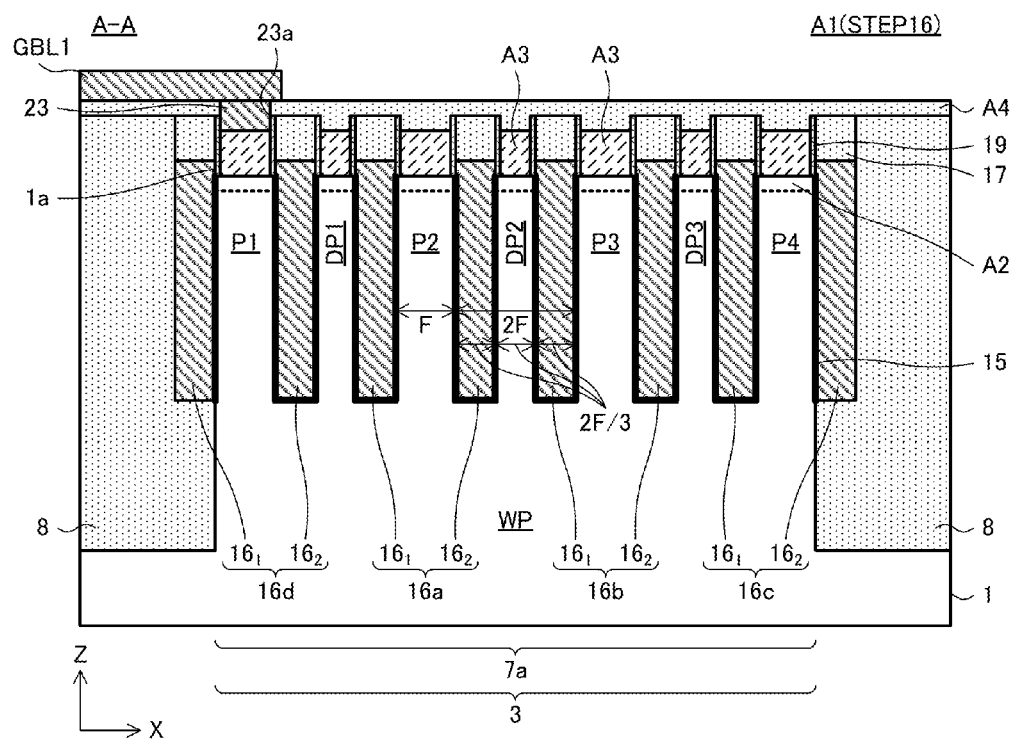
Figure 49:
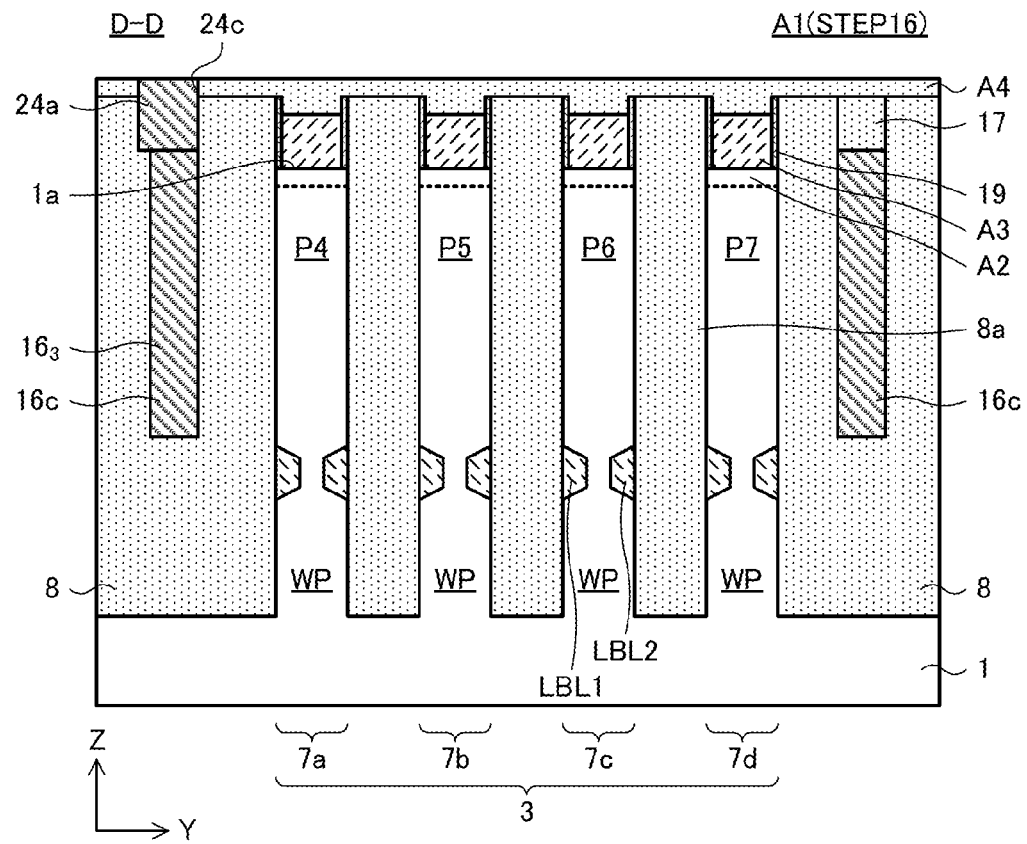
Figure 50:
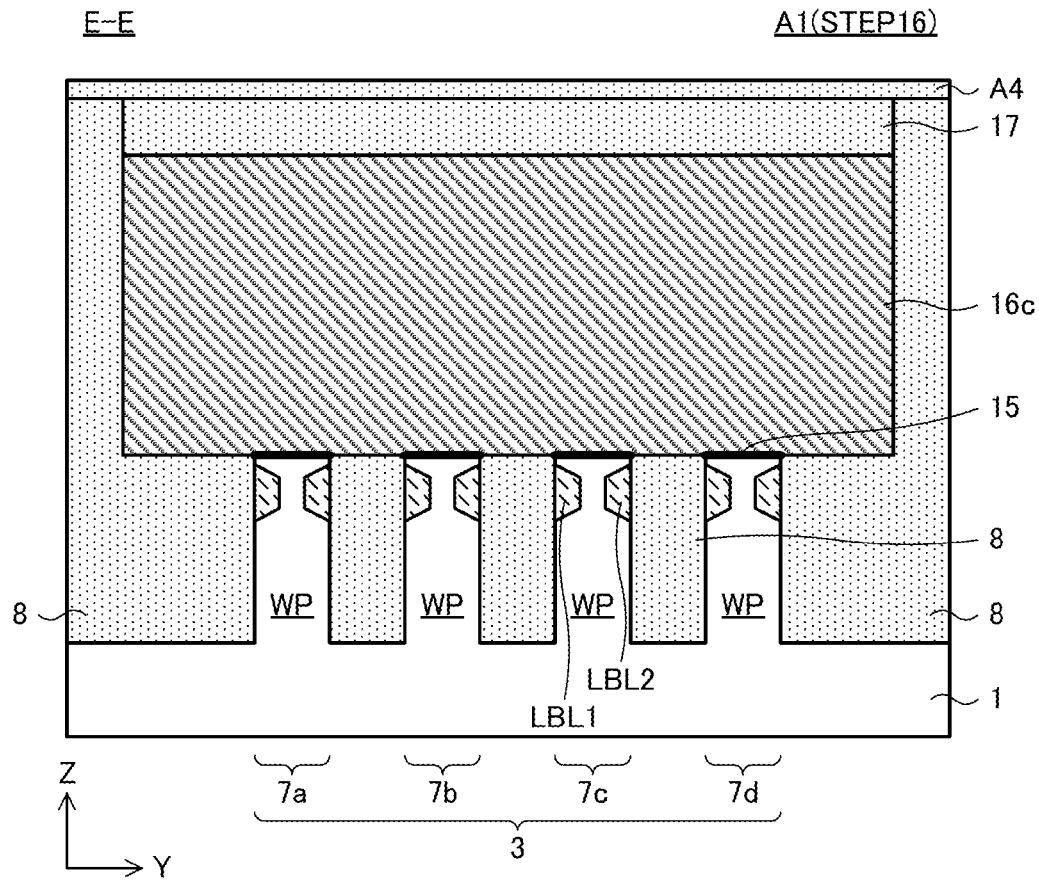

After the Epi-Si layer A3 is formed, the first interlayer insulation film A4 made from a silicon oxide film is formed across the entire surface by means of a CVD method as shown in FIGS. 47 to 50 (Step 16). Then, the contact hole 23a (FIG. 48) through which an upper surface of the semiconductor pillar P (or the semiconductor pillar P that is located at a left end of each of the active regions 7 as shown in FIG. 47) that constitutes the above-described bit line switching transistor is exposed, and a contact hole 24c (FIG. 49) through which an upper surface of the connection conductor $16_3$ corresponding to each of the gate electrodes 16 is exposed are formed at the same time by etching the first interlayer insulation film A4 and cap insulation film 17 by means of lithography and an anisotropic dry etching method. Then, the bit line contact conductor 23, the word line contact conductor 24a, and the bit line drive wire contact conductor 24b are formed by embedding a metal conductor in the contact holes 23a and 24c.

Then, the word line WL, the bit line drive wire BLG, and the global bit line GLB are formed at the same time on an upper surface of the first interlayer insulation film A4 by forming a film of tungsten (W) across the entire surface and patterning the film of tungsten by means of lithography and an anisotropic dry etching method. Incidentally, the bit line contact conductor 23, the word line contact conductor 24a, the bit line drive wire contact conductor 24b, the word line WL, the bit line drive wire BLG, and the global bit line GBL may be formed integrally in one process of forming a film of metal conductor.

Then, as shown in FIG. 4 and other diagrams, a second interlayer insulation film 25 covering the word line WL, the bit line drive wire BLG, and the global bit line GBL is formed. Then, an opening exposing an upper surface of the Epi-Si layer A3 that is provided on an upper surface of the semiconductor pillar P that constitutes a cell transistor (or any semiconductor pillar P other than a semiconductor pillar P located at a left end of each active region 7 in the case of FIG. 2) is formed by etching the silicon oxide film by means of lithography and an anisotropic dry etching method. Then, a metal conductor is embedded into the opening. Accordingly, the capacitance contact conductor A5 shown in FIG. 4 and other diagrams is formed. Then, the cell capacitors A6 and the third interlayer insulation film 28 are sequentially formed on an upper surface of the second interlayer insulation film 25. Furthermore, upper-layer wires and interlayer insulation films (not shown) are formed, and the semiconductor device A1 is completed.

As described above, according to the manufacturing method of the semiconductor device A1 of the present embodiment, it becomes possible to form the dummy pillar DP which separates the adjacent gate electrodes 16 (e.g. the gate electrode 16a and the gate electrode 16b). Since there is no need to carry out the separation by anisotropic dry etching of gate electrodes which is required for a method of manufacturing a semiconductor device having a conventional double gate structure, it becomes possible to prevent the adjacent gate electrodes 16 from being short-circuited. As a result, it also becomes possible to increase the yield of the semiconductor device A1.

Moreover, since the gate trench 60A and the dummy pillar DP are formed in a self-alignment manner by making use of the core pattern 11 and the sacrificial layer pattern 12 which is formed on a side surface of the core pattern 11 in the shape of a sidewall, the gate trench 60A and the dummy pillar DP can be suitably formed with a width equal to or less than the minimum feature size F.

Moreover, the lower diffusion layer LBL which serves as the other one of the source/drain of a cell transistor is commonalized in an active region 7, and is used as a local bit line. Therefore, compared with a conventional method by which a low-resistance local bit line is embedded and formed in a bottom portion of a trench, a local bit line can be produced more easily.

Incidentally, according to the above embodiment, the width of the gate trench 60A is set 2F/3 by setting the width $W_5$ in the X direction of the sacrificial layer pattern 12 shown in FIG. 22 to 2F/3. However, by further decreasing the width $W_5$, the width of the gate trench 60A may be made narrower. For example, the width of the gate trench 60A may be set to F/3 or F/4 by setting the width $W_5$ to F/3 or F/4.

Figure 18:
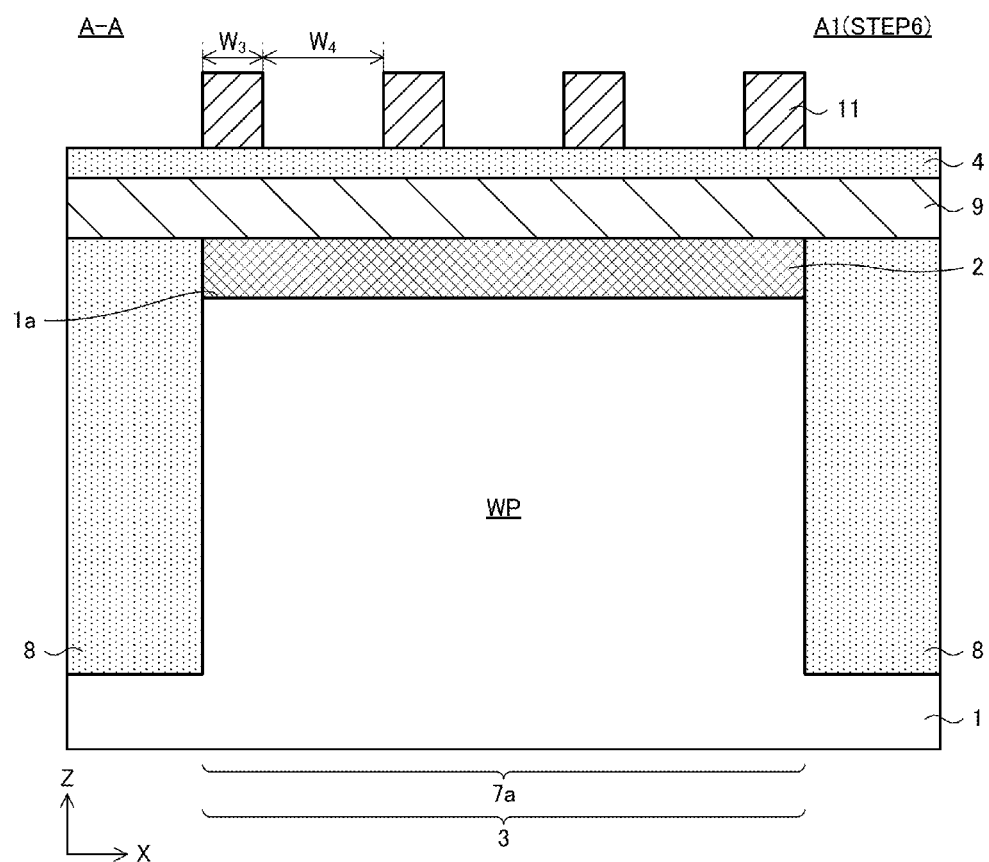
Figure 19:
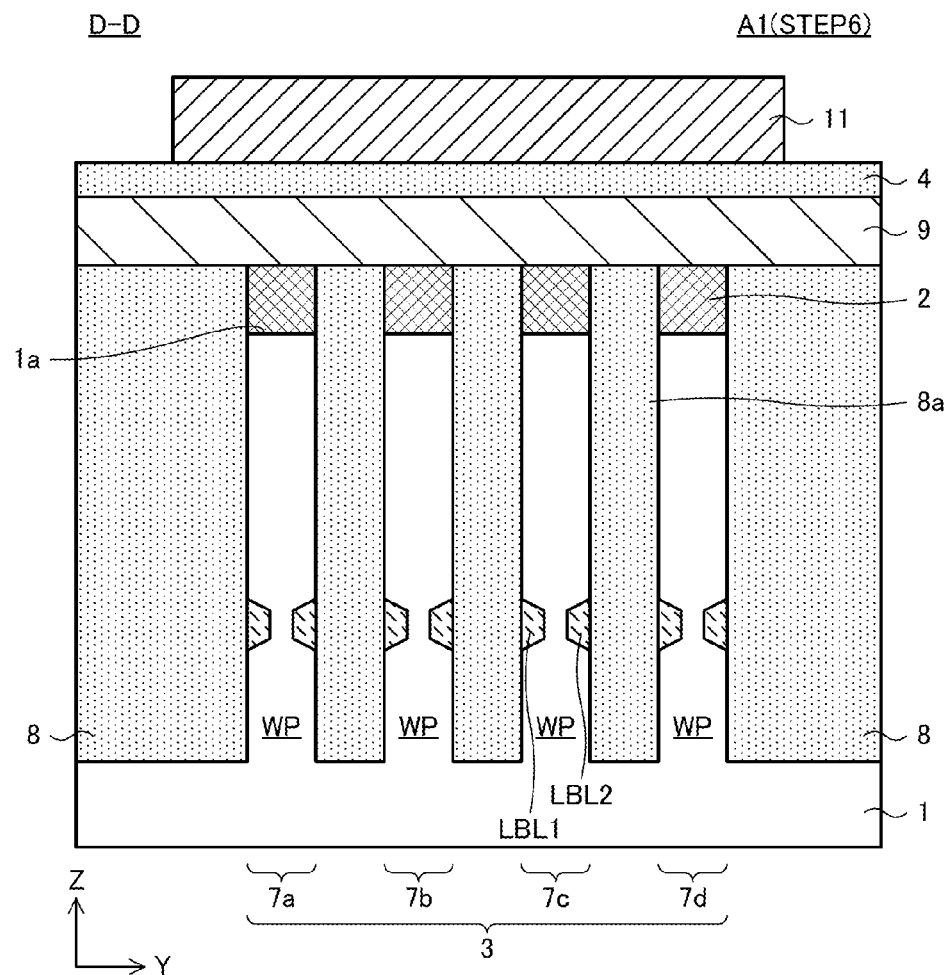
Figure 20:
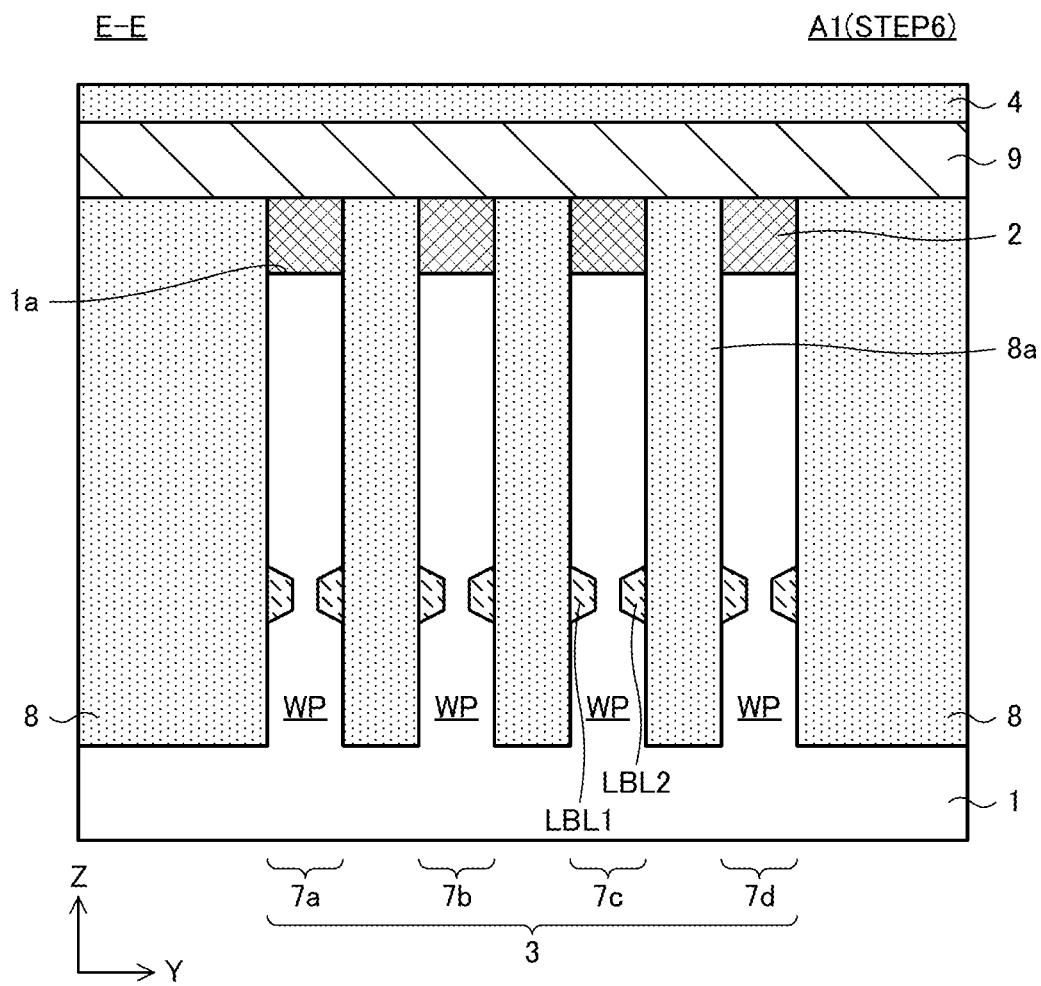

According to the above embodiment, the distance between the semiconductor pillars P is set to 2F by setting the interval $W_4$ of the core pattern 11 shown in FIGS. 18 to 2F. However, by decreasing the width $W_4$, the distance between the semiconductor pillars P may be made narrower. In particular, if the width of the gate trench 60A is set to F/3, the distance between the semiconductor pillars P may be set to F.

Further, according to the above embodiment, the width of the gate trench 60A is equal to the width of the dummy pillar DP by setting the interval $W_4$ to three times as much as the size of the width $W_5$. However, the width of the gate trench 60A is not necessarily equal to the width of the dummy pillar DP and may be different from the width of the dummy pillar DP. For example, if the distance between the semiconductor pillars P is set to 2F, the width of the gate trench 60A (=the width of the sub gate electrodes $16_1$ and $16_2$) may be set to 2.5F/3, and the width of the dummy pillar DP to F/3. Alternatively, the width of the gate trench 60A may be set to F/3, and the width of the dummy pillar DP to 4F/3.

Figure 51:
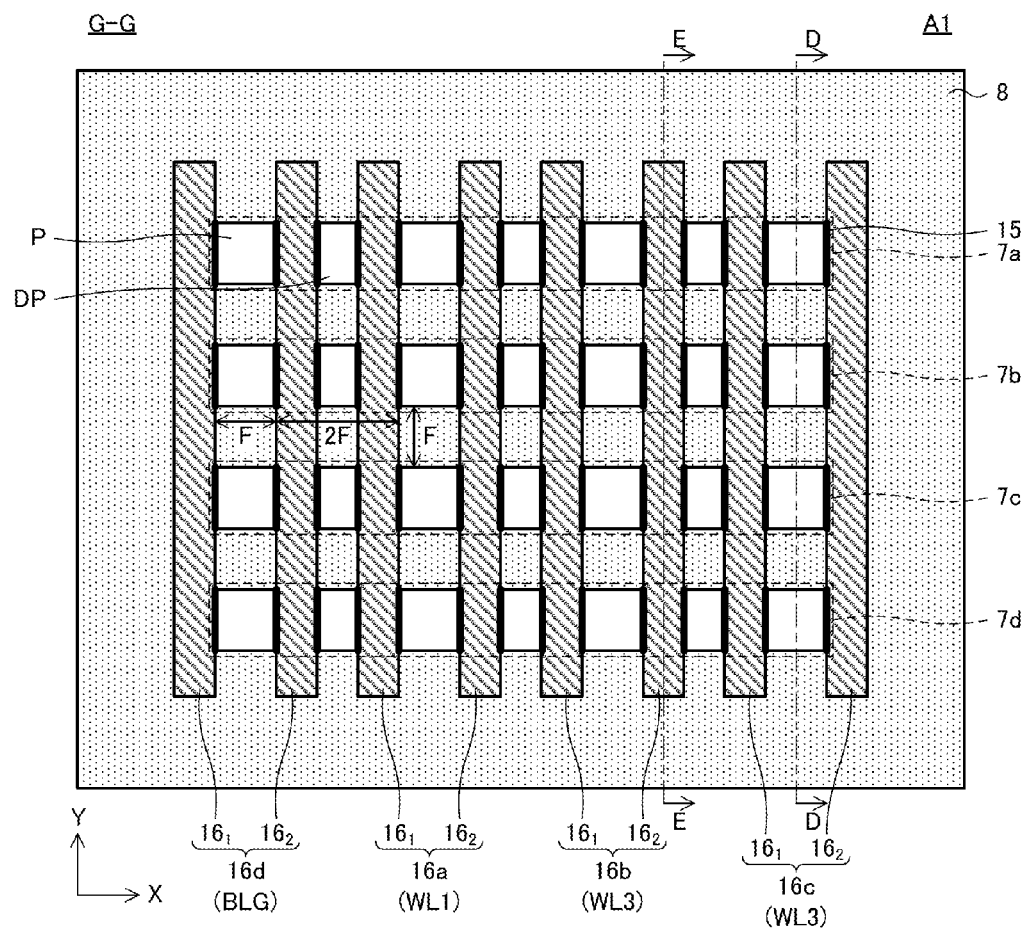
FIG. 51 is a plane view of a semiconductor device A1 according to a second embodiment of the present invention, corresponding to a line G-G shown in FIGS. 53 and 54.
Figure 52:
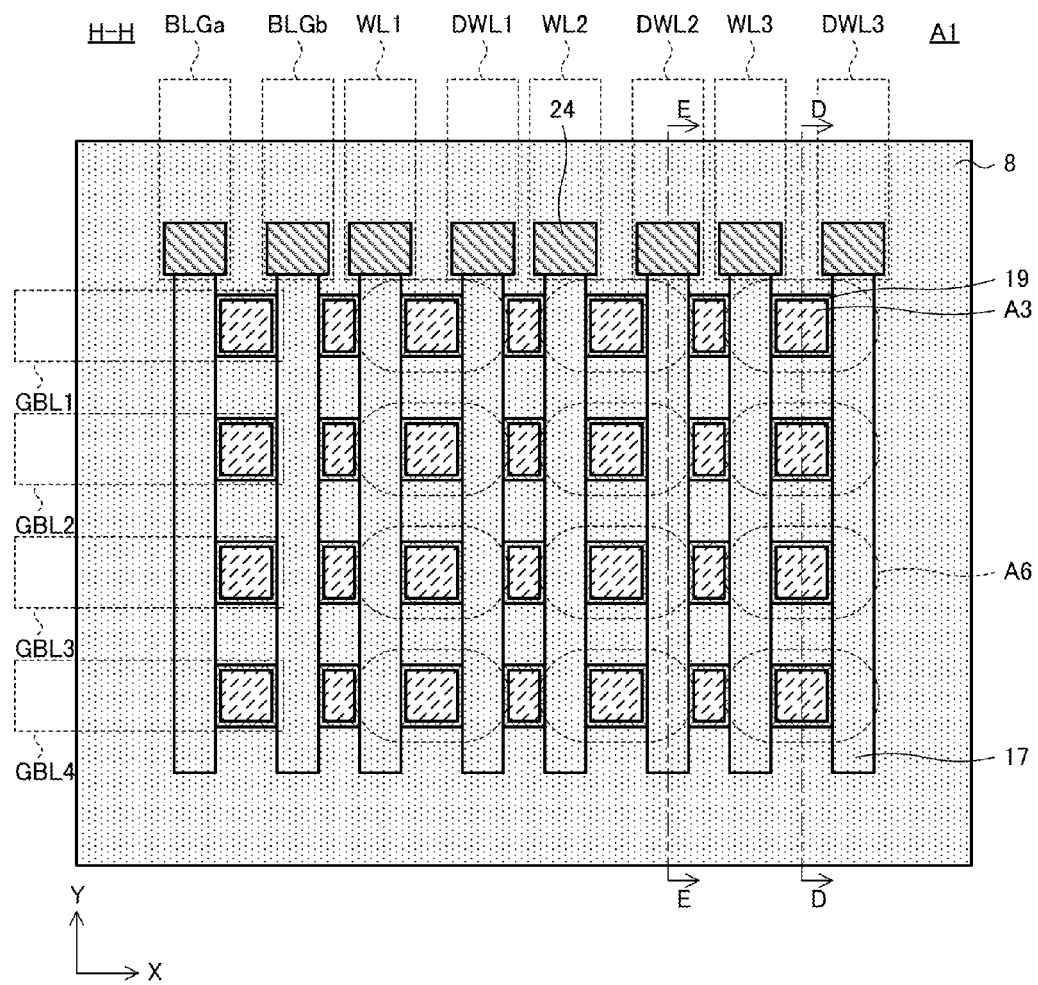
FIG. 52 is a plane view of the semiconductor device A1 corresponding to a line H-H shown in FIGS. 53 and 54.
Figure 53:
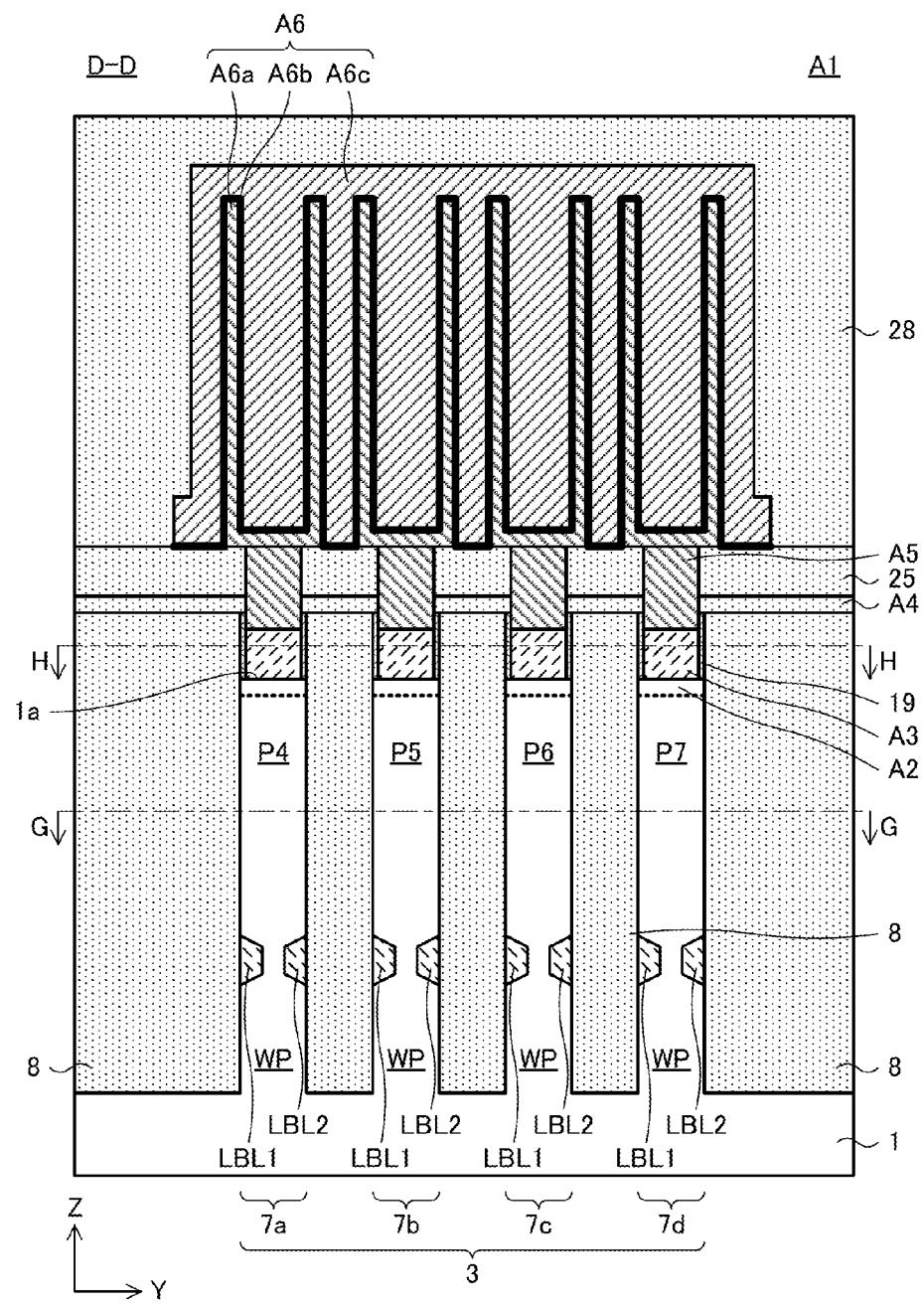
FIG. 53 is a cross-sectional view of the semiconductor device A1 corresponding to a line D-D shown in FIGS. 51 and 52.
Figure 54:
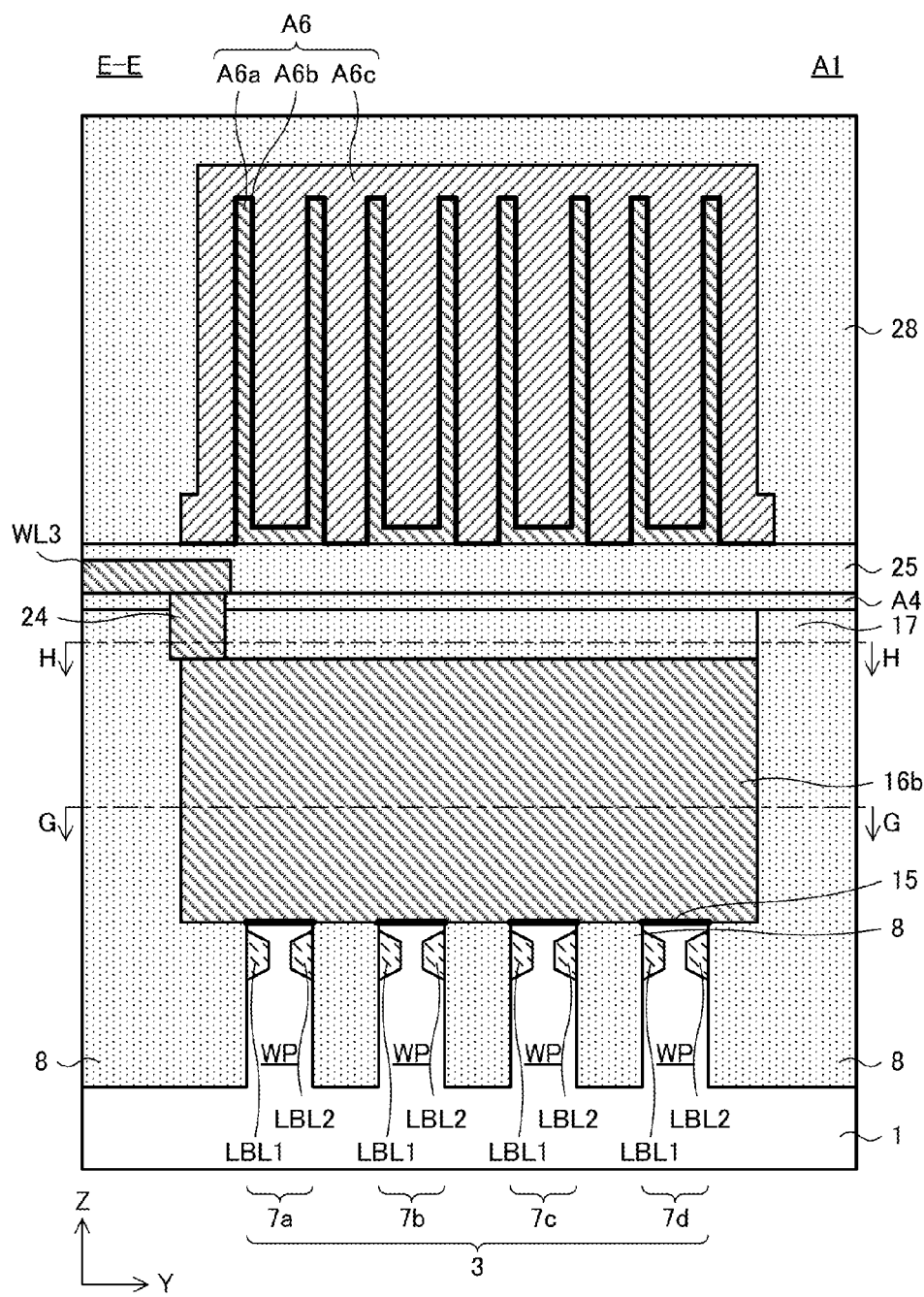
FIG. 54 is a cross-sectional view of the semiconductor device A1 corresponding to a line E-E shown in FIGS. 51 and 52.

Turning to FIGS. 51 to 54, the semiconductor device A1 according to a second embodiment of the present invention is different from the semiconductor device A1 of the first embodiment in that, as for each of the gate electrodes 16a to 16d, the sub gate electrodes $16_1$ and $16_2$ are not connected each other (the connection conductor $16_3$ is not provided) as shown in FIG. 51. Following upon this configuration, in the semiconductor device A1 of the present embodiment, a bit line drive wire BLG is divided into two bit line drive wires BLGa and BLGb and dummy word lines DWL1 to DWL3 are provided as shown in FIG. 52. The bit line drive wires BLGa and BLGb are connected to the sub gate electrodes $16_1$ and $16_2$ of the gate electrode 16d, respectively. Each of the word lines WL1 to WL3 is connected to the sub gate electrode $16_1$ of the corresponding gate electrode 16. Each of the dummy word lines DWL1 to DWL3 is connected to the sub gate electrode $16_2$ of the corresponding gate electrode 16. In other respects, the semiconductor device A1 of the present embodiment is the same as the semiconductor device A1 of the first embodiment.

According to the above configuration, in the semiconductor device A1 of the present embodiment, it is possible to control the sub gate electrodes $16_1$ and $16_2$ of each of the gate electrodes 16 independently by applying different potentials to the sub gate electrodes $16_1$ and $16_2$. For example, while a voltage of 0.6V which is greater than a threshold voltage is applied to the sub gate electrode $16_1$, a voltage of −0.2 V which is less than a threshold voltage can be applied to the sub gate electrode $16_2$. As in this example, if a voltage that is greater than a threshold voltage is applied to one of the sub gate electrodes $16_1$ and $16_2$, the corresponding transistor becomes ON even if a voltage that is applied to the other one of the sub gate electrodes $16_1$ and $16_2$ is less than a threshold voltage.

As the semiconductor device A1 is further miniaturized, and as the minimum feature size F is reduced so that intervals in the X direction of semiconductor pillars P are shortened, potential interference gets to occur between the adjacent gate electrodes 16. In the semiconductor device A1 of the first embodiment, other adjacent transistors may be turned ON due to such the potential interference. In one example, when a voltage greater than a threshold voltage is applied to the gate electrode 16b, it could happen that cell transistors corresponding to the adjacent gate electrodes 16a and 16c are turned ON as a result of generation of a voltage greater than a threshold voltage on them.

According to the semiconductor device A1 of the present embodiment, in such a case, it is possible to apply a voltage greater than a threshold voltage to the sub gate electrode $16_1$ of the gate electrode 16b to turn ON a cell transistor corresponding to the gate electrode 16b, and to apply a voltage less than a threshold voltage to the sub gate electrode $16_2$ of the gate electrode 16b. Therefore, it is possible to prevent a cell transistor corresponding to the gate electrode 16c from being turned ON. At the same time, by applying a voltage less than a threshold voltage to the sub gate electrode $16_2$ of the gate electrode 16a, it becomes also possible to prevent a cell transistor corresponding to the gate electrode 16a from being turned ON.

The following describes a manufacturing method of the semiconductor device A1 according to the present embodiment, with reference to FIGS. 55 to 58. In the diagrams, as in the case of the first embodiment, step numbers and the like are indicated.

Figure 55:
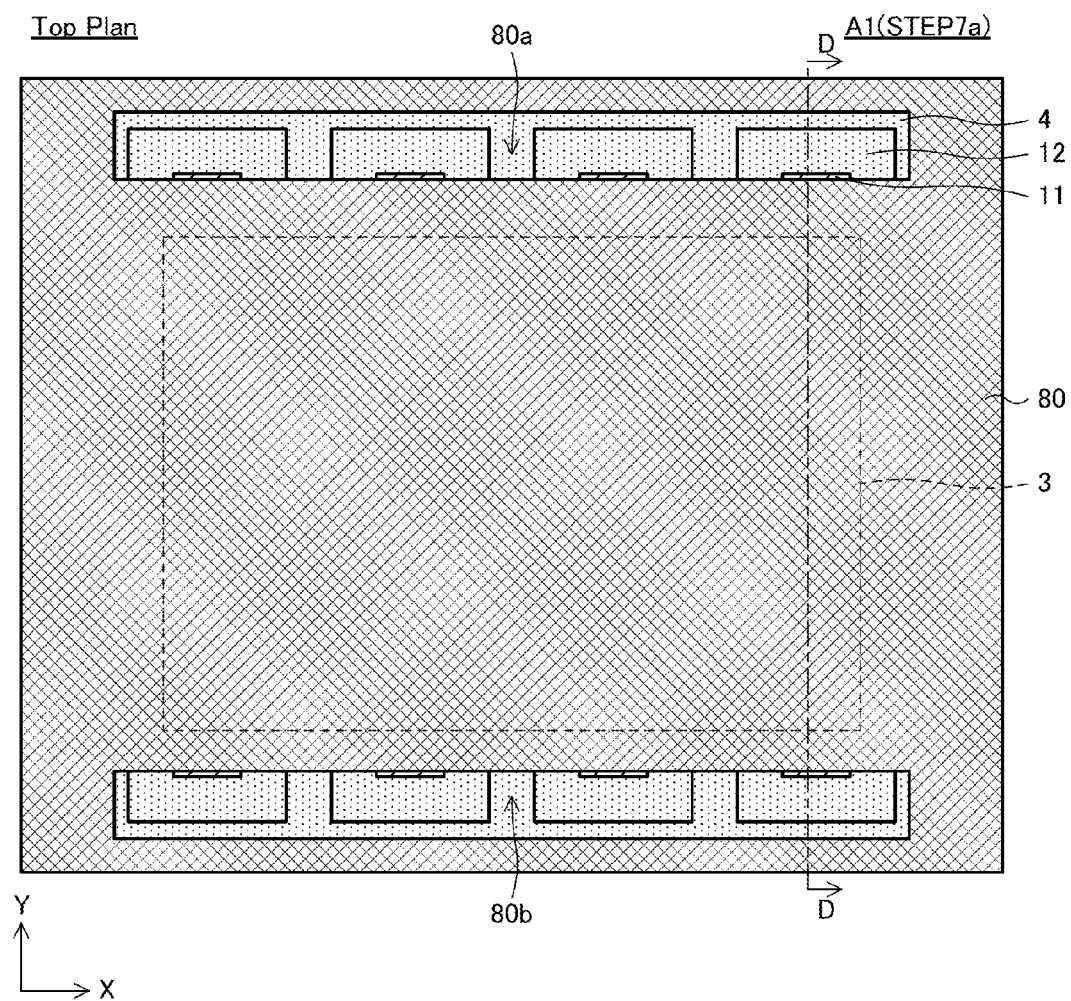
FIGS. 55 and 56 are diagrams each showing the semiconductor device A1 at step 7a of a manufacturing process according to the second embodiment.
Figure 56:
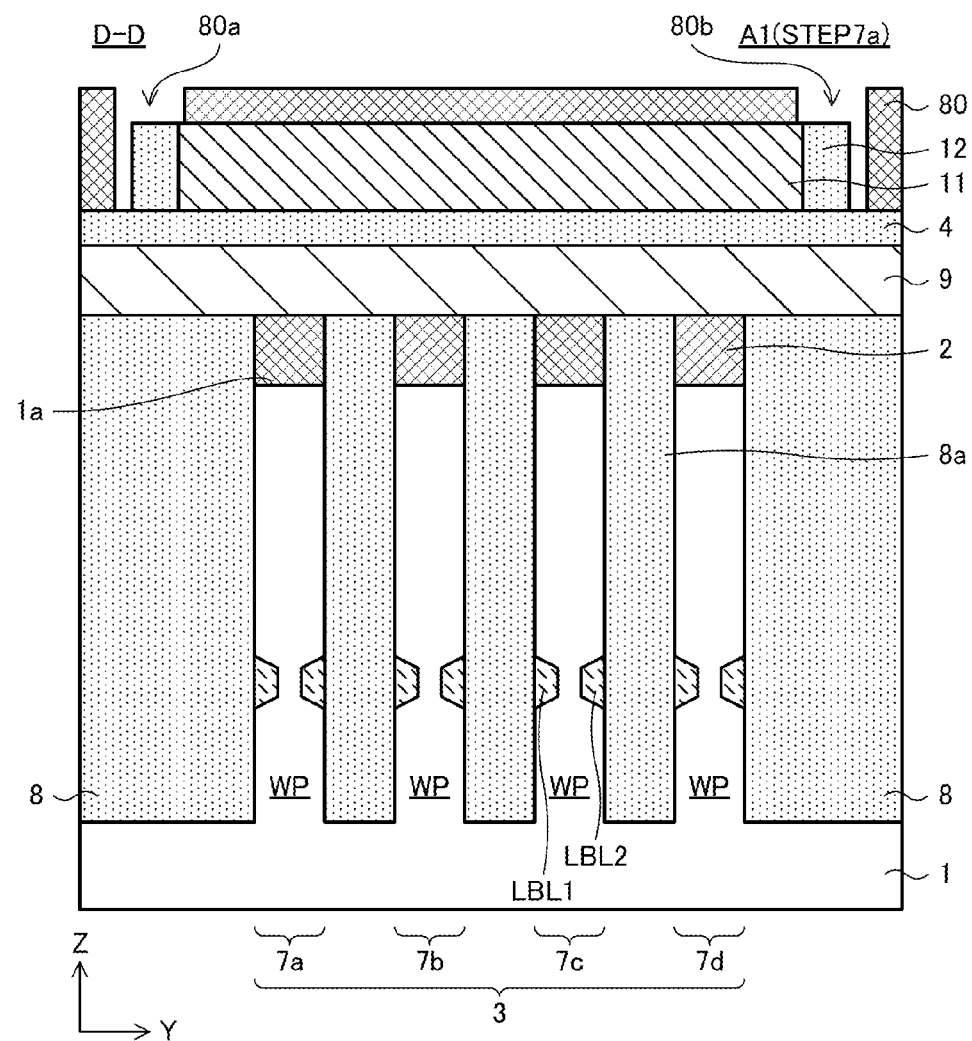
Figure 57:
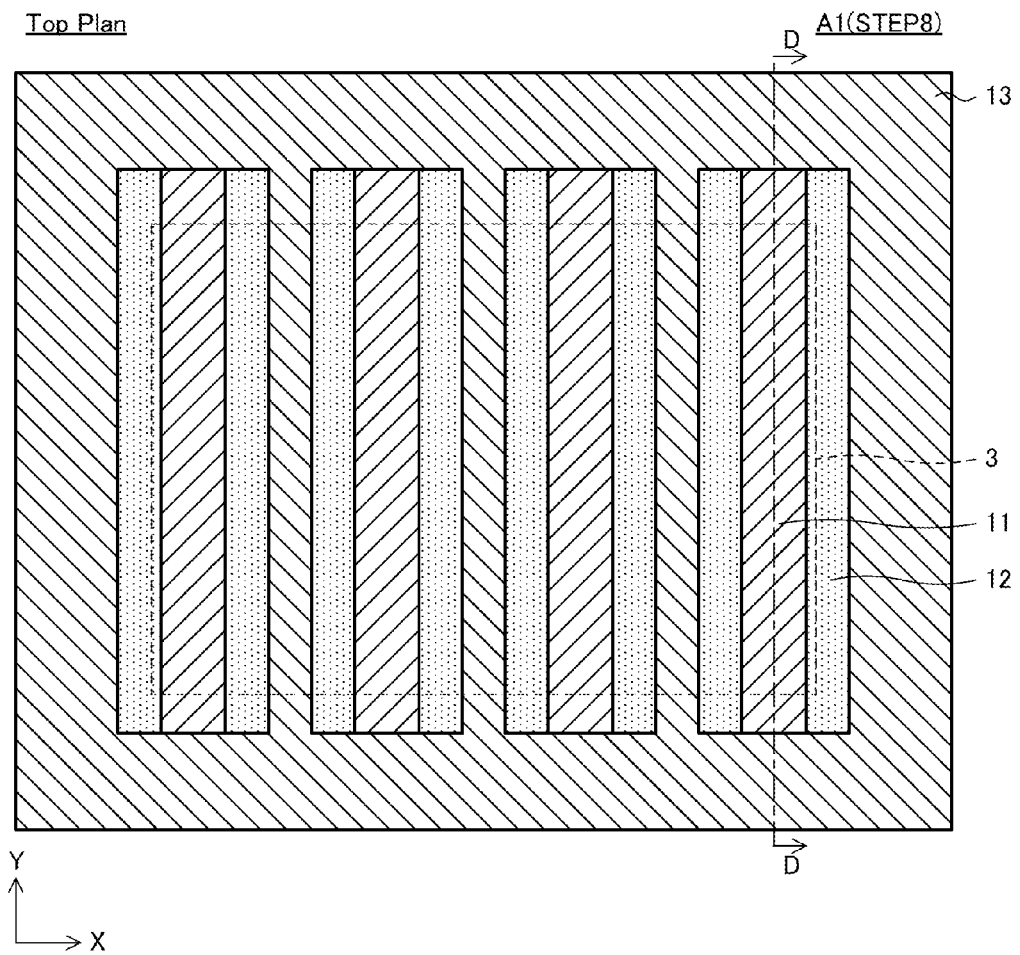
FIGS. 57 and 58 are diagrams each showing the semiconductor device A1 at step 8 of a manufacturing process according to the second embodiment.
Figure 58:
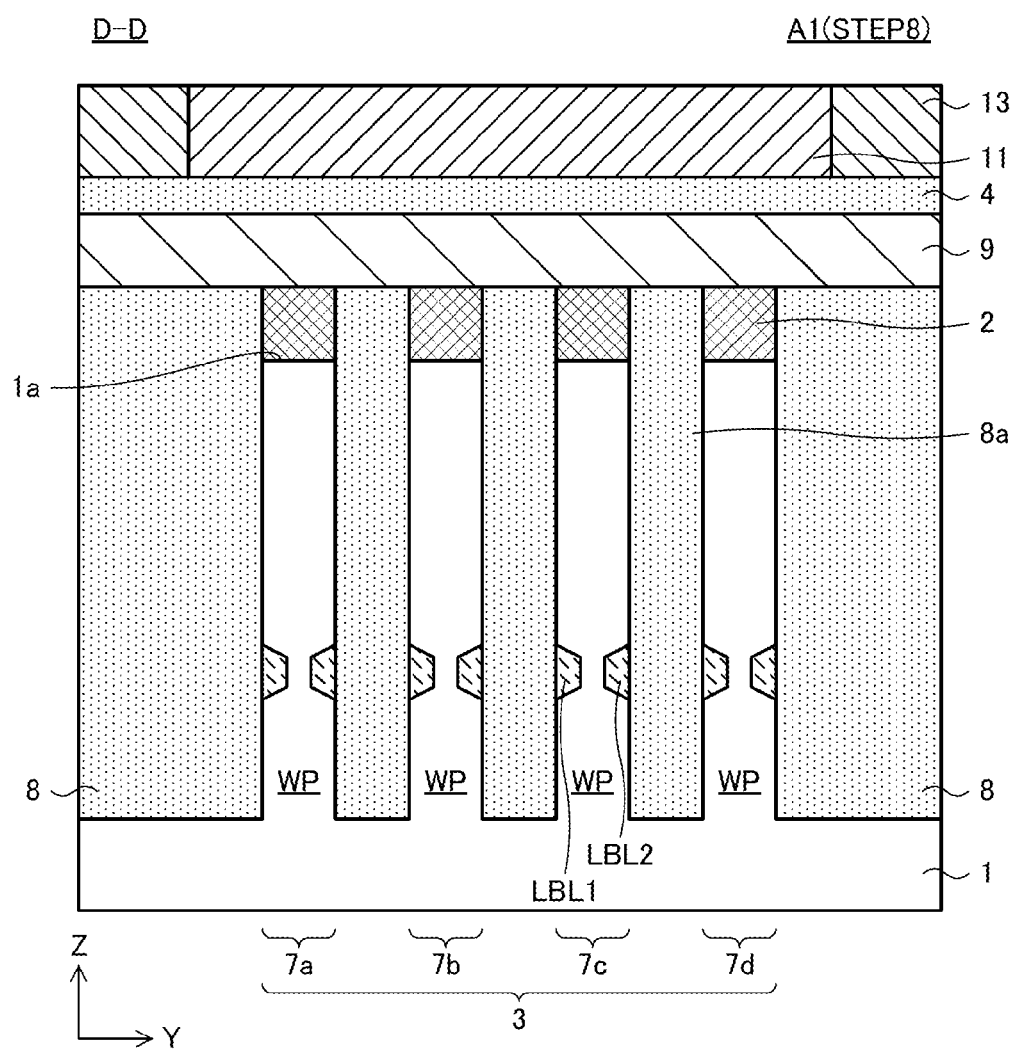

According to the manufacturing method of the present embodiment, after the processes leading up to step 7 (FIGS. 21 to 23) are carried out as described in the first embodiment, a mask film 80 having openings 80*a* and 80*b* is formed by means of a lithography method, as shown in FIGS. 55 and 56 (Step 7*a*). The openings 80*a* and 80*b* are formed at positions where portions of the sacrificial layer pattern 12 that are formed at both ends in the Y direction of the core pattern 11 are exposed. Then, portions of the sacrificial layer pattern 12 and second hard mask film 4 that are exposed through the openings 80*a* and 80*b* are removed by performing anisotropic dry etching with the use of the mask film 80 as a mask. After that, the mask film 80 is removed, and an organic film 13 is formed in the same way as in the first embodiment. As a result, a situation shown in FIGS. 57 and 58 (Step 8) can be obtained. As shown in the diagrams, the sacrificial layer pattern 12 is formed only on side surfaces in the X direction of the core pattern 11, and not formed on side surfaces in the Y direction. After that, the process of step 9 and subsequent processes are carried out as described in the first embodiment, and the semiconductor device A1 of the present embodiment can be obtained as a result.

The following describes a semiconductor device of a third embodiment of the present invention, and a method of manufacturing the semiconductor device, with reference to FIGS. 59 to 87. Incidentally, the drawings used in the following description may provide an enlarged view of characteristic portions for convenience of making it easier to understand the characteristic. Therefore, dimensions and ratios of each component are not necessarily the same as those of an actual one. Also, materials, dimensions, and other factors that are exemplified in the following description are one example. The present invention is not necessarily limited to those described below and may be appropriately modified and exploited without changing the subject matter of the invention.

Figure 59:
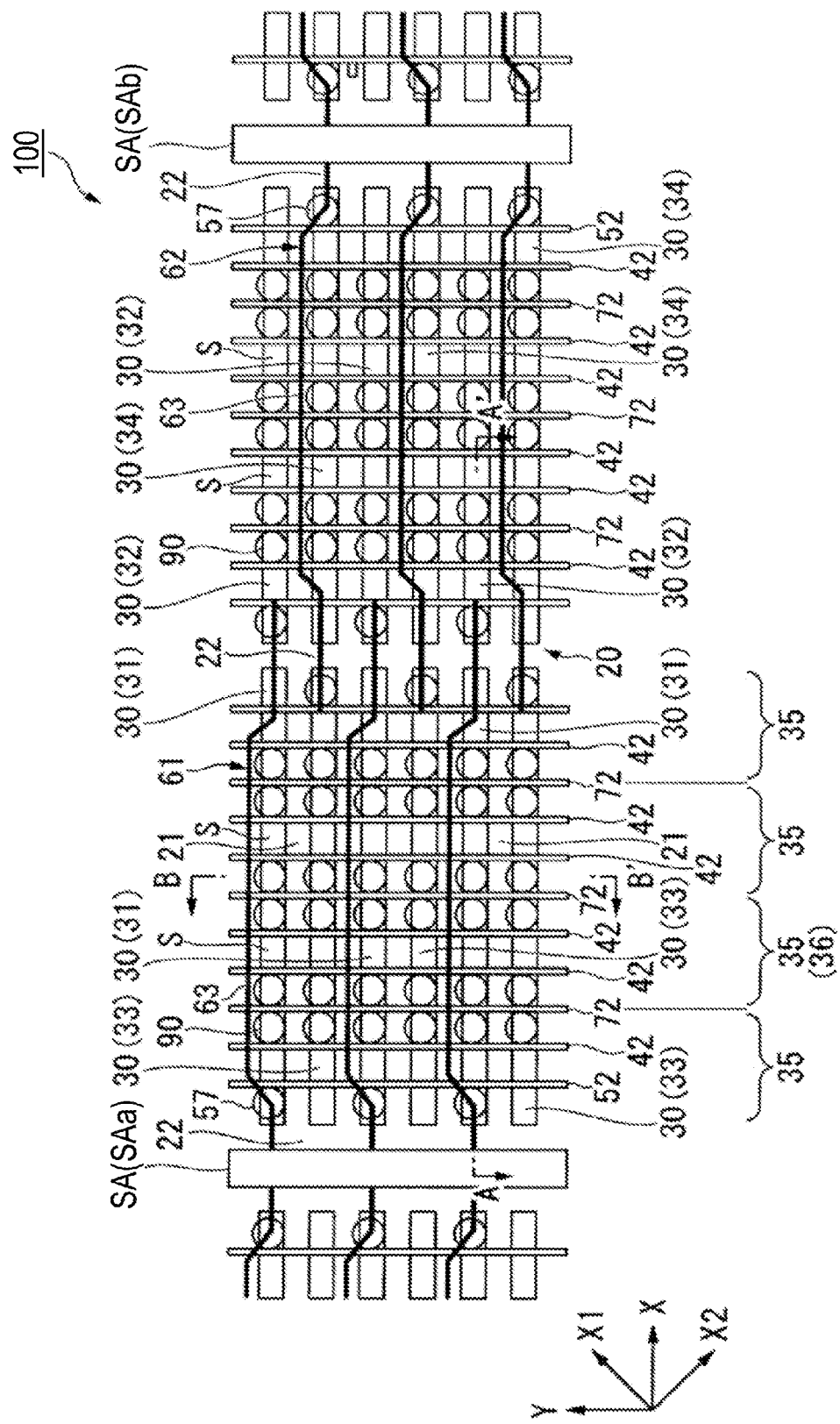
FIG. 59 is a plane view showing the schematic configuration of a semiconductor device 100 according to a third embodiment of the present invention.
Figure 60:
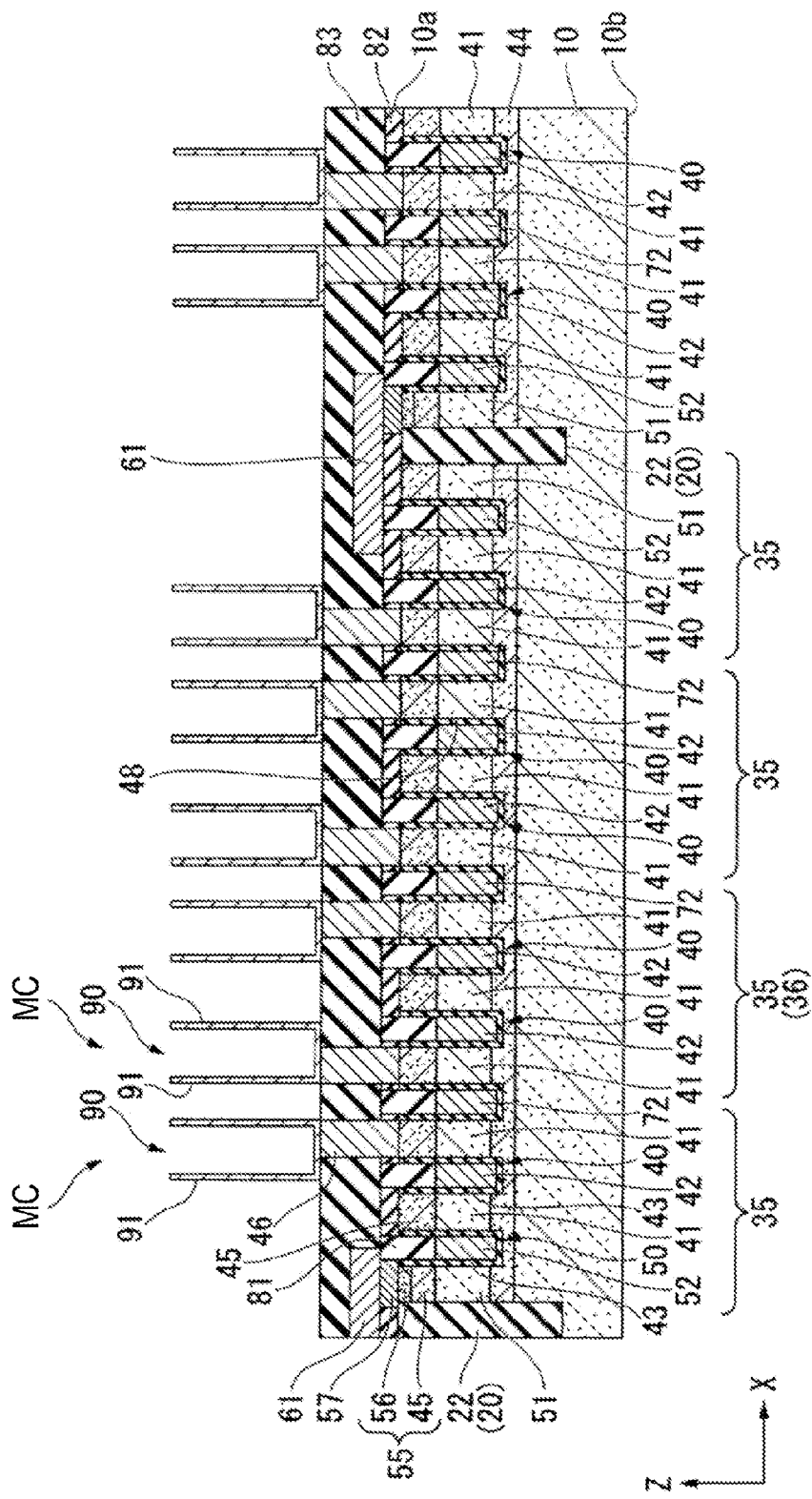
FIG. 60 is a cross-sectional view of the semiconductor device 100 corresponding to a line A-A' shown in FIG. 59.
Figure 61:
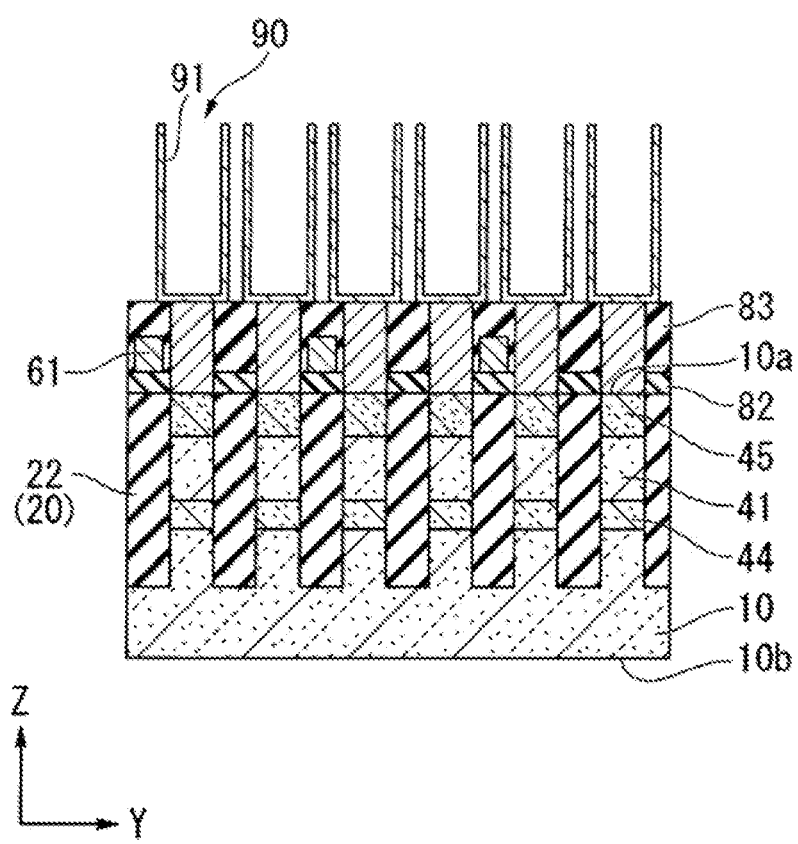
FIG. 61 is a cross-sectional view of the semiconductor device 100 corresponding to a line B-B' shown in FIG. 59.

First, the configuration of a semiconductor device 100 of the present embodiment will be described. The semiconductor device 100 of the present embodiment relates to a memory cell of DRAM (Dynamic Random Access Memory). Incidentally, the region shown in the left-end of FIG. 60 is before the region where a sense amplifier is included. As shown in FIGS. 59 to 61, the semiconductor device 100 includes a semiconductor substrate 10, element isolation regions 20, active regions 30 (31 to 34), sense amplifiers SA (SAa and SAb), memory cells MC, switching transistors 50, global bit lines 61 and 62, dummy word lines 72, a first interlayer insulation film 82, and a second interlayer insulation film 83.

The semiconductor substrate 10 is in the shape of a plate. For example, a single crystal silicon substrate whose conductivity type is p may be used for the semiconductor substrate 10. The semiconductor substrate 10 has an upper surface 10*a* and a lower surface 19*b*. An element isolation region 20 includes a first element isolation region 21 extending in an X direction; a second element isolation region 22 extending in a Y direction; and a peripheral region is corresponding to a peripheral circuit region surrounding a memory cell region. The first element isolation region 21 is formed by embedding an insulation film into a trench provided in the semiconductor substrate 10 and extends in the X direction of FIG. 59 (first direction; the left-right direction in FIG. 59). As in the case of the first element isolation region 21, the second element isolation region 22 is formed by embedding an insulation film into a trench provided in the semiconductor substrate 10. The second element isolation region 22 extends in the Y direction of FIG. 59 (second direction; the up-down direction in FIG. 59).

Sense amplifiers SA are so disposed as to extend in the Y direction of FIG. 59. Two sense amplifiers SA are arranged side by side in the X direction and connected to one of the global bit lines 61 or the global bit lines 62. More specifically, the global bit lines 61 are connected to the sense amplifier SAa and the global bit lines 62 are connected to the sense amplifier SAb. Between two sense amplifiers SA that are arranged side by side in the X direction, a memory cell region that contains the plurality of active regions 30 (31 to 34) each surrounded by the element isolation regions 20 is formed.

Each of the active regions 30 (31 to 34) that constitute the memory cell region extends in the X direction as shown in FIG. 59. The active regions 30 are disposed in alignment in the X direction (first direction) and the Y direction (second direction). What is specifically illustrated in FIG. 59 is that six sets of the two active regions 30 which are arranged in the X direction are disposed in alignment in the Y-direction.

As shown in FIG. 60, in the active regions 30, a gate insulation film 43 covering an inner surface of a word trench 48 (trench, groove) that is provided on the upper surface 10*a* of the semiconductor substrate 10. Furthermore, embedded wires (a word line 42, dummy word line 72, and switching word line 52, which will be described later) are formed in the active regions 30. On upper surfaces of the embedded wires, a cap insulation film 81 is formed. More specifically, as shown in FIG. 60, six word lines 42, three dummy word lines 72, and two switching word lines 52 are formed in the active regions 30. On the upper surface 10*a*'s side of the semiconductor substrate 10, a first interlayer insulation film 82 is so formed as to be flush with an upper surface of the above-described cap insulation film 81. Furthermore, a second interlayer insulation film 83 is so formed as to cover the first interlayer insulation film 82.

A memory cell MC includes a capacitance element 90, a transistor 40, and a capacitance contact plug 46 connecting the capacitance element 90 and the transistor 40. One transistor 40 is provided for one capacitance element 90, and these are configured to function as a memory cell.

A capacitance element 90 includes a lower electrode 91 (storage node); a capacitance insulation film (not shown) which is stacked on the lower electrode 91; and an upper electrode (not shown) which is stacked on the capacitance insulation film. A capacitance element 90 is disposed on an upper surface's side of the second interlayer insulation film 83, and is connected to the capacitance contact plug 46.

A transistor 40 includes a semiconductor pillar 41; a word line 42 which functions as a gate electrode; a gate insulation film 43 which covers the word line 42; a local bit line 44 (lower diffusion layer) which serves as a source region; and an upper diffusion layer 45 which serves as a drain region. A channel of each of the transistors 40 is formed in the corresponding semiconductor pillar 41. Therefore, all of the transistors 40 are vertical transistors. The adjacent transistors 40 are electrically separated by a dummy word line 72. A region between transistors 40 for which the dummy word line 72 is not disposed therebetween, a semiconductor pillar 41 is provided. Since the semiconductor pillar 41 provided in this region is not connected to the capacitance element 90, this region is a region that does not contribute to an operation of the semiconductor device.

On an upper surface's side of the semiconductor substrate 10, a plurality of semiconductor pillars 41 are erected. Each of the semiconductor pillars 41 is surrounded by word trenches 48 (grooves, trenches) which extend in the Y direction and in each of which one of word lines 42, dummy word lines 72, and switching word lines 52 is embedded as shown in FIG. 60, and first element isolation regions 21 which extend in the X direction.

Each of the word lines 42 functions as a gate electrode of a transistor 40, and is made from a titanium nitride film or a tungsten film. Each of the dummy word lines 72 is so formed as to have the same structure as that of the word lines 42. Each of the dummy word lines 72 functions as a third element isolation region which electrically separates the adjacent transistors 40 by controlling an applied voltage. In the present embodiment, as shown in FIG. 60, six word lines 42 and three dummy word lines 72 are so disposed as to cross the active region 30. As shown in FIG. 59, the word lines 42 and the dummy word lines 72 extend in the Y direction across the active regions 30 and the first element isolation regions 21. The gate insulation film 43 is formed by stacking an insulation film on the word trench 48 formed in the active region 30.

The local bit line 44 is formed in the active region 30 and in contact with a bottom surface 48b of each of the plurality of trenches in which the word lines 42, the dummy word lines 72, and the switching word lines 52 are embedded, as shown in FIG. 60. The local bit line 44 is formed between two of the second element isolation regions 22 that extend in the Y direction. The local bit line 44 is made from an impurity diffusion layer. The conductivity type of the local bit line 44 is different from the conductivity type of the semiconductor substrate 10. More specifically, if the semiconductor substrate 10 is of a p type, the local bit line 44 is of a n type.

The upper diffusion layer 45 occupies an upper portion of a semiconductor pillar 41. An upper surface of the upper diffusion layer 45 constitutes a part of the upper surface 10a of the semiconductor substrate 10. Above the upper diffusion layer 45, a capacitance element 90 is disposed for each of the upper diffusion layers 45. Each of the upper diffusion layers 45 and the lower electrode 91 of the corresponding one of the capacitance elements 90 is connected through a capacitance contact plug 46 penetrating the second interlayer insulation film 83 and the first interlayer insulation film 82. An upper surface of the upper diffusion layer 45, or an upper surface of the semiconductor pillar 41, serves as a capacitance contact plug formation region, a region where a bottom surface of the capacitance contact plug 46 is connected.

The capacitance contact plug 46 is formed by filling a hole formed in a second interlayer insulation film 83 with a conductor. A bottom surface of the capacitance contact plug 46 is connected to an upper surface of the upper diffusion layer 45. An upper surface of the capacitance contact plug 46 is connected to a lower surface of the lower electrode 91.

The active region 30 is divided into small active regions (36) which are subdivided in the X direction, by a disposition of the dummy word lines 72 each of which functions as a third element isolation region. For example, taking a close look at a small active region 36 shown in the diagrams, as shown in FIG. 59, the following elements are disposed in the active region 36 in planar view: one of the dummy word lines 72 located at one end side (or the left side in FIG. 59); one of the capacitance elements 90 located adjacent to the dummy word line 72; one of the word lines 42 located adjacent to the capacitance element 90; another one of dummy word lines 72 located at the other side; another one of the capacitance elements 90 located adjacent to the dummy word line 72; and another one of the word lines 42 located adjacent to the capacitance element 90. Between the word lines 42, a free space S in which no capacitance element 90 is not disposed is formed. In the case of the conventional semiconductor device shown in FIGS. 99 and 100, in a free space between word lines WL1 and WL2 (or between capacitance elements), a bit line contact plug 357 is disposed. On the contrary, the present embodiment is configured as that no bit line contact plug is disposed in the free space S.

A switching transistor 50 is a transistor filling the role of connecting the corresponding local bit line 44 to the corresponding one of the global bit lines 61 and 62. The switching transistor 50 includes a semiconductor pillar 51, a switching word line 52 (gate electrode), a gate insulation film 43, a local bit line 44 (lower diffusion layer), and a switching transistor upper diffusion layer 55. On an upper surface's side of the semiconductor substrate 10, a plurality of semiconductor pillars 51 are erected. The semiconductor pillars 51 are surrounded by the first element isolation regions 21 extending in the X direction, the second element isolation regions 22 extending in the Y direction, and the word trenches 48 similarly extending in the Y direction for embedding the switching word lines 52.

The switching transistor upper diffusion layer 55 is configured to include the upper diffusion layer 45 and a highly-concentrated impurity diffusion layer 56 formed above the upper diffusion layer 45. The switching transistor upper diffusion layer 55 is formed above the semiconductor pillar 51. To an upper surface of the switching transistor upper diffusion layer 55, a bit line contact plug 57 penetrating a first interlayer insulation film 82 is connected. To an upper surface of the bit line contact plug 57, the global bit lines 61 and 62 made from low-resistance metal wires are connected.

The switching word line 52 is disposed at a one end side and at the other end side of the active region 30. The switching word line 52 functions as a gate electrode of the switching transistor 50. The gate insulation film 43 is formed by stacking an insulation film in the word trench 48 (groove) formed in the active region 30.

The bit line contact plug 57 is formed at one end side or at the other end side of each of the active regions 30 (31 to 34). For example, in the active regions 31 and 32, the bit line contact plugs 57 are disposed at one end side (or the left side in FIG. 59) of the active regions 31 and 32. In the active regions 33 and 34 that are adjacent in the Y direction to the active regions 31 and 32, the bit line contact plugs 57 are disposed at the other end side (the right side in FIG. 59) of the active regions 33 and 34.

The global bit line 61 is located above the element isolation region 20. More specifically, the global bit line 61 is disposed on an upper surface of the first interlayer insulation film 82 that is located on an upper surface of the element isolation region 20. Moreover, the global bit line 61 is disposed as a first wire that is the closest to an upper surface of the element isolation region 20. In the present embodiment, the global bit line 61 includes a linear portion 63 that extends parallel to the active region 30 (or in the X direction). The linear portion 63 is disposed immediately above the first element isolation region 21. Focusing on a global bit line 61 connected to the sense amplifier SAa, as shown in FIG. 59, the global bit line 61 is pulled out from the sense amplifier SAa and extended toward the active region 31 that is adjacent to the sense amplifier SAa in the X direction (or toward the right side in FIG. 59), and is connected to the bit line contact plug 57 that is disposed in an area closer to the sense amplifier SAa in the active region 31 (or on a one end side of the active region 31), and then is extended in an X1 direction that is tilted with respect to the X direction, and is bent on the element isolation region 20 (first element isolation region 21) adjacent to the active region 31 before being extended in the X direction.

Then, the global bit line 61 is bent at the other end side of the active region 31 in an X2 direction that is inclined with respect to the X direction, and is bent in the X direction above the other end side of the active region 31, and is connected to the bit line contact plug 57 in the active region 32 that is adjacent in the X direction. That is, according to the present embodiment, as shown in FIG. 59, a global bit line 61 does neither intersect nor overlap with memory cells in the active regions 31 and 32. Therefore, it is possible to maximize formation areas of the capacitance contact plugs 46.

Also, focusing on a global bit line 62 connected to the sense amplifier SAb, the global bit line 62 that is pulled out from the sense amplifier SAb is connected to the bit line contact plug 57 that is disposed in an area closer to the sense amplifier SAb in an active region 34 (or at the other end side of the active region 34), and then is extended in an X2 direction that is tilted with respect to the X direction, and is bent on the element isolation region 20 (first element isolation region 21) adjacent to the active region 34 before being extended in the X direction. Then, the global bit line 62 is bent at a one end side of the active region 34 in an X1 direction that is tilted with respect to the X direction, and is bent above the one end side of the active region 34 in the X direction, and is connected to the bit line contact plug 57 of an active region 33 that is adjacent in the X direction. That is, as in the case of the global bit line 61 connected to the sense amplifier SAa, the global bit line 62 does neither intersect nor overlap with the active regions 33 and 34. Therefore, it is possible to maximize formation areas of the capacitance contact plugs 46.

Incidentally, in the case of FIG. 59, the bit line contact plugs 57 corresponding to the active regions 31 and 32 are disposed at end portions of the active regions 31 and 32 that are closer to the sense amplifier SAa. However, the bit line contact plugs 57 may be disposed at end portions of the active regions 31 and 32 that are farther from the sense amplifier SAa. Similarly, in the case of FIG. 59, the bit line contact plugs 57 corresponding to the active regions 33 and 34 are disposed at end portions of the active regions 33 and 34 that are closer to the sense amplifier SAb. However, the bit line contact plugs 57 may be disposed at end portions of the active regions 33 and 34 that are farther from the sense amplifier SAb. The above arrangement is made possible by appropriately modifying the configurations of sense amplifiers connected to the global bit lines 61 and 62.

Incidentally, in the present embodiment, three kinds of embedded wires are disposed in one active region: the word lines 42 each of which serves as a gate electrode of a transistor for a memory cell; the dummy word lines 72 each of which is used for element isolation; and the switching word lines 52 each of which is used for a switching transistor. All the wires have the same configuration.

Also, though the configuration explained in reference to FIG. 59 is an example in which two of the active regions 30 are arranged in the X direction in an area between the two sense amplifiers SAa and SAb, and the two active regions 30 are connected through the global bit lines 61 and 62, many more active regions 30 may be connected through the global bit lines 61 and 62 by repeating the above configuration in the X direction.

Figure 99:
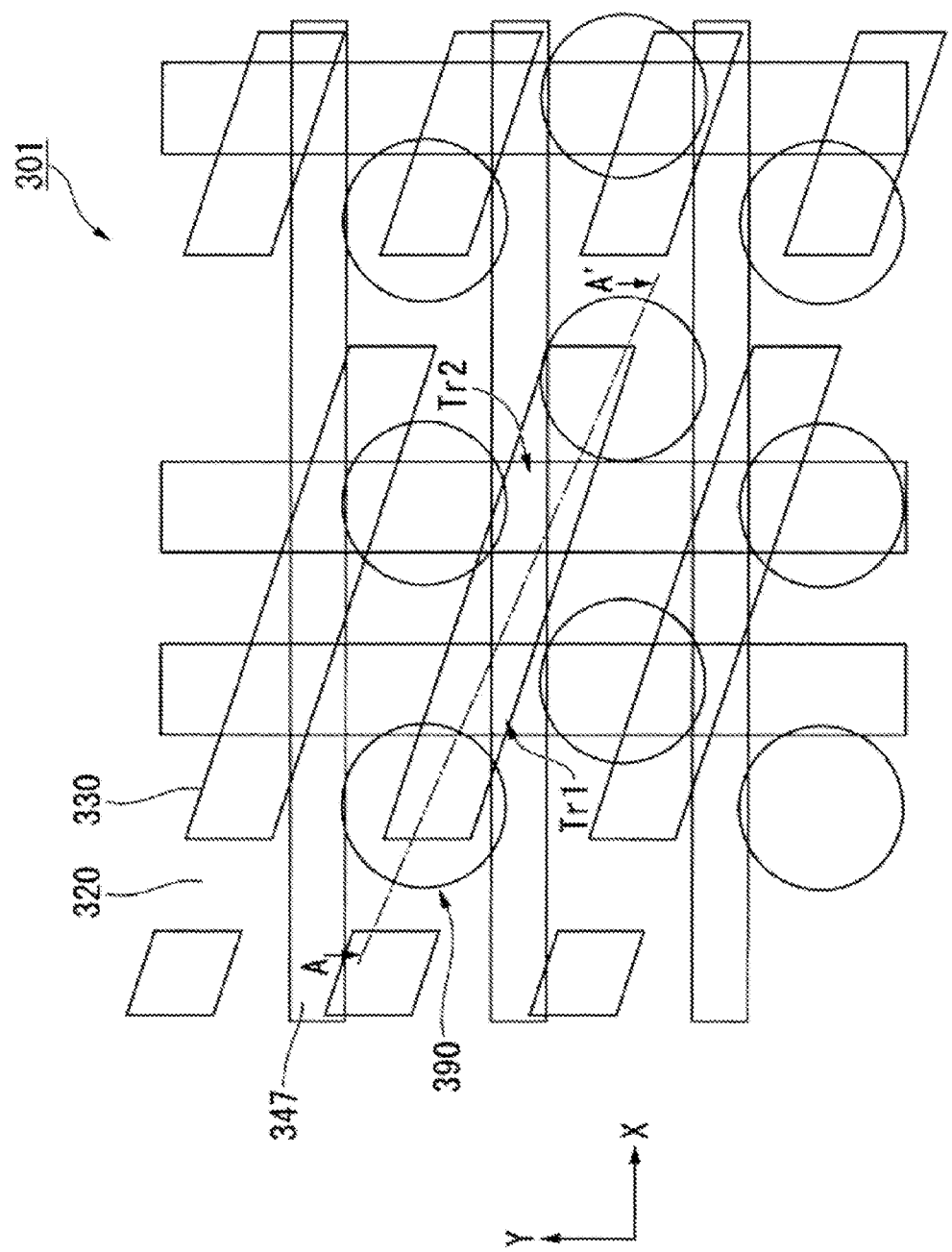
FIG. 99 is a plane view showing the configuration (layout) of a semiconductor device according to background art of the present invention.
Figure 100:
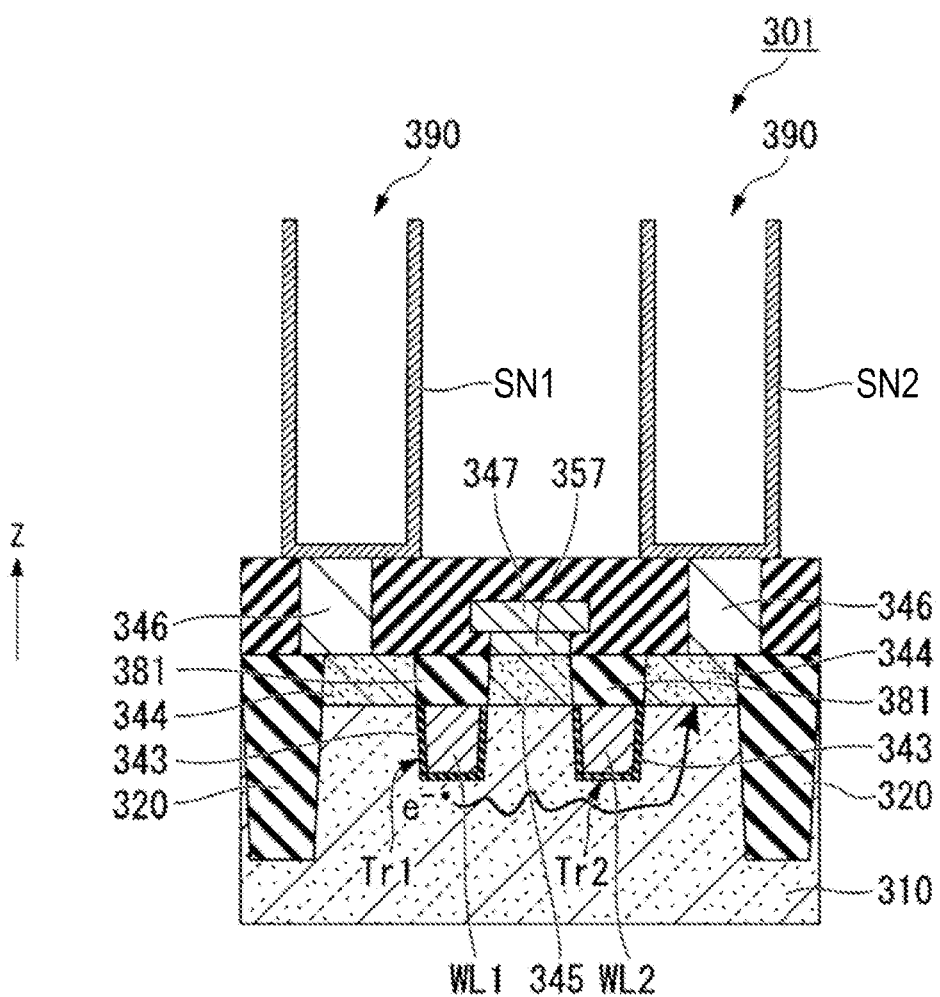
FIG. 100 is a cross-sectional view corresponding to a line A-A' shown in FIG. 99.

According to the configuration of the conventional semiconductor device shown in FIGS. 99 and 100, the bit line contact plug 357 is located at the center of the active region 330. Therefore, the bit line 347 always crosses the active region 330. However, the semiconductor device 100 shown in FIG. 59 is not configured to place a bit line contact plug 57 in a free space S. Incidentally, the free space means a space between the adjacent word lines 42 in the small active region 35, or a space between the switching word line 52 and word line 42 adjacent each other, as shown in FIGS. 60 and 61. That is, in the present embodiment, the free space means a region of a semiconductor pillar 41 between the adjacent word lines 42 in the small active region 35, and a region of the semiconductor pillar 51 between the switching word line 52 and word line 42 adjacent each other.

In the present embodiment, the semiconductor device 100 has a hierarchical bit line structure in which the local bit line 44 is embedded below each of the active regions 30, and the local bit line 44 is connected to the bit line contact plug 57 that is disposed at a one end side or at the other end side of the active region 30, and, on the semiconductor substrate 10, the global bit lines 61 and 62 that are disposed as first lines closest to the semiconductor substrate 10 are connected to the bit line contact plug 57.

Figure 62:
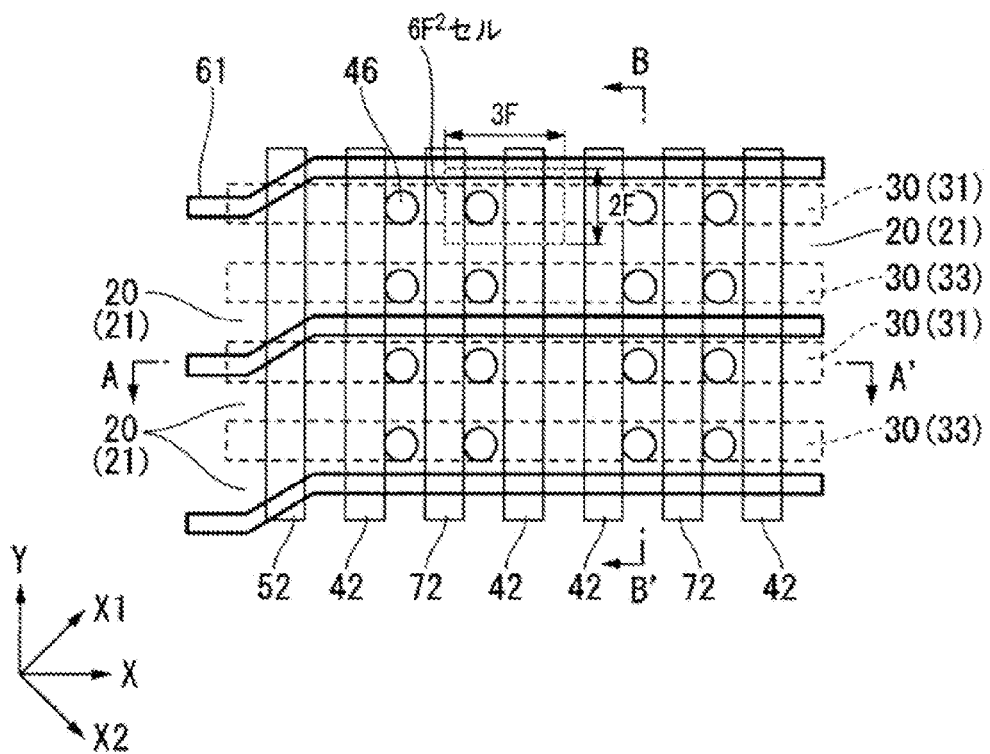
FIG. 62 is a plane view showing an enlarged portion of the semiconductor device 100 shown in FIG. 59.

As shown in FIG. 62, if the width (size in the Y direction) of each of the active regions 30, the width (size in the Y direction) of the first element isolation region 21 that is sandwiched between the active regions 30 and extends in the X direction, the width (size in the X direction) of the word line 42 and dummy word line 72 each extending in the Y direction, the intervals of the active regions 30, the intervals of the first element isolation regions 21, the intervals of the adjacent word lines 42, and the intervals of the word lines 42 and the dummy word lines 72 are a value of F, a layout of a DRAM memory cell according to the present embodiment is of a $6F^2$ structure. That is, one memory cell is formed in a region that is 3F in the X direction and 2F in the Y direction.

The conventional semiconductor device shown in FIGS. 99 and 100 is also of a $6F^2$ structure. However, in the conventional semiconductor device 301, a bit line 347 is connected to an area between the word lines WL1 and WL2 that are adjacent to each other in the active region 330. In contrast, in the semiconductor device of the present embodiment, no bit line is connected to an area between the word lines 42 that are adjacent to each other in the small active region 35. Incidentally, the value of F is equivalent to a minimum feature size defined by lithography technique.

Figure 63:
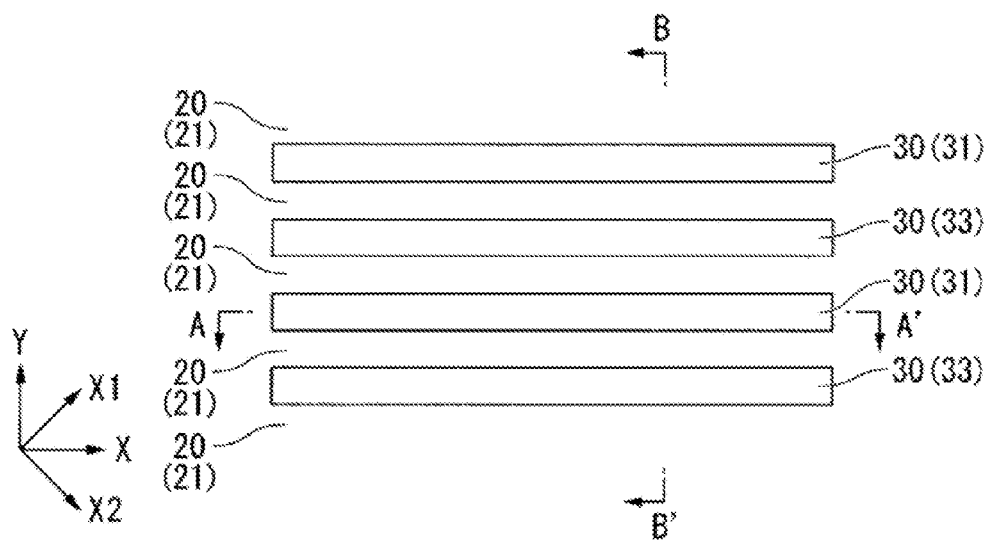
FIG. 63 is a plane view schematically showing a manufacturing process of the semiconductor device 100 shown in FIG. 59.
Figure 64:
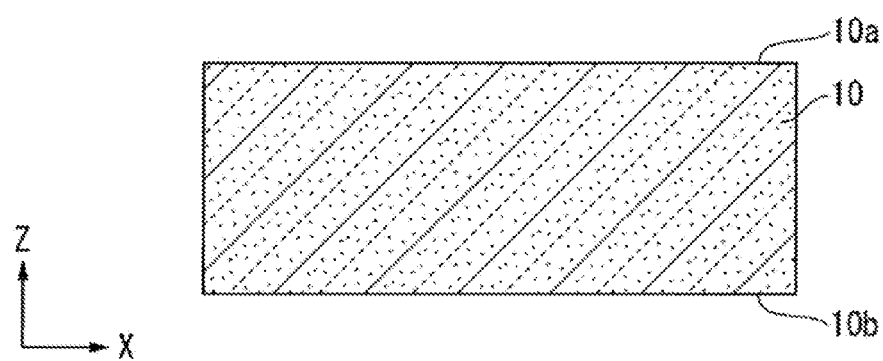
FIG. 64 is a cross-sectional view of the semiconductor device 100 corresponding to a line A-A' shown in FIG. 63.
Figure 65:
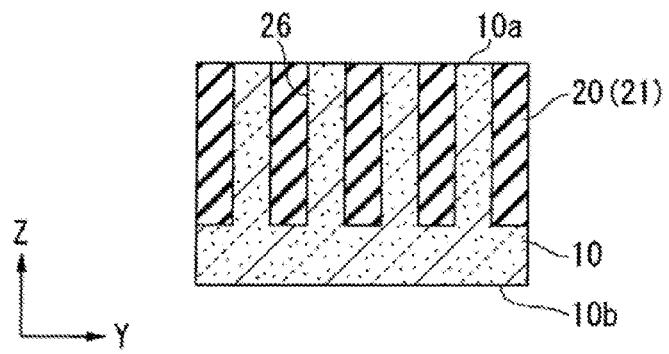
FIG. 65 is a cross-sectional view of the semiconductor device 100 corresponding to a line B-B' shown in FIG. 63.

The following describes a method of manufacturing a semiconductor device 100 according to the present embodiment, with reference to FIGS. 63 to 87. Incidentally, the manufacturing method of the semiconductor device 100 described here is one example of the manufacturing method of the semiconductor device shown in FIG. 62. First, as shown in FIGS. 63 to 65, the first element isolation trenches 26 extending in the X direction are formed on an upper surface 10a of a semiconductor substrate 10, by means of a lithography method and an anisotropic dry etching method. Then, the first element isolation regions 21 are formed by embedding an insulation film made from a silicon nitride film or a silicon oxide film in the first element isolation trenches 26. As for the semiconductor substrate 10, for example, p-type single-crystal silicon is preferably used. In this case, an impurity that is contained in the p-type silicon is preferably boron and the concentration of the boron is preferably $1 \times 10^{15}$ atoms/cm$^3$. The following describes the case where the semiconductor substrate 10 is made of p-type single-crystal silicon.

The depth from the upper surface 10a of the semiconductor substrate 10 (or upper surfaces of the first element isolation regions 21) to lower surfaces of the first element isolation regions 21 is set to 250 nm. Accordingly, the active regions 30 that are sandwiched between the first element isolation regions 21 and extends in the X direction are formed. Though FIG. 63 shows four active regions 30, the present invention is not limited to the four active regions 30 and many more active regions may be formed. The width (size in the Y direction) of the active regions 30 and the width (size in the Y direction) of the first element isolation regions 21 are equal to the value of F. Therefore, in the active regions 30, the same structure is repeated at a pitch of 2F in the Y direction.

Figure 66:
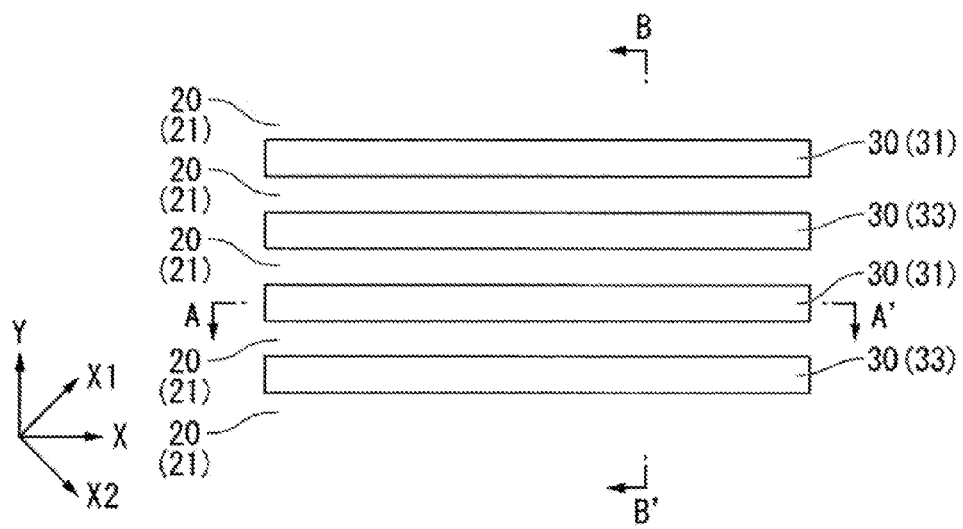
FIG. 66 is a plane view schematically showing a manufacturing process of the semiconductor device 100 shown in FIG. 59.
Figure 67:
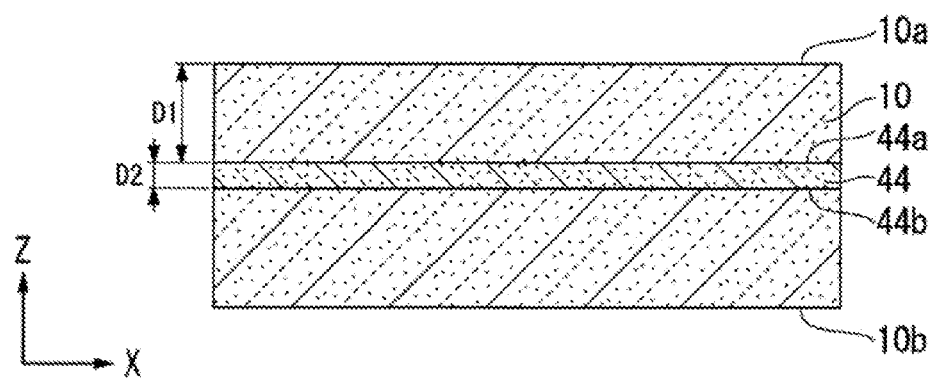
FIG. 67 is a cross-sectional view of the semiconductor device 100 corresponding to a line A-A' shown in FIG. 66.
Figure 68:
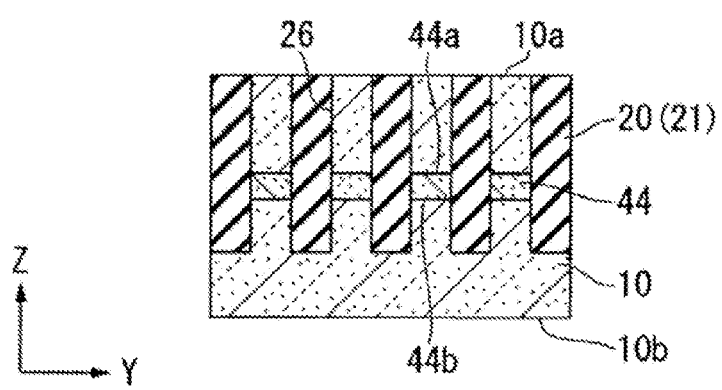
FIG. 68 is a cross-sectional view of the semiconductor device 100 corresponding to a line B-B' shown in FIG. 66.

Then, as shown in FIGS. 66 to 68, the local bit lines 44 (lower diffusion layers, impurity diffusion layers) are formed by carrying out ion implantation of n-type impurity, such as phosphorus, for example, from the upper surface 10a's side of the semiconductor substrate 10 and performing thermal treatment at 1,000 degrees for 10 seconds. The local bit lines 44 are so formed that the impurity concentration is $1\times10^{20}$ to $1\times10^{21}$ atoms/cm$^3$. The local bit lines are so formed that the depth from the upper surface 10a of the semiconductor substrate 10 to a lower surface of each of the local bit lines 44 is shallower than the depth from the upper surface 10a of the semiconductor substrate 10 to a bottom surface of the first element isolation region 21.

In this case, the depth D1 from the upper surface 10a of the semiconductor substrate 10 to an upper surface 44a of a local bit line 44 is set to 140 nm, for example. Also, the thickness D2 of the local bit line 44 is set to 50 nm, for example. Accordingly, the depth (D1+D2) of a bottom surface 44b of the local bit line is 190 nm, shallower than the depth of the bottom surface 21b of the first element isolation region 21 which is 250 nm. According to such a configuration, in planar view, the local bit line 44 is formed in an entire region that is located at a specific depth in each of the active regions 30. Moreover, as shown in FIG. 68, in the Y-direction cross-section, a plurality of local bit lines 44, which are divided by the first element isolation regions 21, are formed.

Figure 69:
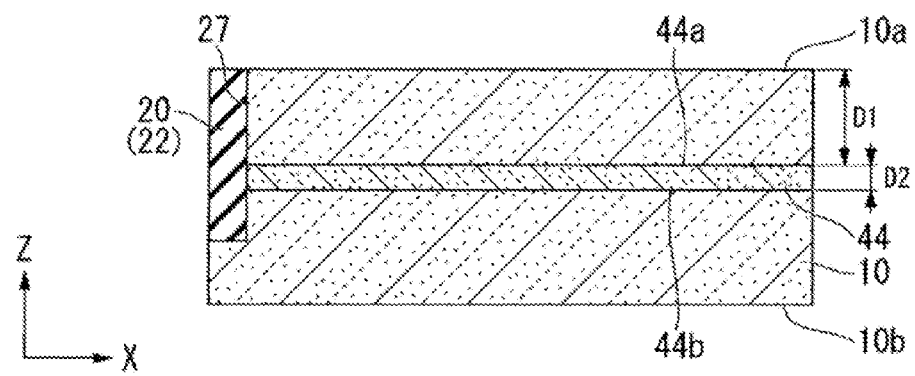
FIG. 69 is a cross-sectional view of a semiconductor device 100 corresponding to a line A-A' shown in FIG. 66 and showing the next step of the manufacturing process shown in FIG. 66.

Then, as shown in FIG. 69, the second element isolation trenches 27 with a depth of 250 nm that extend in the Y direction are formed by means of a lithography method and an anisotropic dry etching method. Then, as in the case of forming the first element isolation regions 21, the second element isolation regions 22 are formed by embedding an insulation film in the second element isolation trenches 27. As a result, as shown in FIG. 59, each of the active regions 30 is surrounded by the first element isolation regions 21 which are adjacent in the Y direction, and the second element isolation regions 22 which are adjacent in the X direction and extends in the X direction in the shape of a strip. In this manner, element isolation regions 20 having first element isolation regions 21 and second element isolation regions 22 are formed.

Figure 70:
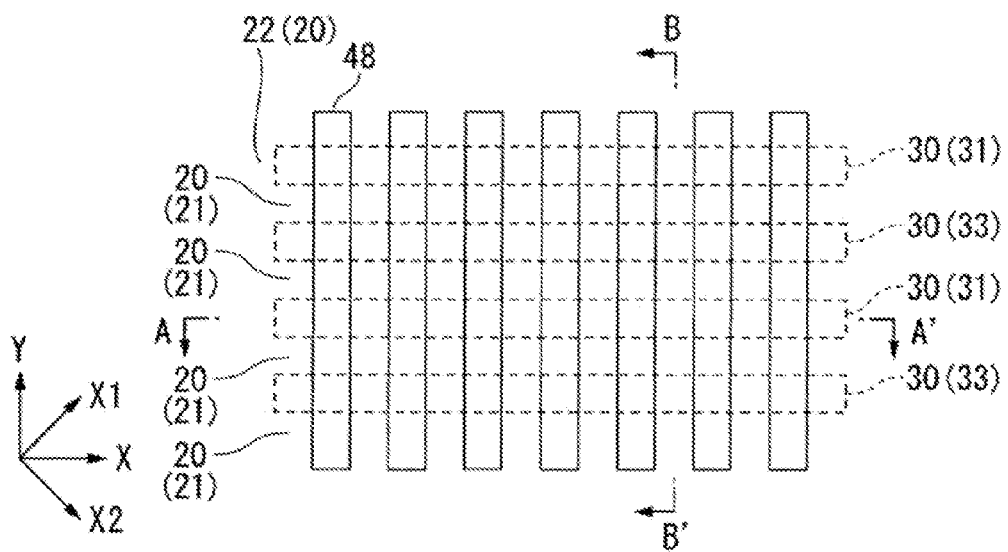
FIG. 70 is a plane view schematically showing a manufacturing process of the semiconductor device 100 shown in FIG. 59.
Figure 71:
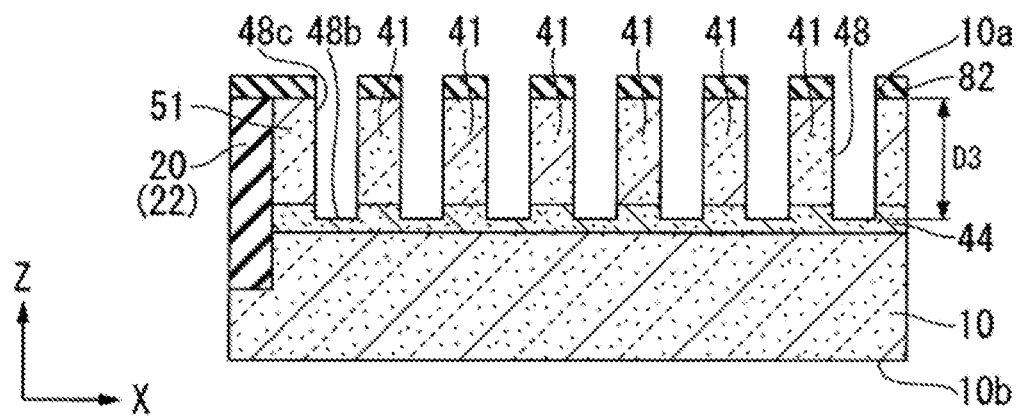
FIG. 71 is a cross-sectional view of the semiconductor device 100 corresponding to a line A-A' shown in FIG. 70.
Figure 72:
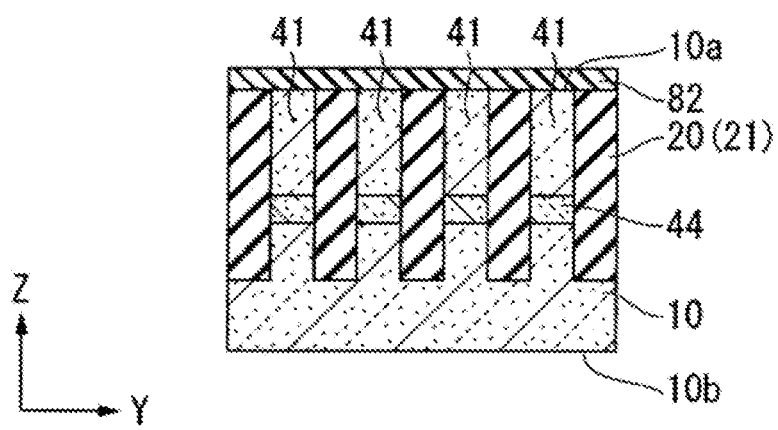
FIG. 72 is a cross-sectional view of the semiconductor device 100 corresponding to a line B-B' shown in FIG. 70.

Then, after second element isolation regions 22 are formed, as shown in FIGS. 70 to 72, a first interlayer insulation film 82 made from a silicon oxide film is formed on the upper surface 10a of the semiconductor substrate 10 by a CVD method. Then, a lithography method and an anisotropic dry etching method are used to perform etching of the first interlayer insulation film 82, forming a mask pattern having openings that extend in a Y direction perpendicular to a direction (X direction) in which active regions 30 extend. The width and intervals in the X direction of the mask pattern is equal to the value of F. Incidentally, in FIG. 70, the first interlayer insulation film 82 is not shown.

Furthermore, as shown in FIG. 71, word trenches 48 (trenches, grooves) that reach a local bit line 44 are formed by carrying out etching of the semiconductor substrate 10 by means of an anisotropic dry etching method using the mask pattern made from the first interlayer insulation film 82 as a mask. The word trenches 48 need to be so formed as not to go deeper than a bottom surface 44b of the local bit line 44, so that bottom surfaces 48b of the word trenches 48 come in contact with the local bit line 44. If the word trenches 48 are not deep enough, and the bottom surfaces 48b of the word trenches 48 are therefore not in contact with the local bit line 44, a disturb failure cannot be avoided. If the word trenches 48 are too deep, the local bit line 44 becomes divided, making it impossible to form a continuous local bit line 44 (lower diffusion layer) that is common to a plurality of transistors 40 which are formed finally. For such a reason, the word trenches 48 are formed at the above-described positions.

In this case, a word trench 48 is so formed that the depth D3 from the upper surface 10a of the semiconductor substrate 10 to the bottom surface 48b of the word trench 48 is 150 nm. By doing so, a local bit line with a thickness of 40 nm remains unremoved below the bottom surface 48b of the word trench 48. As a result, for each of the local bit lines 44 each extending in the X direction in the corresponding active region 30, a plurality of word trenches 48 are so formed that a portion of its side face 48c and its bottom face 48b are in contact with the local bit line 44. Since the word trenches 48 are formed as described above, the semiconductor pillars 41 which are so formed as to be surrounded by the first element isolation regions 21 and the word trenches 48 are formed. Moreover, in an end portion in the X direction of the active region 30, as shown in FIG. 70, the semiconductor pillar 51 whose side surface 48c perpendicular to the X direction is surrounded by the second element isolation region 22 and the word trench 48 and whose side surface perpendicular to the Y direction is surrounded by the first element isolation region 21. The semiconductor pillars 41 and 51 are rectangular in shape in planar view.

Figure 73:
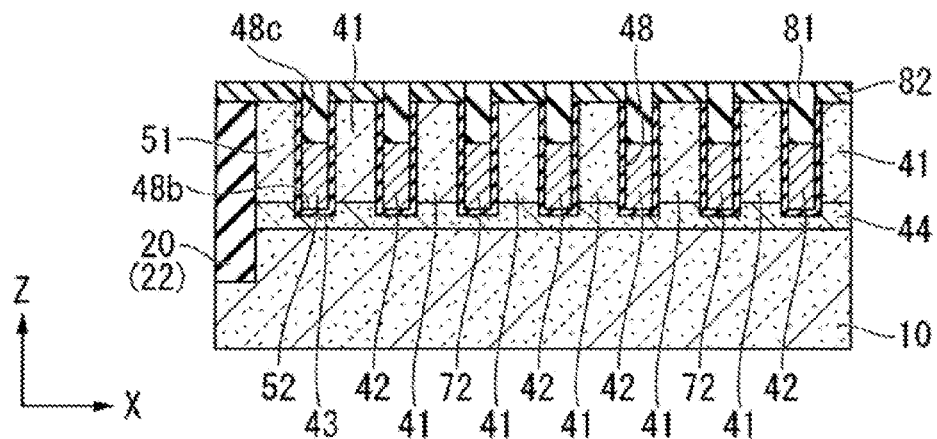
FIG. 73 is a cross-sectional view of a semiconductor device 100 corresponding to a line A-A' shown in FIG. 70 and showing the next step of the manufacturing process shown in FIG. 70.

Then, as shown in FIG. 73, the gate insulation film 43 made from a silicon oxide film is formed on an inner surface of the word trench 48 by means of a thermal oxidation method. In the present embodiment, as described above, the word trench 48 is in contact with the local bit line 44 containing a high concentration of impurity. In this state, if the silicon oxide film is formed by the thermal oxidation method on the inner surface of the word trench 48, the film thickness of the silicon oxide film formed in portions of the bottom surface 48b and side surface 48c of the word trench 48 that are in contact with the local bit line 44 becomes thicker than the film thickness of the silicon oxide film formed in portions of the side surface 48c of the word trench 48 that are in contact with the semiconductor pillars 41 and 51.

For example, if a silicon oxide film with a thickness of 4 nm is formed in portions of the side surface 48c that are in contact with the semiconductor pillars 41 and 51 (semiconductor substrate 10), a silicon oxide film with a thickness of 5 nm to 6 nm is formed in portions of the side surface 48c that are in contact with the local bit line 44, and on the bottom surface 48b. Incidentally, the "portions of the side surface 48c that are in contact with the semiconductor pillars 41 and 51 (semiconductor substrate 10)" include a portion that will become a channel of a vertical transistor, and a portion that will not contribute as a transistor. The 4 nm silicon oxide film is formed in all the portions. A difference in the film thickness is caused by a difference in the concentration of impurity contained in a material to be oxidized. That is, the concentration of impurity contained in the semiconductor substrate 10 is low, and is $1\times10^{15}$ to $1\times10^{16}$ atoms/cm$^3$; the concentration of impurity contained in the local bit line 44 is high, and is $1\times10^{20}$ to $1\times10^{21}$ atoms/cm$^3$. In the highly-concentrated portions, accelerated oxidation of impurity occurs, making the silicon oxide film thicker.

In the present embodiment, a configuration in which the formation of the local bit line 44 takes place before the formation of the gate insulation film 43 is adopted. Therefore, it is possible to increase the film thickness of a silicon oxide film that is formed in portions of an inner surface of the word trench 48 that are in contact with the local bit line 44 in a self-alignment manner. The portions that are in contact with the local bit line 44 do not function as a channel of a transistor. That is, the portions have no impact on transistor characteristics. Therefore, in order to improve the reliability of the gate insulation film 43, the portions are preferably made thicker.

Also, in the present embodiment, by making use of a difference in the concentration of impurity contained, the film thickness of a silicon oxide film in the portions that are in contact with the local bit line 44 is made thicker in a self-alignment manner. In order to more effectively initiate the above-described accelerated oxidation, it is preferred that water vapor ($H_2O$) be contained in an oxidizing atmosphere at a time when the gate insulation film 43 is formed. The ambient temperature at the time of oxidization is preferably relatively low, e.g. in the range of 700 degrees Celsius to 850 degrees Celsius.

After the gate insulation film 43 is formed, a metal film is stacked across the entire surface of the upper surface 10a's side of the semiconductor substrate 10 in such a way as to fill the word trenches 48. For the metal film, a titanium nitride film or a tungsten film is preferably used. Then, as shown in FIG. 73, a wire extending in the Y direction is formed in each of the word trenches 48 by carrying out etch back of the metal film in such a way that an upper surface thereof is positioned inside the word trenches 48 by means of a dry etching method. As a result, the following lines are formed: the switching word lines 52 each of which functions as a gate electrode of the switching transistor 50; the word lines 42 each of which functions as a gate electrode of the memory-cell transistor 40; and the dummy word lines 72 each of which is used for element isolation.

Then, an insulation film that is made from a silicon nitride film is formed across the entire surface. The film thickness of the insulation film formed is thick enough to cover upper surfaces of the word lines 42, the switching word lines 52, and the dummy word lines 72, as well as to fill the word trenches 48. Then, an insulation film formed on the first interlayer insulation film 82 is removed by means of a CMP method, thereby exposing an upper surface of the first interlayer insulation film 82 and forming the cap insulation film 81 that fills the word trenches 48. At this time, the upper surface of the first interlayer insulation film 82 is flush with an upper surface of the cap insulation film 81.

Figure 74:
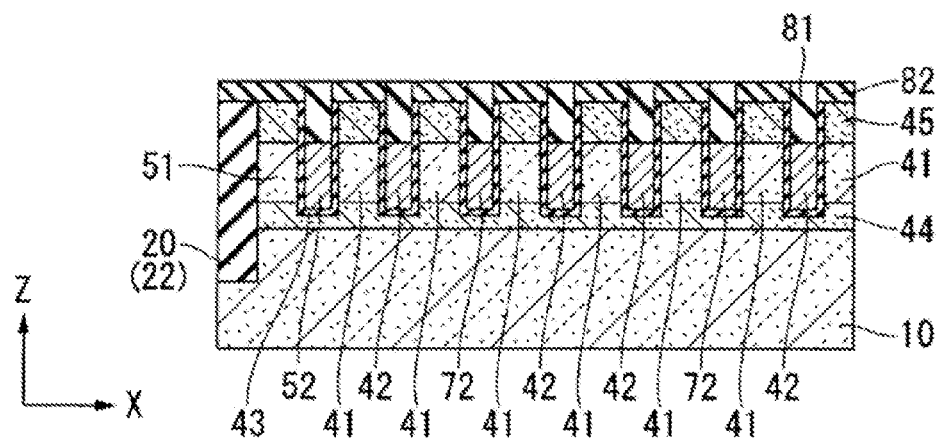
FIG. 74 is a cross-sectional view of a semiconductor device 100 corresponding to a line A-A' shown in FIG. 70 and showing the next step of the manufacturing process shown in FIG. 73.
Figure 75:
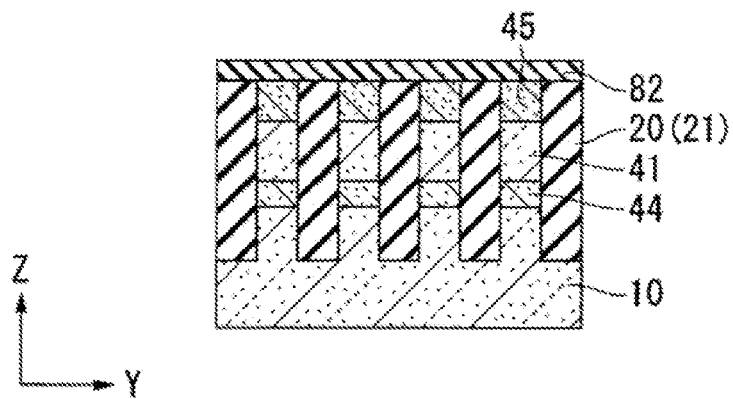
FIG. 75 is a cross-sectional view of a semiconductor device 100 corresponding to a line A-A' shown in FIG. 70 and showing the next step of the manufacturing process shown in FIG. 74.

Then, as shown in FIGS. 74 and 75, the upper diffusion layer 45 of the transistor 40 (vertical transistor) is formed by carrying out ion implantation of n-type impurity across the entire surface from the upper surface 10a's side of the semiconductor substrate 10. The concentration of impurity in the upper diffusion layer 45 is so set as to be lower than the concentration of impurity in the local bit line. More specifically, the concentration of impurity in the upper diffusion layer 45 is preferably set to $1 \times 10^{19}$ to $1 \times 10^{20}$ atoms/cm$^3$. The depth from the upper surface 10a of the semiconductor substrate 10 to a bottom surface of the upper diffusion layer 45 is so set as not to be deeper than the depth from the upper surface 10a of the semiconductor substrate 10 to upper surfaces of the word lines 42, the switching word lines 52, and the dummy word lines 72.

Figure 76:
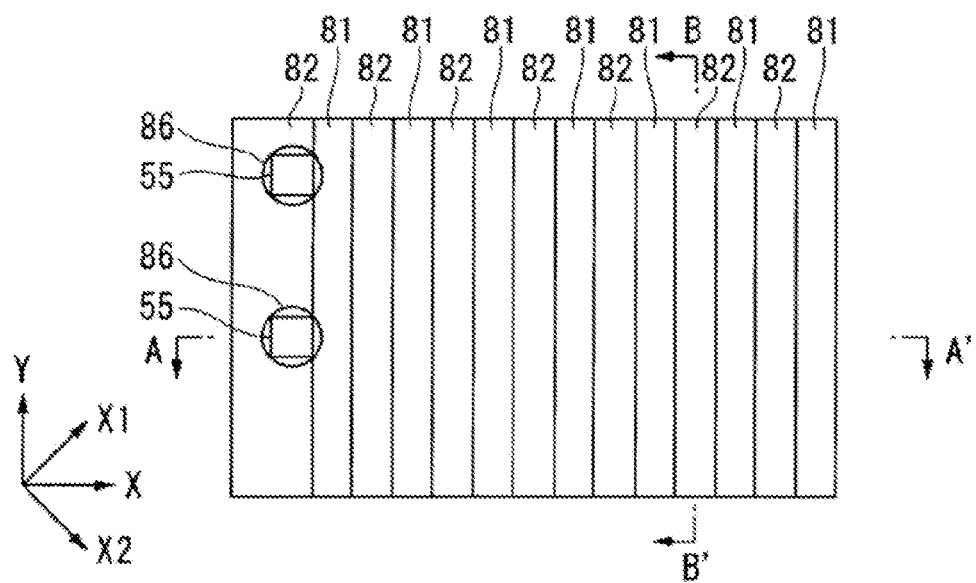
FIG. 76 is a plane view schematically showing a manufacturing process of the semiconductor device 100 shown in FIG. 59.
Figure 77:
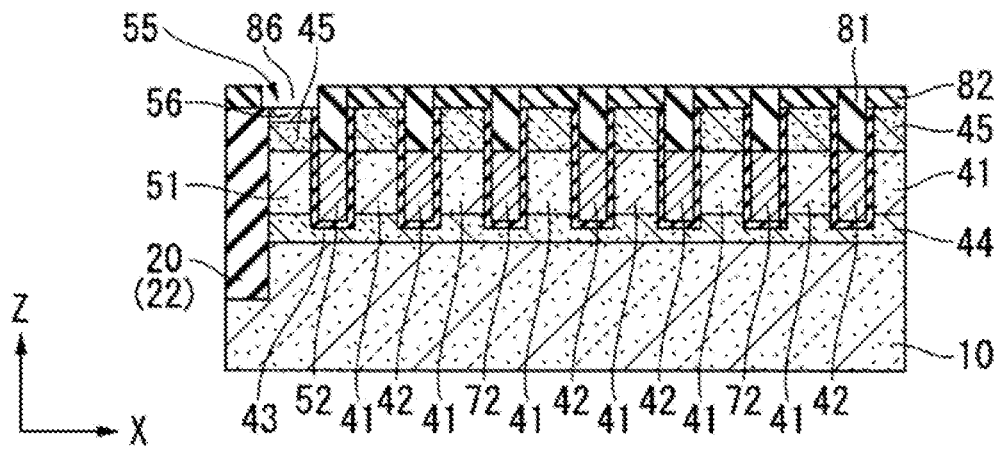
FIG. 77 is a cross-sectional view of the semiconductor device 100 corresponding to a line A-A' shown in FIG. 76.
Figure 78:
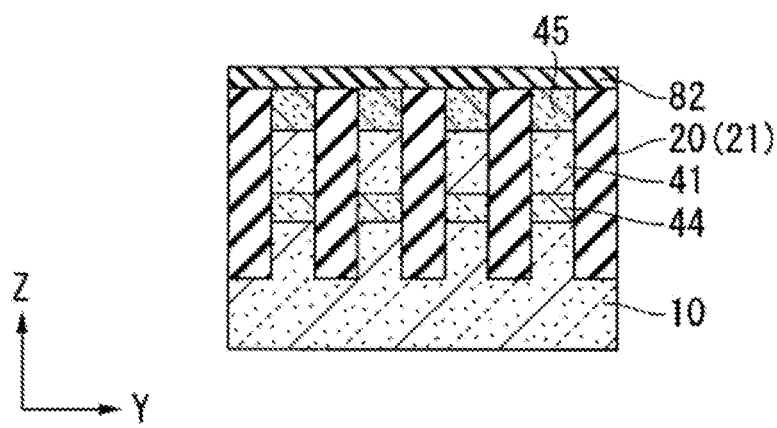
FIG. 78 is a cross-sectional view of the semiconductor device 100 corresponding to a line B-B' shown in FIG. 76.
Figure 79:
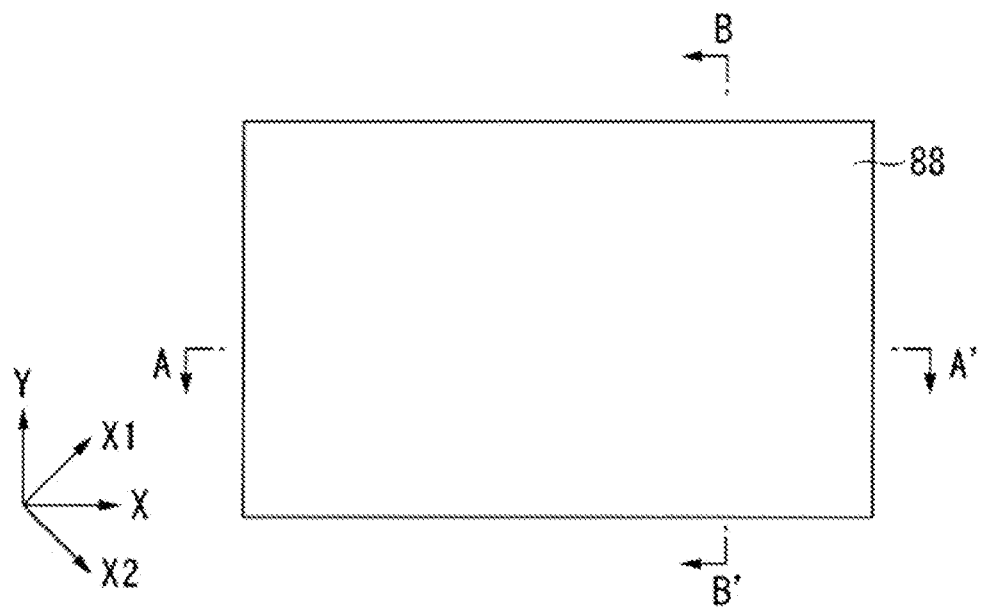
FIG. 79 is a plane view schematically showing a manufacturing process of the semiconductor device 100 shown in FIG. 59.

Then, as shown in FIGS. 76 to 78, a bit line contact hole 86 is formed in the first interlayer insulation film 82 by means of lithography and an anisotropic dry etching method. The bit line contact hole 86 is formed above the semiconductor pillar 51 which is located at one end of the active region 30. In the bit line contact hole 86, the upper diffusion layer 45 is exposed. The exposed region becomes a region that comes in contact with the bit line contact plug 57. Then, the highly-concentrated impurity diffusion layer 56 is formed by introducing a n-type impurity from the upper surface's side of the semiconductor pillar 51 by means of an ion implantation method. The highly-concentrated impurity diffusion layer 56 is formed in a portion of the upper surface's side of the upper diffusion layer 45 (impurity diffusion layer) that has been formed in advance. In this manner, the switching transistor upper diffusion layer 55 is formed.

Then, a silicon film containing phosphorus that will become a n-type impurity is formed on the upper surface 10a's side of the semiconductor substrate 10 in such a way as to be connected to the switching transistor upper diffusion layer 55 and fill the bit line contact hole 86. For the formation of the silicon film, a CVD method is preferably used. For source gases, for example, mono-silane ($SiH_4$) and phosphine ($PH_3$) are preferably used. Specific film-forming conditions are so controlled that the concentration of impurity contained in the silicon film is $1 \times 10^{20}$ to $1 \times 10^{21}$ atoms/cm$^3$.

Figure 80:
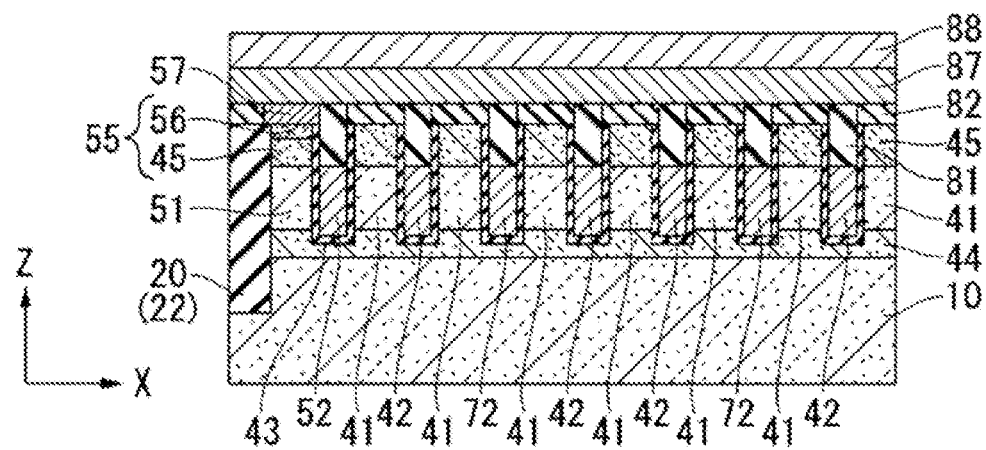
FIG. 80 is a cross-sectional view of the semiconductor device 100 corresponding to a line A-A' shown in FIG. 79.
Figure 81:
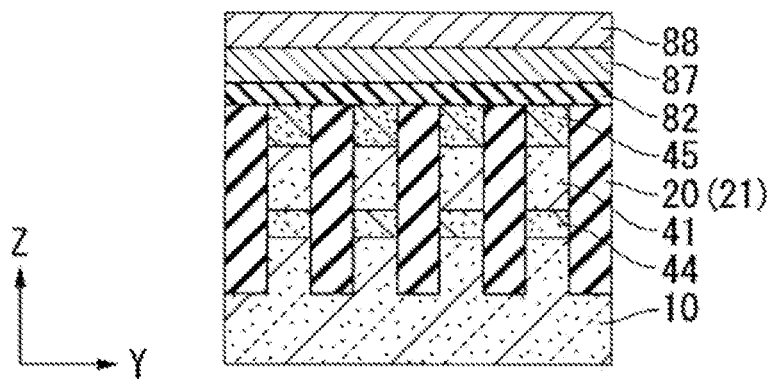
FIG. 81 is a cross-sectional view of the semiconductor device 100 corresponding to a line B-B' shown in FIG. 79.

Then, as shown in FIGS. 80 and 81, the bit line contact plug 57 is formed in the bit line contact hole 86 by removing the silicon film formed on the first interlayer insulation film 82 and the cap insulation film 81 by means of a CMP method. Then, as shown in FIGS. 80 and 81, with an upper surface of the bit line contact plug 57 exposed, a bit line material 87 is formed on the upper surface 10a's side of the semiconductor substrate 10. The bit line material 87 is made up of a laminated film in which a metal silicide film, a titanium nitride film, and a tungsten film are sequentially formed. On an upper surface of the bit line material 87, a cover insulation film 88 made from a silicon nitride film is formed.

Figure 82:
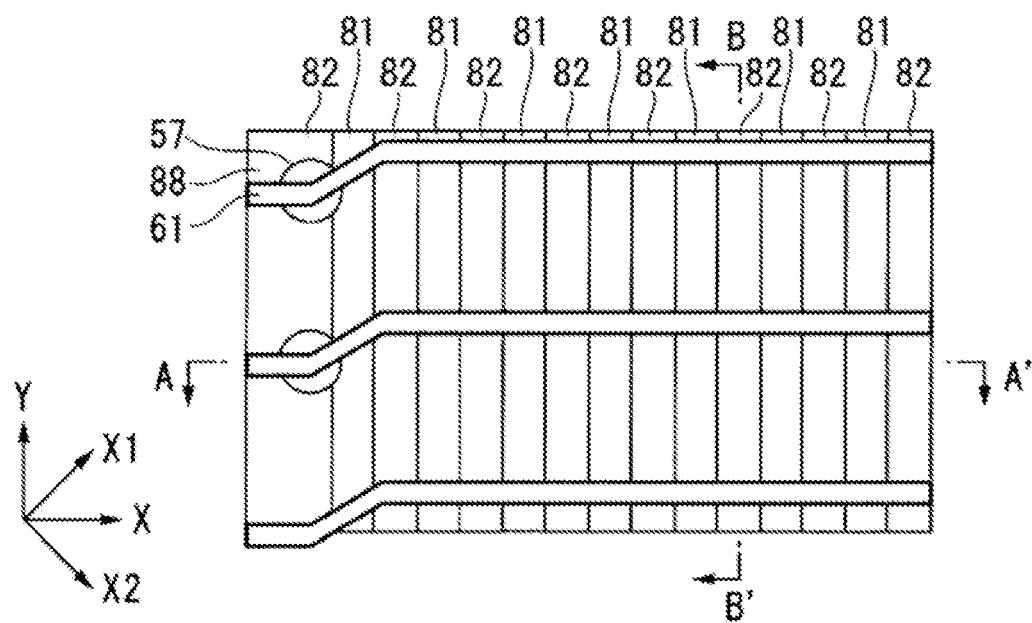
FIG. 82 is a plane view schematically showing a manufacturing process of the semiconductor device 100 shown in FIG. 59.
Figure 84:
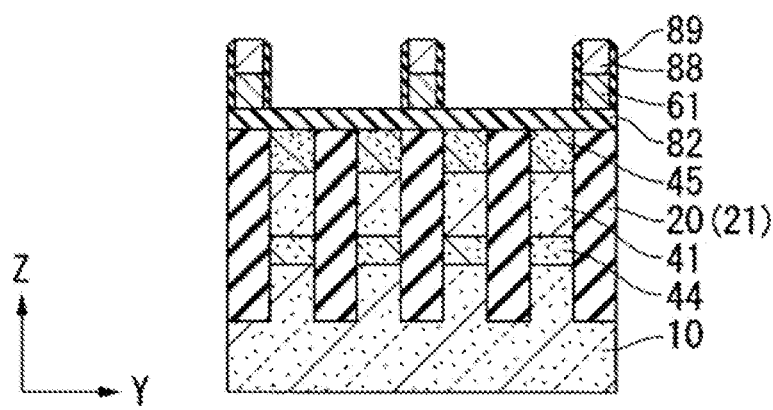
FIG. 84 is a cross-sectional view of the semiconductor device 100 corresponding to a line B-B' shown in FIG. 82.

Then, the global bit line 61 is formed as shown in FIGS. 82 and 84 by sequentially performing etching of the cover insulation film 88 and the bit line material 87 by means of a lithography method and an anisotropic dry etching method. The global bit line 61 is not disposed above the active region 30 in any region other than a region where the global bit line 61 is connected to the bit line contact plug 57. A global bit line 61 is formed as a pattern that extends in a direction (X direction) parallel to an active region 30 on the element isolation region 20 (first element isolation region 21). Incidentally, as shown in FIG. 84, patterning of the global bit lines 61 is performed in such a way that the width of the global bit lines 61 is equal to F/2. This patterning can be realized by means of a slimming method where a photoresist pattern that is formed at the stage of lithography so as to be equal to the value of F in width is made thinner by ashing.

Figure 83:
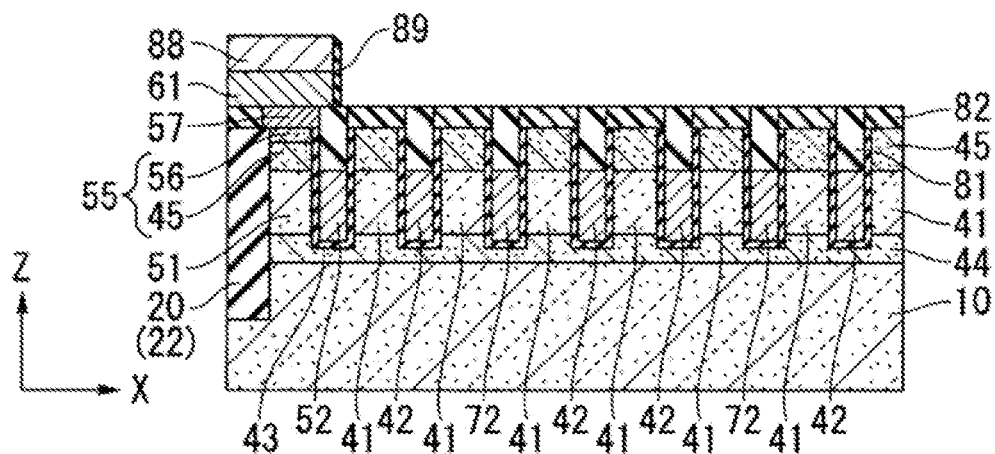
FIG. 83 is a cross-sectional view of the semiconductor device 100 corresponding to a line A-A' shown in FIG. 82.

Then, a silicon nitride film is formed across the entire surface so as to cover the upper surface 10a of the semiconductor substrate 10. Next, a sidewall insulation film 89 is formed on a side surface of the global bit line 61 as shown in FIGS. 83 and 84 by carrying out etch back of the silicon nitride film by means of an anisotropic dry etching method. At this time, a sidewall insulation film 89 is so formed that the film thickness of a silicon nitride filmmaking up a one-side sidewall insulation film 89 is equal to F/4. The silicon nitride film is deposited and formed by a CVD method. Therefore, by controlling the film thickness, it is possible to easily obtain the sidewall insulation film 89 having a desired width.

Figure 86:
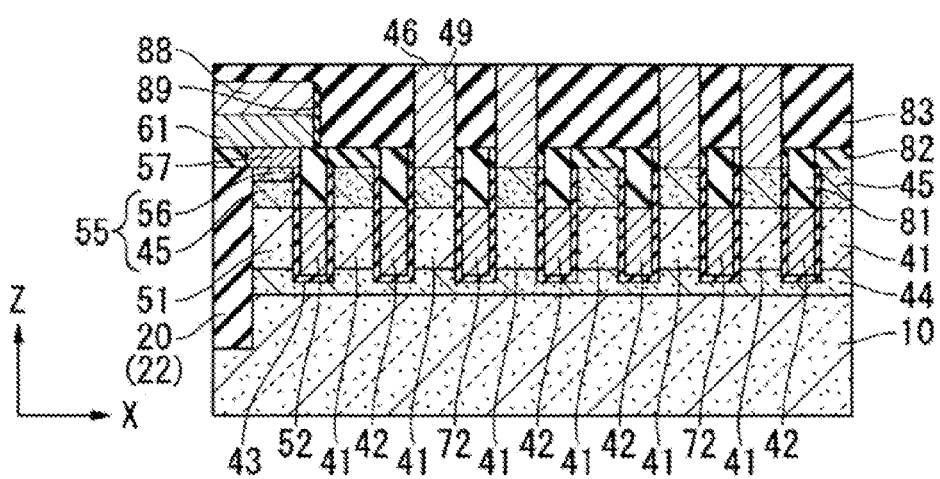
FIG. 86 is a cross-sectional view of the semiconductor device 100 corresponding to a line A-A' shown in FIG. 85.
Figure 87:
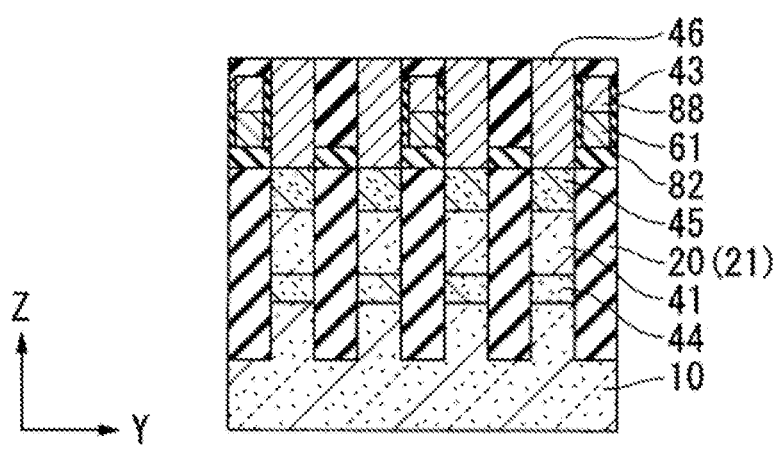
FIG. 87 is a cross-sectional view of the semiconductor device 100 corresponding to a line B-B' shown in FIG. 85.

Then, the second interlayer insulation film 83 is formed across the entire surface so as to cover the global bit line and the cover insulation film 88. In the present embodiment, the second interlayer insulation film 83 is made from a silicon oxide film. After that, as shown in FIGS. 86 and 87, a surface of the second interlayer insulation film 83 is flattened by means of a CMP method. Then, a capacitance contact hole 49 which is a formation region of a capacitance contact plug 46 is formed by means of a lithography method and an anisotropic dry etching method. From a bottom surface of the capacitance contact hole 49, an upper surface of the upper diffusion layer 45 is exposed.

As described above, in the present embodiment, the global bit line 61 is disposed above the element isolation region 20, and the global bit line 61 is so disposed as not to cross a formation region of the capacitance contact plug 46 in the active region 30. Therefore, the global bit line 61 does not overlap with a formation region of the capacitance contact plug 46. Accordingly, it is possible to form the capacitance contact hole 49 in a state that an area of an upper surface of the upper diffusion layer 45 to which the capacitance contact plug 46 is connected is sufficiently secured.

Figure 85:
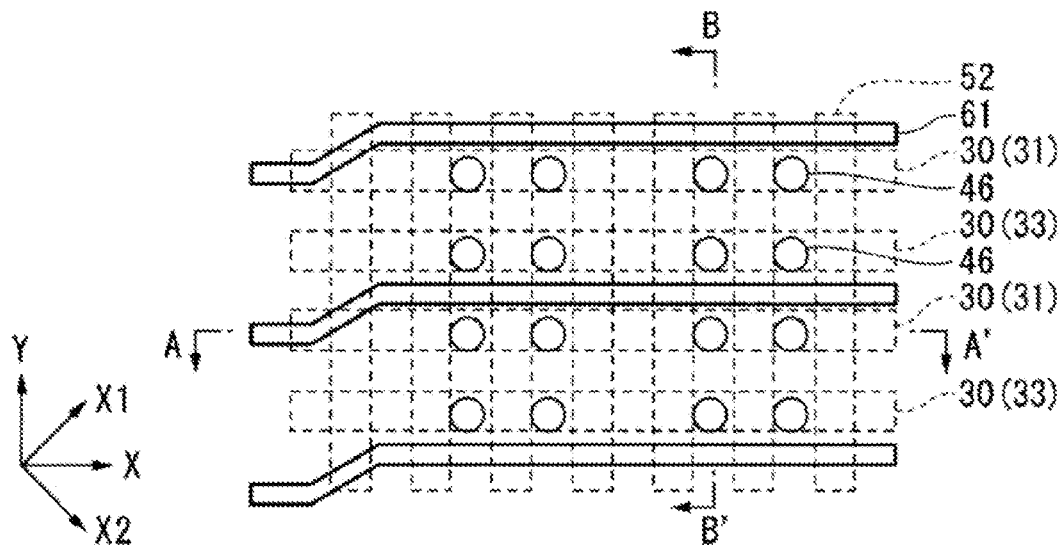
FIG. 85 is a plane view schematically showing a manufacturing process of the semiconductor device 100 shown in FIG. 59.

Then, a conductor is formed on the upper surface 10a's side of the semiconductor substrate 10 so as to fill a capacitance contact hole 49. The conductor is made from an impurity silicon film, a metal silicide film, a metal barrier film (metal nitride film), a tungsten film, or the like. After that, as shown in FIGS. 85 to 87, a portion of the formed conductor that is formed on the second interlayer insulation film 83 is removed by a CMP method, thereby forming the capacitance contact plug 46 in the capacitance contact hole 49 which is connected to the upper diffusion layer 45. Then, the lower electrode 91 which is connected to an upper surface of the capacitance contact plug 46, is formed. Furthermore, a process of forming the capacitance element 90 by sequentially stacking a capacitance insulation film (not shown) and an upper electrode (not shown) is carried out. As a result, the semiconductor device 100 shown in FIG. 59 is obtained.

As described above, according to the semiconductor device 100 of the present embodiment and the manufacturing method of the semiconductor device, the global bit line 61 is disposed above the element isolation region 20 (first element isolation region 21) and is so formed as not to cross the active region 30 below the lower electrode 91. Therefore, it is possible to sufficiently secure a formation region of the capacitance contact plug 46 that is connected to the lower electrode 91. Thus, it is possible to increase a contact area of the capacitance contact plug 46 and the lower electrode 91, and to reduce contact resistance between them.

Also, according to the present embodiment, the global bit line 61 includes the linear portion 63 that extends in the X direction, and the linear portion 63 is disposed on the element isolation region 20. Therefore, a formation region of the capacitance contact plug 46 is not narrowed by the global bit line 61. Furthermore, below a lower electrode 91, the global bit line 61 does neither intersect nor overlap with the active region 30, making it possible to broaden a region where the capacitance contact plug 46 can be formed.

Moreover, the global bit line 61 is so formed as to be connected to the local bit line 44 via the switching transistor 50 and the bit line contact plug 57, which are formed at a one end side or at the other end side of the active region 30. Therefore, the local bit line 44 and the global bit line 61 can be electrically connected without crossing the active region 30 below the lower electrode 91 and the global bit line 61. Moreover, it is possible to sufficiently secure a formation region of the capacitance contact plug 46.

Moreover, in the active region 30, the local bit line 44 is continuously formed across an entire region that goes in a direction in which the active region 30 is extended in planar view. Therefore, electric charges that emerge and stray during the operation of transistors vanish by being absorbed by the local bit line 44. Thus, it is possible to curb the occurrence of a disturb failure between the adjacent transistors 40.

The switching transistor upper diffusion layer 55 which is formed below the bit line contact plug 57 includes the upper diffusion layer 45 and the highly-concentrated impurity diffusion layer 56 (highly-concentrated impurity layer). Since the concentration of impurity in the upper diffusion layer 45 is set to $1 \times 10^{19}$ to $1 \times 10^{20}$ atoms/cm$^3$, if the upper diffusion layer 45 is connected directly to the bit line contact plug 57, the problem arises that contact resistance between the upper diffusion layer 45 and the bit line contact plug 57 becomes large. According to the present embodiment, between an upper diffusion layer 45 and a bit line contact plug 57, a highly-concentrated impurity diffusion layer 56 whose concentration is $1 \times 10^{20}$ to $1 \times 10^{21}$ atoms/cm$^3$ is provided. Therefore, it is possible to reduce contact resistance between the bit line contact plug 57 and the switching transistor upper diffusion layer 55.

The following describes a semiconductor device according to a fourth embodiment of the present invention, and a method of manufacturing the semiconductor device, with reference to FIGS. 88 to 93. The configuration of a semiconductor device 101 of the present embodiment is the same as that of the third embodiment except that the dummy word line 72 is replaced with an insulation film 173. Therefore, the same portions are represented by the same reference symbols, and will not be described in detail.

Figure 88:
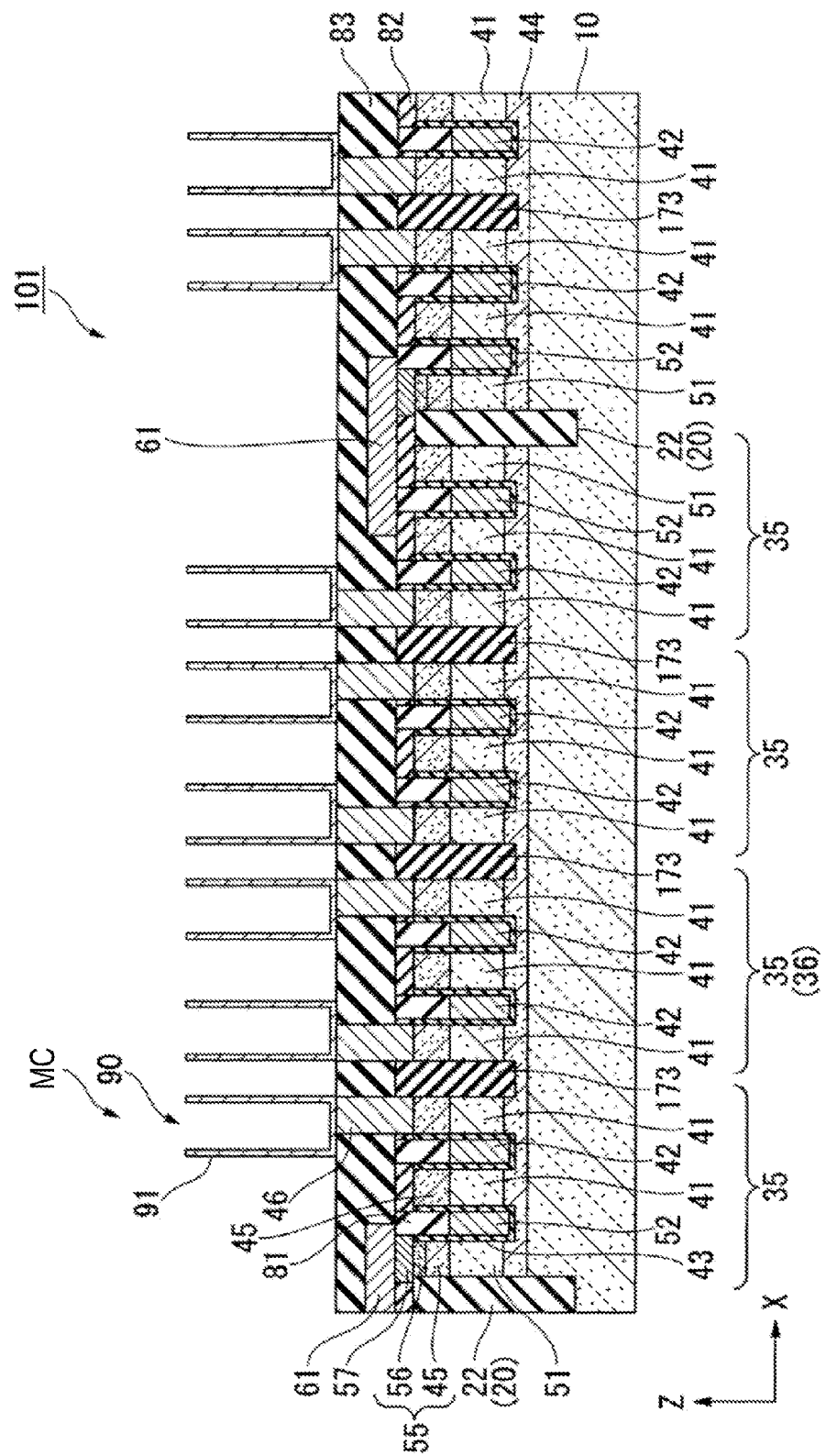
FIG. 88 is a plane view showing the schematic configuration of a semiconductor device 101 according to a fourth embodiment of the present invention.

As shown in FIG. 88, the semiconductor device 101 of the present embodiment is different from the semiconductor device 100 of the third embodiment in that an insulation film 173 is formed in a word trench 48 that is located between the semiconductor pillars 41 that are disposed below the adjacent lower electrodes 91. The depth of the word trench 48 in which the insulation film 173 is embedded is equal to the depth of the word line 42, as in the case of the third embodiment. Accordingly, a bottom surface of the word trench 48 is located higher than a bottom surface of the element isolation region 20. The active region 30 is divided into four small active regions 35 by the insulation film 173.

Figure 89:
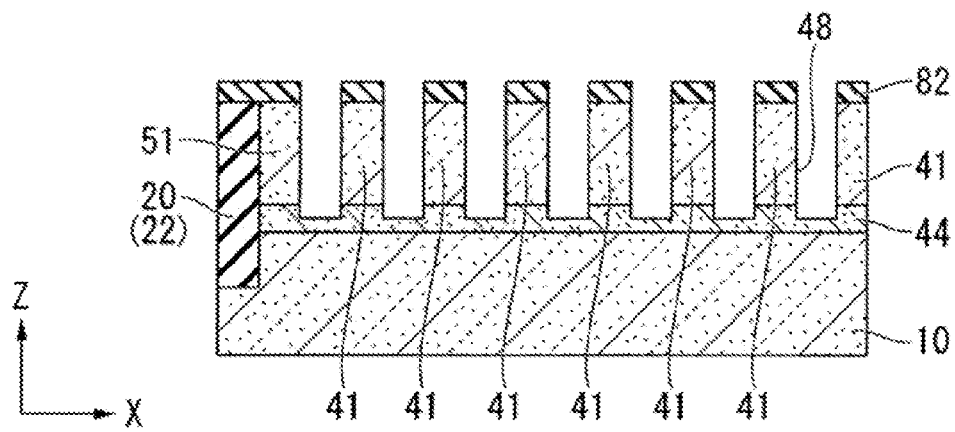
FIGS. 89 to 93 are cross-sectional views each showing a manufacturing process of the semiconductor device 101 shown in FIG. 88.
Figure 90:
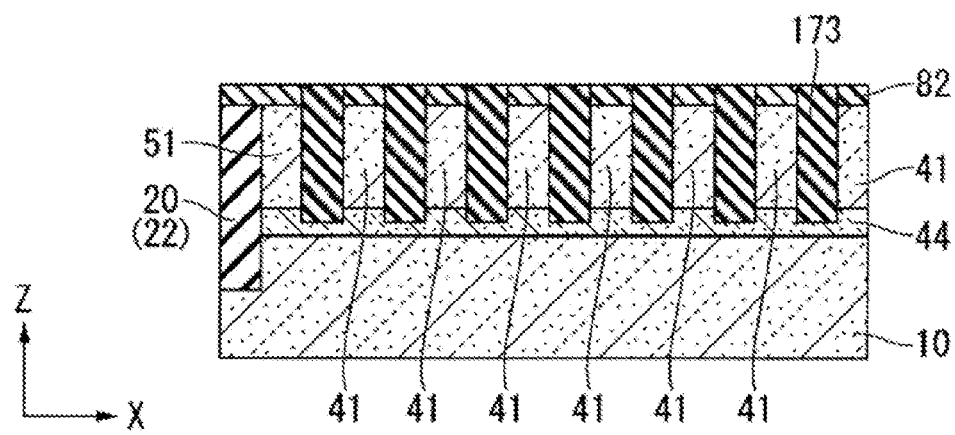

The following describes a manufacturing method of the semiconductor device according to the present embodiment. From the start to a process of forming word trenches 48, the manufacturing method of the semiconductor device of the present embodiment is the same as the manufacturing method of the semiconductor device of the third embodiment. After word trenches 48 are formed as shown in FIG. 89, an insulation layer that is made from a silicon nitride film is so formed as to fill the word trenches 48 as shown in FIG. 90. Then, a portion of the silicon nitride film that is formed on the first interlayer insulation film 82 is removed by a CMP method, thereby exposing an upper surface of the first interlayer insulation film 82. As a result, each of the word trenches 48 is filled with an insulation film 173. At this time, an upper surface of the first interlayer insulation film 82 is flush with an upper surface of the insulation film 173.

Figure 91:
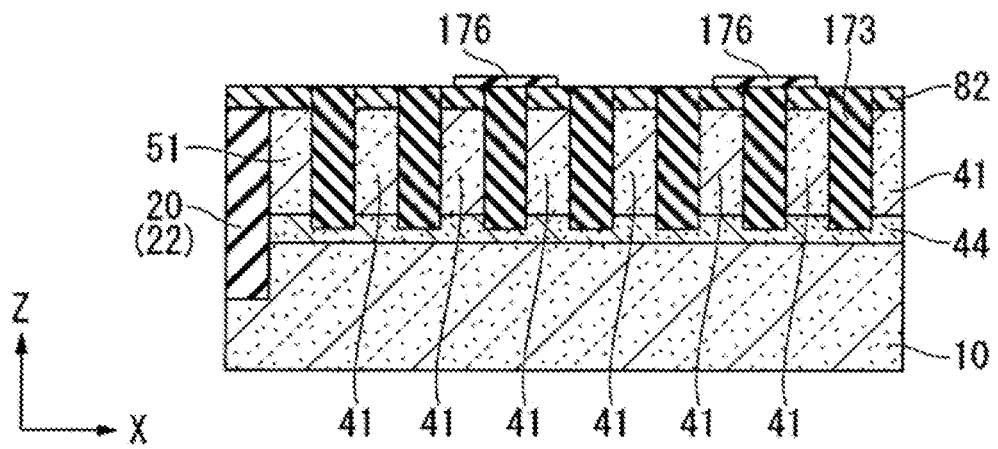

Then, as shown in FIG. 91, a thin silicon oxide film with a thickness of about 5 nm is formed across the entire surface of the upper surface 10a's side of the semiconductor substrate 10. Then, a protective insulation film 176 made from a silicon oxide film is formed by means of a lithography method and a dry etching method, thereby protecting an upper surface of the insulation film 173. The protective insulation film 176 is a linear pattern extending in the Y direction. As a result, upper surfaces of a part of the insulation films 173 formed in the word trenches 48 are exposed.

Figure 92:
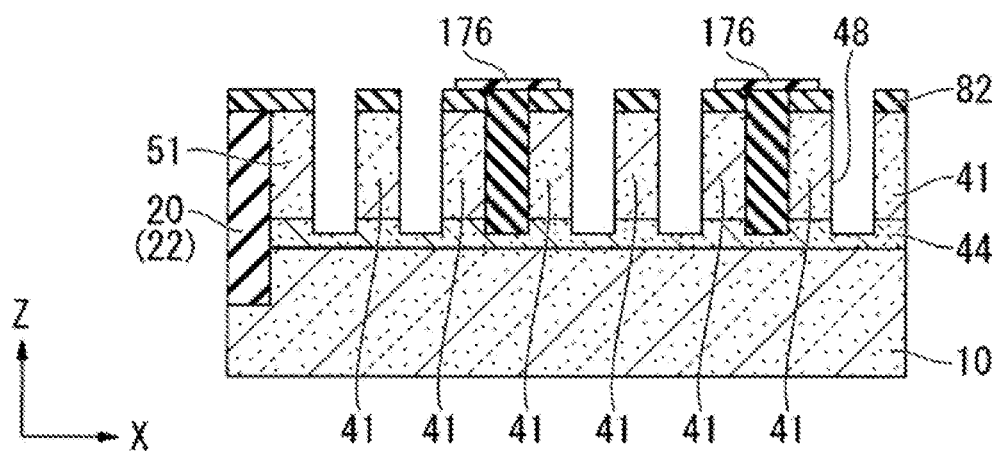

Then, as shown in FIG. 92, the part of the insulation film 173 whose upper surfaces are exposed are selectively etched and removed by dipping the semiconductor device 101 into a hot phosphoric acid solution at 160 degrees Celsius. In the hot phosphoric acid solution, while the insulation film 173 made from a silicon nitride film is etched, the first interlayer insulation film 82 and protective insulation film 176 each made from a silicon oxide film are not etched. Moreover, the semiconductor substrate 10 made of silicon is not etched, too. As a result, while the word trench 48 that is covered with the protective insulation film 176 is filled with the insulation film 173, an inner surface of the word trench 48 that is not covered with the protective insulation film 176 is exposed.

Figure 93:
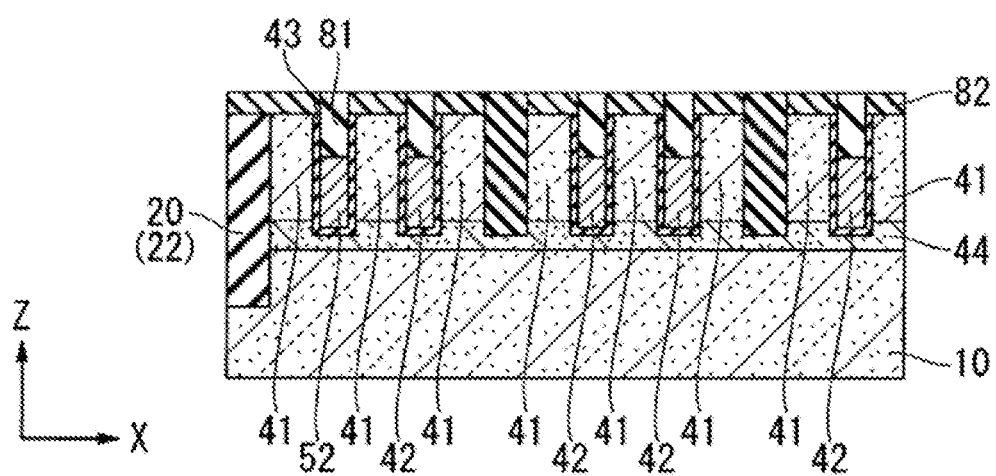

Then, as shown in FIG. 93, as in the case of the third embodiment, the gate insulation film 43 is formed on an inner surface of each of the word trenches 48. Furthermore, the word lines 42 and the switching word lines 52 are so formed as to fill the word trenches 48. Next, a silicon nitride film is formed across the entire surface, and the film is flattened and removed by a CMP method until an upper surface of the first interlayer insulation film 82 is exposed. In this manner, the cap insulation film 81 is formed. The protective insulation film 176 is also removed by the CMP method. The subsequent processes are carried out in the same way as in the third embodiment. As a result, the semiconductor device 101 shown in FIG. 88 is obtained.

According to the semiconductor device 101 of the present embodiment and the manufacturing method of the semiconductor device, the adjacent word lines 42 are surely insulated by the insulation film 173. Therefore, the reliability of the semiconductor device 101 associated with disturb failure can be further improved.

The following describes a semiconductor device of a fifth embodiment of the present invention and a method of manufacturing the semiconductor device, with reference to FIGS. 94 to 98. A semiconductor device 201 of the present embodiment is made by replacing a part of the semiconductor pillars 41 in the semiconductor device 101 according to the fourth embodiment with an insulation film 273. The replaced semiconductor pillars 41 includes those between the adjacent word lines 42 in each of the small active regions 35, and those between the switching word line 52 and the word line 42 adjacent each other. The other portions are the same as those of the semiconductor device 101 of the fourth embodiment. Therefore, the same portions are represented by the same reference symbols, and will not be described in detail.

Figure 94:
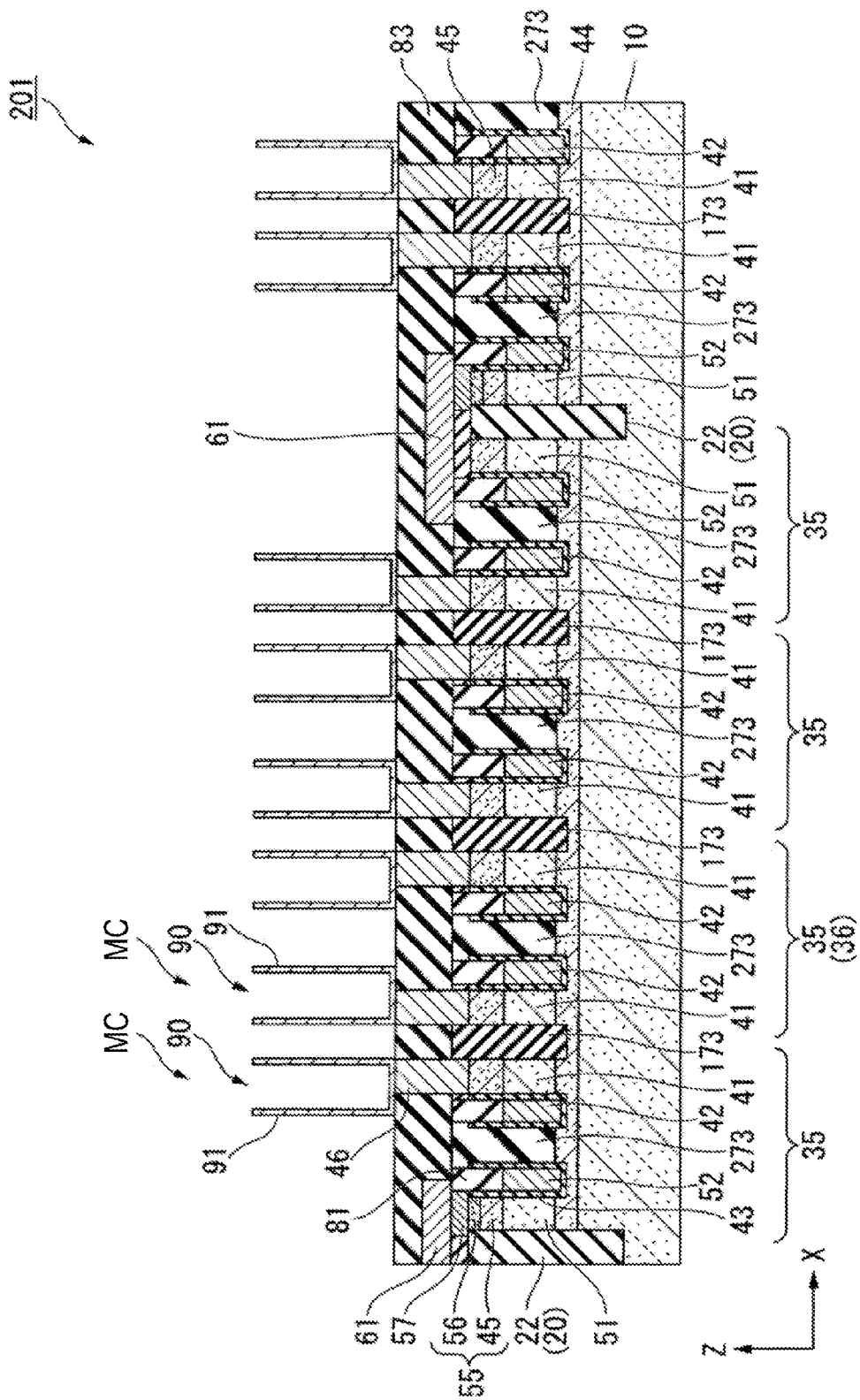
FIG. 94 is a plane view showing the schematic configuration of a semiconductor device 201 according to a fifth embodiment of the present invention.

As described above, in the semiconductor devices of the third to fifth embodiments of the present invention, the global bit line 61 does not cross the active region 30. Therefore, a region between the word lines 42 in the small active region 35, in which a bit line contact plug is formed in the semiconductor device of background art, is a free space S in the third to fifth embodiments. In the semiconductor device 201 of the present embodiment, as shown in FIG. 94, a region between the switching word line 52 and the word line 42, and a region between the word lines 42 correspond to the free space S. In the semiconductor device 201, an insulation film 273 is disposed in the free space S (or between the adjacent word lines 42 in each of the small active regions 35, and between the switching word line 52 and the word line 42 adjacent each other).

Figure 95:
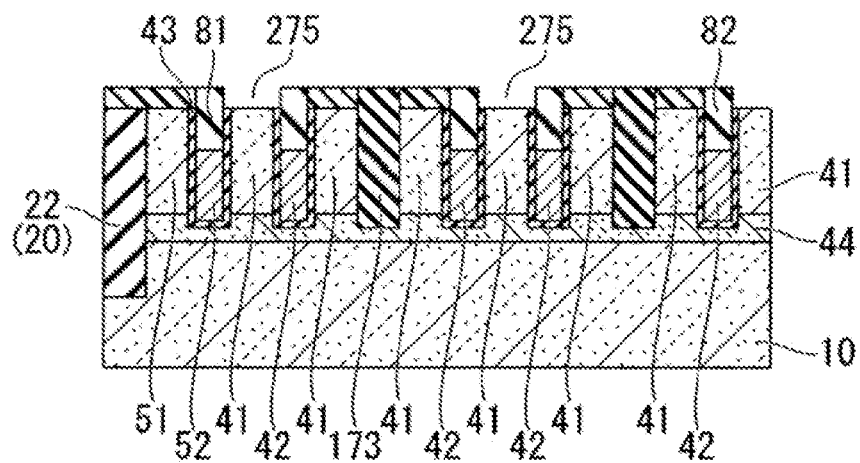
FIGS. 95 to 98 are cross-sectional views each showing a manufacturing process of the semiconductor device 201 shown in FIG. 94.

The following describes a method of manufacturing the semiconductor device according to the present embodiment. The processes leading up to the one shown in FIG. 93 are carried out in the same way as in the fourth embodiment. As a result, in a region where the dummy word line 72 is formed in the case of the third embodiment, the insulation film 173 is formed. In the other word trenches 48, the word line 42 and the cap insulation film 81 are formed. After that, the first interlayer insulation film 82 that is located on an upper surface of the semiconductor pillar 41 located in a region where the insulation film 273 will be formed is removed as shown in FIG. 95, by means of a lithography method and an anisotropic dry etching method. As a result, an opening 275 is formed in the first interlayer insulation film 82. The opening 275 is formed as a linear pattern extending in the Y direction in planar view. As a result, an upper surface of the semiconductor pillar 41 is exposed.

Figure 96:
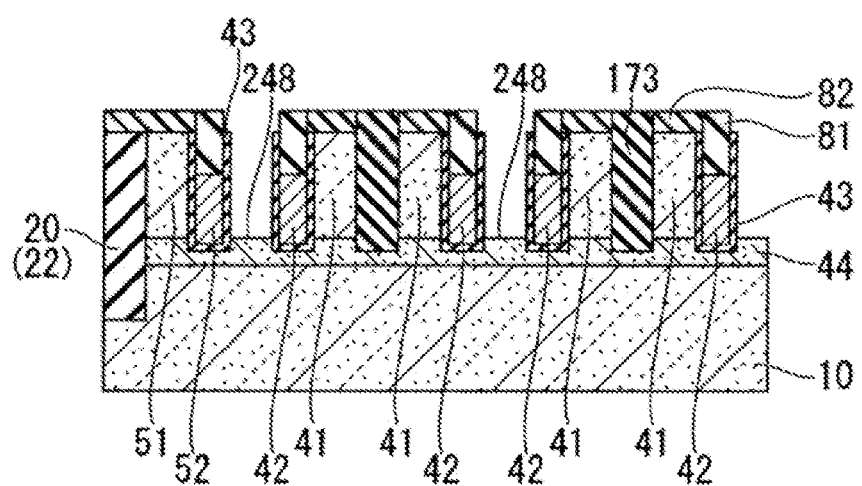

Then, as shown in FIG. 96, a semiconductor pillar 41 whose upper surface is exposed is selectively removed by an anisotropic dry etching method. According to the anisotropic dry etching method, a mixed gas plasma of hydrogen bromide (HBr), chlorine ($Cl_2$), and oxygen ($O_2$) is preferably used. If the gas plasma is used, during a process of carrying out anisotropic etching of silicon that constitutes a semiconductor pillar 41 (e.g. during a process of carrying out etching of a 150 nm silicon), the amounts of a silicon oxide film or silicon nitride film etched are about 1 nm. This means that most of the silicon oxide film and the silicon nitride film remains unetched. Also, even if the exposed gate insulation film 43 is etched, an insulation film 273 will be embedded in a subsequent process, thereby preventing a transistor from malfunctioning. New trenches 248 are formed by the anisotropic etching.

Figure 97:
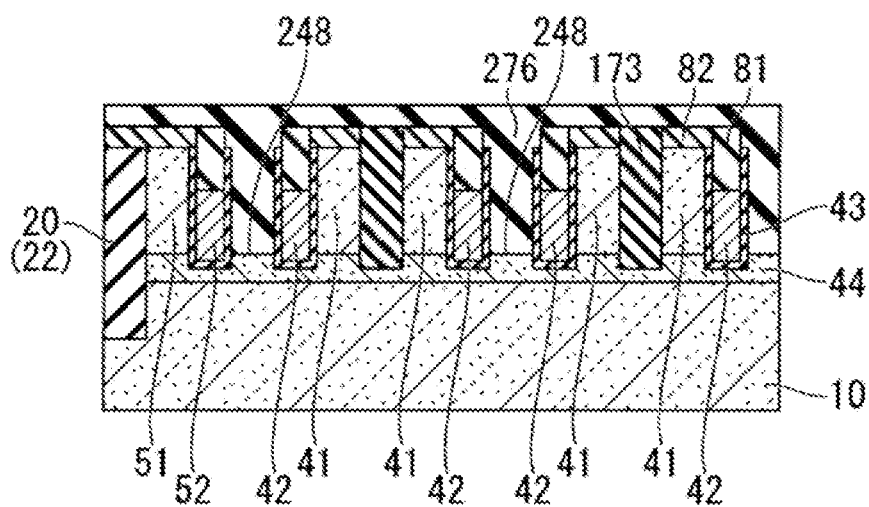
Figure 98:
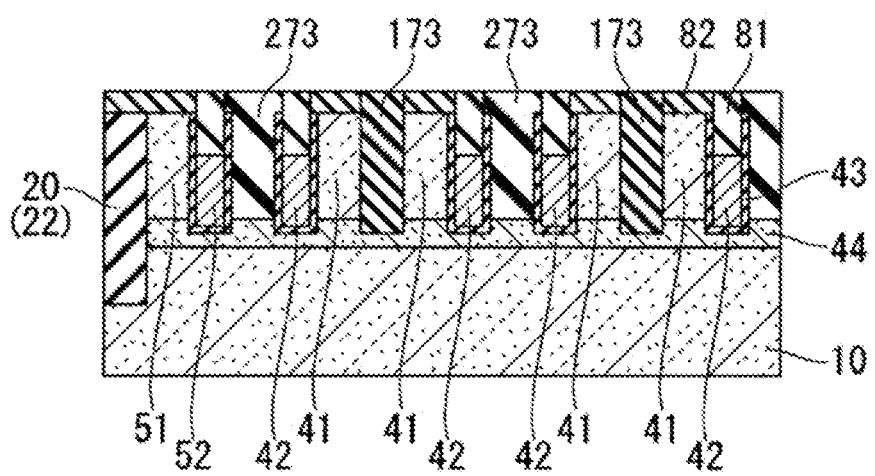

Then, as shown in FIG. 97, on the upper surface 10a's side of the semiconductor substrate 10, a silicon nitride film 276 is so formed as to fill the trenches 248. Then, as shown in FIG. 98, the silicon nitride film 276 is flattened by means of a CMP method, thereby exposing an upper surface the a first interlayer insulation film 82. As a result, an insulation film 273 is formed in the trenches 248. The subsequent processes are carried out in the same way as in the third embodiment. As a result, the semiconductor device 201 shown in FIG. 94 is obtained.

According to the semiconductor device 201 of the present embodiment and the manufacturing method of the semiconductor device, an insulation film 273 is embedded in a free space S (or between the adjacent word lines 42 in the small active region, and between the word line 42 and the switching word line 52). Therefore, the operation of the adjacent transistors 40 can be further stabilized for a disturb failure, and the reliability of the semiconductor device 201 can be improved.

It is apparent that the present invention is not limited to the above embodiments, but may be modified and changed without departing from the scope and spirit of the invention.

For example, in the above first to fifth embodiments, an example in which a semiconductor device uses capacitors (cell capacitor A6, and capacitance element 90) as information storage elements is described. However, the present invention can be suitably applied to a semiconductor device that uses any storage elements other than capacitors, such as resistance change elements, phase change elements, or magnetic resistance change elements as information storage elements.

Incidentally, in FIGS. 60, 88, and 94, a cover insulation film and a sidewall insulation film are not shown.

In addition, while not specifically claimed in the claim section, the applicant reserves the right to include in the claim section of the application at any appropriate time the following methods:

C1. A manufacturing method of a semiconductor device, comprising:
  forming a plurality of pillars including:
    a first semiconductor pillar being perpendicular to a main surface of a semiconductor substrate and having a first and a second side surface that are located on opposite sides each other;
    a second semiconductor pillar being perpendicular to the main surface of the semiconductor substrate and having a third side surface facing the second side surface in a first direction and a fourth side surface located on an opposite side from the third side surface; and
    a first dummy pillar being perpendicular to the main surface of the semiconductor substrate and having a fifth side surface facing the second side surface in the first direction and a sixth side surface located on an opposite side from the fifth side surface so as to face the third side surface in the first direction;

forming a gate insulation film at least on the first to sixth side surfaces; and forming a film of a gate electrode material to form a plurality of gate electrodes including:

a first gate electrode covering the first side surface via the gate insulation film;

a second gate electrode covering the second and fifth side surfaces via the gate insulation film;

a third gate electrode covering the third and sixth side surfaces via the gate insulation film; and a fourth gate electrode covering the fourth side surface via the gate insulation film, the film of the gate electrode material being formed thick enough that a portion formed on the second side surface becomes integral with a portion formed on the fifth side surface, and that a portion formed on the third side surface becomes integral with a portion formed on the sixth side surface.

C2. The manufacturing method of the semiconductor device as described in C1, wherein the film of the gate electrode material is so formed that film thickness in a horizontal direction thereof is greater than or equal to half a distance between the second side surface and the fifth side surface, and that the film thickness in the horizontal direction is greater than or equal to half a distance between the third side surface and the sixth side surface.

C3. The manufacturing method of the semiconductor device as described in C1 or C2, wherein the forming of the plurality of pillars includes:

etching the semiconductor substrate using a first mask film to form a first trench that defines a strip-shaped active region extending in the first direction;

filling the first trench with a first insulation film;

forming a second mask film that includes a plurality of portions each of which extends in a second direction perpendicular to the first direction on an upper surface of the first insulation film; and etching the first insulation film and the semiconductor substrate using the second mask film to separate the first and second semiconductor pillars and the first dummy pillar.

C4. The manufacturing method of the semiconductor device as described in C3, wherein the forming of the second mask film includes:

forming a second insulation film that serves as the second mask film on an upper surface of the first insulation film;

forming a third insulation film that includes a plurality of portions each of which extends in the second direction on an upper surface of the second insulation film;

forming first sidewall films covering side surfaces of the plurality of portions of the third insulation film, in such a way as to have a film thickness that allows concave portions, from which the second insulation film is exposed, between the first side wall films that are formed on the side surfaces of the plurality of portions;

forming a fourth insulation film in the concave portions;

removing selectively the first sidewall films after the formation of the fourth insulation film; and transferring a pattern that is formed by the third and fourth insulation films after the first sidewall films are selectively removed to the second insulation film to form the second mask film.

C5. The manufacturing method of the semiconductor device as described in C4, further comprising removing, after the first sidewall films are formed and before the fourth insulation film is formed, portions of the first sidewall films that are formed on both ends in the second direction of each of the plurality of portions of the third insulation film.

C6. The manufacturing method of the semiconductor device as described in one of C3 to C5, further comprising:

carrying out, after the film of the gate electrode material is formed, selective etch back of the gate electrode material to a position that is lower than an upper surface of the first mask film and higher than a lower surface of the first mask film;

forming a cap insulation film to cover an upper surface of the gate electrode material after the etch back;

removing selectively the first mask film after the formation of the cap insulation film to form a contact hole in which a surface of the semiconductor substrate is exposed from a bottom surface; and forming an upper diffusion layer on a surface of the semiconductor substrate exposed from a bottom surface of the contact hole after forming a second sidewall insulation film covering an inner surface of the contact hole.

C7. The manufacturing method of the semiconductor device as described in one of C3 to C6, wherein the forming of the first trench includes:

etching the semiconductor substrate using the first mask film to form a second trench, which is shallower than the first trench, at the same position as the first trench;

forming an impurity diffusion layer that extends from a bottom surface of the second trench to an inner side of a wall-like semiconductor pillar; and etching the semiconductor substrate further using the first mask film to form the first trench.

D1. A manufacturing method of a semiconductor device, comprising:

forming a first element isolation trench extending in a first direction on one surface's side of a semiconductor substrate;

filling the first element isolation trench with an insulation film to form a first element isolation region in a first direction;

implanting ions from one surface's side of the semiconductor substrate to form a local bit line;

forming a second element isolation trench extending in a second direction on one surface's side of the semiconductor substrate;

filling the second element isolation trench with an insulation film to form a second element isolation region in a second direction;

forming a first interlayer insulation film on one surface's side of the semiconductor substrate;

forming a trench in the first interlayer insulation film, and forming a word line in such a way as to fill the trench;

forming an insulation film in such a way as to cover an upper surface of the word line and fill the trench; and forming a global bit line above the first element isolation region.

D2. The manufacturing method of the semiconductor device as claimed in D1, further comprising:

forming a bit line contact hole in the first interlayer insulation film; and forming a bit line contact plug in such a way as to fill the bit line contact hole.

What is claimed is:

1. A semiconductor device comprising:

a semiconductor substrate;

first, second, third, fourth, and fifth conductive lines embedded in the semiconductor substrate, arranged in a first direction in this order, and extending in a second direction that is perpendicular to the first direction;

a first semiconductor pillar located between the first and second conductive lines;

a second semiconductor pillar located between the second and third conductive lines;

a third semiconductor pillar located between the third and fourth conductive lines;

a fourth semiconductor pillar located between the fourth and fifth conductive lines;

a first information storage element electrically connected to an upper portion of the first semiconductor pillar;

a second information storage element electrically connected to an upper portion of the third semiconductor pillar; and a bit line embedded in the semiconductor substrate, extending in the first direction, and connected to lower portions of the first, second and third semiconductor pillars, at least one of the first and second conductive lines and at least one of the third and fourth conductive lines being supplied with a potential so as to form channels in the first and third semiconductor pillars, wherein the second and fourth semiconductor pillars are dummy pillars and are not electrically connected to said first or second information storage elements.

2. The semiconductor device as claimed in claim 1, further comprising:

a first connection conductor that connects one end in a horizontal direction of the first conductive line to one end in the horizontal direction of the second conductive line;

a second connection conductor that connects one end in the horizontal direction of the third conductive line to one end in the horizontal direction of the fourth conductive line;

first and second word lines that are disposed above the first and second connection conductors, respectively;

a first word line contact conductor having a lower end that is in contact with the first connection conductor and an upper end that is in contact with the first word line; and a second word line contact conductor having a lower end that is in contact with the second connection conductor and an upper end that is in contact with the second word line.

3. The semiconductor device as claimed in claim 1, further comprising:

first to fifth word lines that are respectively disposed above the first to fifth conductive lines;

a first word line contact conductor having a lower end that is in contact with one end in a horizontal direction of the first conductive line and an upper end that is in contact with the first word line;

a second word line contact conductor having a lower end that is in contact with one end in the horizontal direction of the second conductive line and an upper end that is in contact with the second word line;

a third word line contact conductor having a lower end that is in contact with one end in the horizontal direction of the third conductive line and an upper end that is in contact with the third word line; and a fourth word line contact conductor having a lower end that is in contact with one end in the horizontal direction of the fourth conductive line and an upper end that is in contact with the fourth word line.

4. The semiconductor device as claimed in claim 1, further comprising an active region that extends in the first direction, wherein the first to fourth semiconductor pillars are disposed in the active region so as to go along the first direction.

5. The semiconductor device as claimed in claim 1, further comprising:

an element isolation region that is formed in the semiconductor substrate;

an active region that is formed in the semiconductor substrate so as to be surrounded by the element isolation region, the active region extending in the first direction; and a global bit line that is connected to the bit line, wherein, the first, second, third, fourth, and fifth conductive lines extend across the element isolation region and the active region, and the global bit line includes a linear portion that is located above the element isolation region and extends in the first direction.

6. A semiconductor device comprising:

a semiconductor substrate having a main surface;

a first semiconductor pillar perpendicular to the main surface of the semiconductor substrate and having first and second side surfaces that are opposite to each other;

a second semiconductor pillar perpendicular to the main surface of the semiconductor substrate and having third and fourth side surfaces that are opposite to each other, the third side surface facing the second side surface in a first direction;

a third semiconductor pillar perpendicular to the main surface of the semiconductor substrate and having seventh and eighth side surfaces that are opposite to each other, the seventh side surface facing the fourth side surface in the first direction;

a first dummy pillar located between the first and second semiconductor pillars, perpendicular to the main surface of the semiconductor substrate, and having fifth and sixth side surfaces that are opposite to each other, the fifth side surface facing the second side surface in the first direction and the sixth side surface facing the third side surface in the first direction;

a second dummy pillar located between the second and third semiconductor pillars, perpendicular to the main surface of the semiconductor substrate, and having ninth and tenth side surfaces that are opposite to each other, the ninth side surface facing the fourth side surface in the first direction and the tenth side surface facing the seventh side surface in the first direction;

a first gate electrode covering the first side surface with an intervention of a first gate insulation film;

a second gate electrode covering the second and fifth side surfaces with an intervention of a second gate insulation film;

a third gate electrode covering the third and sixth side surfaces with an intervention of a third gate insulation film;

a fourth gate electrode covering the fourth and ninth side surfaces with an intervention of a fourth gate insulation film;

a fifth gate electrode covering the eighth side surface with an intervention of a fifth gate insulation film;

a sixth gate electrode covering the seventh and tenth side surfaces with an intervention of a sixth gate insulation film;

a first lower diffusion layer that is electrically connected to at least lower portions of the first and second semiconductor pillars; and first, second, and third upper diffusion layers that are respectively provided in upper portions of the first, second, and third semiconductor pillars.

7. The semiconductor device as claimed in claim 6, further comprising:
   a first connection conductor that connects one end in a horizontal direction of the first gate electrode to one end in the horizontal direction of the second gate electrode;
   a second connection conductor that connects one end in the horizontal direction of the third gate electrode to one end in the horizontal direction of the fourth gate electrode;
   first and second word lines that are disposed above the first and second connection conductors, respectively;
   a first word line contact conductor having a lower end that is in contact with the first connection conductor and an upper end that is in contact with the first word line; and
   a second word line contact conductor having a lower end that is in contact with the second connection conductor and an upper end that is in contact with the second word line.

8. The semiconductor device as claimed in claim 6, further comprising:
   first to fourth word lines that are respectively disposed above the first to fourth gate electrodes;
   a first word line contact conductor having a lower end that is in contact with one end in a horizontal direction of the first gate electrode and an upper end that is in contact with the first word line;
   a second word line contact conductor having a lower end that is in contact with one end in the horizontal direction of the second gate electrode and an upper end that is in contact with the second word line;
   a third word line contact conductor having a lower end that is in contact with one end in the horizontal direction of the third gate electrode and an upper end that is in contact with the third word line; and
   a fourth word line contact conductor having a lower end that is in contact with one end in the horizontal direction of the fourth gate electrode and an upper end that is in contact with the fourth word line.

9. The semiconductor device as claimed in claim 6, further comprising
   an active region extending in the first direction, wherein
   the first and second semiconductor pillars and the first dummy pillar are disposed in the active region so as to go along the first direction.

10. The semiconductor device as claimed in claim 9, further comprising
    a wall-like semiconductor pillar that occupies a lower portion of the strip-shaped active region, wherein
    the first lower diffusion layer includes a first sub diffusion layer embedded in one of two side surfaces of the wall-like semiconductor pillar that are parallel to the first direction, and a second sub diffusion layer embedded in the other one of the two side surfaces, and
    a gap is provided between the first sub diffusion layer and the second sub diffusion layer.

11. The semiconductor device as claimed in claim 6, further comprising:
    a first bit line disposed above the third upper diffusion layer; and
    a first bit line contact conductor having a lower end that is in contact with the third upper diffusion layer and an upper end that is in contact with the first bit line, wherein
    the first gate electrode further covers the ninth side surface with an intervention of the first gate insulation film, and
    the first lower diffusion layer is electrically connected to a lower portion of the third semiconductor pillar.

12. The semiconductor device as claimed in claim 11, further comprising:
    a fourth semiconductor pillar being perpendicular to the main surface of the semiconductor substrate and having eleventh and twelfth side surface that are opposite to each other;
    a fifth semiconductor pillar being perpendicular to the main surface of the semiconductor substrate and having thirteenth and fourteenth side surfaces that are opposite to each other, the thirteenth side surface facing the twelfth side surface in the first direction;
    a third dummy pillar being perpendicular to the main surface of the semiconductor substrate and having fifteenth and sixteenth side surfaces that are opposite to each other, the fifteenth side surface facing the twelfth side surface in the first direction and the sixteenth side surface facing the thirteenth side surface in the first direction;
    a sixth semiconductor pillar being perpendicular to the main surface of the semiconductor substrate and having seventeenth and eighteenth side surfaces that are opposite to each other, the seventeenth side surface facing the eleventh side surface in the first direction and;
    a fourth dummy pillar being perpendicular to the main surface of the semiconductor substrate and having nineteenth and twentieth side surfaces that are opposite to each other, the nineteenth side surface facing the eleventh side surface in the first direction and the twentieth side surface facing the seventeenth side surface in the first direction;
    a second lower diffusion layer that is electrically connected to at least lower portions of the fourth to sixth semiconductor pillars;
    fourth to sixth upper diffusion layers that are respectively provided in upper portions of the fourth to sixth semiconductor pillars;
    a second bit line that is provided above the sixth upper diffusion layer; and
    a second bit line contact conductor having a lower end that is in contact with the sixth upper diffusion layer and an upper end that is in contact with the second bit line, wherein
    the first gate electrode further covers the eleventh and nineteenth side surfaces with an intervention of the first gate insulation film,
    the second gate electrode further covers the twelfth and fifteenth side surfaces with an intervention of the second gate insulation film,
    the third gate electrode further covers the thirteenth and sixteenth side surfaces with an intervention of the third gate insulation film,
    the fourth gate electrode further covers the fourteenth side surface with an intervention of the fourth gate insulation film,
    the fifth gate electrode further covers the eighteenth side surface with an intervention of the fifth gate insulation film, and
    the sixth gate electrode further covers the seventeenth and twentieth side surfaces with an intervention of the sixth gate insulation film.

13. The semiconductor device as claimed in claim 11, further comprising:

a third connection conductor that connects one end in a horizontal direction of the fifth gate electrode to one end in the horizontal direction of the sixth gate electrode;

a bit line drive wire that is disposed above the third connection conductor; and a bit line drive wire contact conductor having a lower end that is in contact with the third connection conductor and an upper end that is in contact with the bit line drive wire.

14. The semiconductor device as claimed in claim 11, further comprising:

first and second bit line drive wires that are respectively disposed above the fifth and sixth gate electrodes;

a first bit line drive wire contact conductor having a lower end that is in contact with the fifth gate electrode and an upper end that is in contact with the first bit line drive wire; and a second bit line drive wire contact conductor having a lower end that is in contact with the sixth gate electrode and an upper end that is in contact with the second bit line drive wire.

15. A semiconductor device comprising:

a semiconductor substrate;

an element isolation region that is formed in the semiconductor substrate;

an active region that is formed in the semiconductor substrate so as to be surrounded by the element isolation region, the active region extending in a first direction;

a word line that extends in a second direction crossing to the first direction, the word line crossing the element isolation region and the active region and embedded in the semiconductor substrate;

a local bit line that is provided in the active region; and a global bit line that is electrically connected to the local bit line, the global bit line being located above the element isolation region, wherein the global bit line includes a first linear portion located above the element isolation region, a second linear portion located above the active region, and a bent region between the first and second linear portions.

16. The semiconductor device as claimed in claim 15, wherein the global bit line extends in the first direction.

17. The semiconductor device as claimed in claim 15, wherein a plurality of the word lines are provided, and the device further comprises a dummy word line that is formed between the adjacent word lines.

18. The semiconductor device as claimed in claim 15, wherein a plurality of the word lines are provided, and the device further comprises an insulation film that is embedded between the adjacent word lines.

19. The semiconductor device as claimed in claim 15, further comprising a switching transistor and a bit line contact plug that are disposed at one end of the active region in the first direction, wherein the local bit line and the global bit line are connected via the switching transistor and the bit line contact plug.

* * * * *